United States Patent
Yukinobu et al.

(10) Patent No.: US 8,753,987 B2
(45) Date of Patent: Jun. 17, 2014

(54) METHOD OF MANUFACTURING METAL OXIDE FILM

(75) Inventors: Masaya Yukinobu, Ichikawa (JP); Yuki Murayama, Ichikawa (JP); Takahito Nagano, Ichikawa (JP); Yoshihiro Otsuka, Ichikawa (JP)

(73) Assignee: Sumitomo Metal Mining Co., Ltd. (JP)

( * ) Notice: Subject to any disclaimer, the term of this patent is extended or adjusted under 35 U.S.C. 154(b) by 0 days.

(21) Appl. No.: 13/261,535

(22) PCT Filed: Jun. 8, 2011

(86) PCT No.: PCT/JP2011/063627
§ 371 (c)(1),
(2), (4) Date: Dec. 5, 2012

(87) PCT Pub. No.: WO2011/155635
PCT Pub. Date: Dec. 15, 2011

(65) Prior Publication Data
US 2013/0101867 A1    Apr. 25, 2013

(30) Foreign Application Priority Data

Jun. 8, 2010  (JP) .................................. 2010-131227
Mar. 18, 2011 (JP) .................................. 2011-061383

(51) Int. Cl.
*H01L 21/469* (2006.01)

(52) U.S. Cl.
USPC ........................................ 438/785; 428/702

(58) Field of Classification Search
USPC ............ 438/785, 781, 722, 104, 773; 257/43, 257/798, E29.296
See application file for complete search history.

(56) References Cited

U.S. PATENT DOCUMENTS

| 4,420,500 A | 12/1983 | Nakatani et al. |
| 4,450,100 A | 5/1984 | Kano et al. |
| 7,326,434 B2 * | 2/2008 | Rupich et al. ................... 427/62 |
| 2004/0198029 A1 | 10/2004 | Yasuda et al. |
| 2005/0035715 A1 * | 2/2005 | Kado et al. .................... 313/582 |

(Continued)

FOREIGN PATENT DOCUMENTS

| JP | 57-36714 | 2/1982 |
| JP | 57-138708 | 8/1982 |

(Continued)

OTHER PUBLICATIONS

Furubayashi, et al., Applied Physics Letter, vol. 86, 2005 p. 251101.

(Continued)

*Primary Examiner* — Jarrett Stark
*Assistant Examiner* — Mohammad M Hoque
(74) *Attorney, Agent, or Firm* — Gerald E. Hespos; Michael J. Porco; Matthew T. Hespos

(57) ABSTRACT

Provided is a method of manufacturing a metal oxide film to be formed through the following processes: a coating process of forming a coating film on a substrate by using a coating liquid for forming metal oxide film containing any of various organometallic compounds; a drying process of making the coating film into a dried coating film; and a heating process of forming an inorganic film from the dried coating film under an oxygen-containing atmosphere having a dew-point temperature equal to or lower than $-10°$ C.

17 Claims, 8 Drawing Sheets

(56) References Cited

U.S. PATENT DOCUMENTS

| | | | |
|---|---|---|---|
| 2005/0130844 A1* | 6/2005 | Iwata | 505/193 |
| 2008/0210932 A1* | 9/2008 | Yukawa et al. | 257/40 |
| 2009/0173938 A1* | 7/2009 | Honda et al. | 257/43 |

FOREIGN PATENT DOCUMENTS

| | | |
|---|---|---|
| JP | 57-212268 | 12/1982 |
| JP | 61-026679 | 2/1986 |
| JP | 63-19046 | 4/1988 |
| JP | 63-25448 | 5/1988 |
| JP | 1-246366 | 10/1989 |
| JP | 2-20706 | 5/1990 |
| JP | 4-255768 | 9/1992 |
| JP | 6-203658 | 7/1994 |
| JP | 6-325637 | 11/1994 |
| JP | 9-63771 | 3/1997 |
| JP | 2003-176109 | 6/2003 |
| JP | 2008-143734 | 7/2003 |
| JP | 2005-104994 | 4/2005 |
| JP | 2008-214544 | 9/2008 |
| WO | WO 2011/055856 | 5/2011 |

OTHER PUBLICATIONS

Proceedings of the 67th Meeting of the Japan Society of Applied Physics, autumn 2006, pp. 566-567, 30p-RA-12 to 16.

Takeshi Yamaguchi et al., "Study on Zr-Silicate Interfacial Layer of Zr02-MIS Structure Fabricated by Pulsed Laser Ablation Deposition Method", Extended Abstracts of the 2000 International Conference on Solid State Devices and Materials, Aug. 29-31, 2000, pp. 228 to 229.

International Search Report and Written Opinon of Aug. 2, 2011.

Japanese Office Action.

\* cited by examiner

METHOD OF MANUFACTURING METAL OXIDE FILM

BACKGROUND OF THE INVENTION

1. Field of the Invention

The present invention relates to a metal oxide film and a method of manufacturing the metal oxide film.

In detail, the present invention relates to a method of manufacturing a metal oxide film that has both of high density and excellent in film strength and is formed on a substrate made of such as glass or plastic, and the metal oxide film obtained by the method of manufacturing the metal oxide film, and further relates to an element using the metal oxide film, a substrate with the metal oxide film, and device using the substrate with the metal oxide film.

2. Description of the Related Art

As a material for forming a transparent conductive film for use in a transparent electrode for a display element such as a liquid-crystal display, electroluminescent display, and a plasma display, in a transparent electrode such as a touch panel, and a solar panel, or for functional coating for such as reflecting heat rays, shielding electromagnetic waves, preventing charging and defogging, a tin-doped indium oxide (Indium Tin Oxide, which may be hereinafter referred to as "ITO") is known.

As methods of manufacturing this transparent conductive film made of ITO (ITO film), vapor deposition methods (vapor phase methods) are widely used, such as a vacuum deposition method, a sputtering method, and a chemical vapor deposition method. By these methods, a uniform ITO film (a transparent conductive film) being excellent in transparency and conductivity can be formed on a substrate.

However, a film forming apparatus to be used in these methods takes a vacuum container as a base, which is very expensive. Also, the component gas pressure in the manufacturing apparatus is required to be precisely controlled for each substrate film formation, thereby posing a problem in manufacturing cost and mass producibility.

As a manufacturing method to solve these problems, a method has been suggested and studied in which a coating liquid for forming transparent conductive film obtained by dissolving an indium compound and a tin compound in a solvent is used for coating a substrate (this method may be hereinafter referred to as a "coating method" or a "wet coating method").

In this coating method, an ITO film (a transparent conductive film) is formed with a simple manufacturing process of coating a substrate with the coating liquid for forming transparent conductive film, drying, and heating. Known methods of coating of the substrate with the coating liquid include an inkjet printing method, a screen printing method, a gravure printing method, an offset printing method, a flexor printing method, a dispenser printing method, a slit coating method, a die coating method, a doctor blade coating method, a wire bar coating method, a spin coating method, a dip coating method, and a spray coating method.

As coating liquids for use in these coating methods, various coating liquids containing an indium compound and a tin compound have been conventionally developed. For example, a mixture of indium nitrate and alkyl tin nitrate containing halogen ions or a carboxyl group (for example, refer to Japanese Unexamined Patent Application Publication No. 57-138708, a mixture of an organic indium compound and an organic tin compound containing an alkoxyl group or the like (for example, refer to Japanese Unexamined Patent Application Publication No. 61-26679), a mixture of indium nitrate and an organic tin compound (for example, refer to Japanese Unexamined Patent Application Publication No. 4-255768, an inorganic compound mixture of indium nitrate, tin nitrate, and others (for example, refer to Japanese Unexamined Patent Application Publication No. 57-36714, a mixture of an organic indium nitrate such as dicarboxylate indium nitrate and an organic tin nitrate such as alkyl tin nitrate (for example, refer to Japanese Unexamined Patent Application Publication No. 57-212268, and an organic compound mixture solution made of an organic indium complex and a tin complex with coordination of acetylacetonate (for example, refer to Japanese Examined Patent Application Publication No. 63-25448, Japanese Examined Patent Application Publication No. 2-20706, and Japanese Examined Patent Application Publication No. 63-19046 are disclosed.

In most of these conventionally-known coating liquids, a nitrate of indium or tin, an organic or inorganic compound made of a halide, an organometallic compound such as a metal alkoxide, and others are used.

Since the coating liquid using a nitrate or a halide generates corrosive gas such as a nitrogen oxide or chlorine at the time of heating, there is a problem of causing corrosion of facilities and environmental pollution. As for the coating liquid using a metal alkoxide, the material is prone to hydrolytic degradation, thereby posing a problem in stability of the coating liquid. Moreover, most of the coating liquids using an organometallic compound described in the patent documents described above has poor wettability with respect to a substrate, and there is also a problem in which a non-uniform film tends to be formed.

To get around this, as a coating liquid with these problems mitigated, a coating liquid for forming transparent conductive film containing one or two types of solvent selected from a group of indium acetylacetonate (standard nomenclature: tris (acetylacetonato)indium: In(C5H7O2)3), tin acetylacetonate (standard nomenclature: di-n-butyl bis(2,4-pentanedionato) tin: [Sn(C4H9)2(C5H7O2)2]), hydroxypropylcellulose, alkylphenol, and alkenylphenol, and one or two types of solvent selected from dibasic acid ester and benzyl acetate is disclosed (for example, refer to Japanese Unexamined Patent Application Publication No. 6-203658.

In this coating liquid disclosed in Japanese Unexamined Patent Application Publication No. 6-203658, with hydroxypropylcellulose being contained in a mixture solution of indium acetylacetonate and tin acetylacetonate, wettability of the coating liquid with respect to the substrate is improved. At the same time, the viscosity of the coating liquid is adjusted based on the content of hydroxypropylcellulose, which is a viscosity-adjusting agent, thereby making it possible to adopt various coating methods such as spin coating, spray coating, dip coating, screen printing, and wire bar coating.

Also, as an improved coating liquid for spin coating, a coating liquid for forming transparent conductive film is suggested (for example, refer to Japanese Unexamined Patent Application Publication No. 6-325637) containing an organic indium compound such as indium acetylacetonate or indium octylate, an organic tin such as tin acetylacetonate or tin octylate, and an organic solvent, in which as the organic solvent, an acetylacetone solution with one or two types of solvent selected from a group of alkylphenol and alkenylphenol dissolved therein or the acetylacetone solution with one or two types of solvent selected from a group of alkylphenol and alkenylphenol dissolved therein being diluted with alcohol is used.

This coating liquid has a low viscosity, and can be used not only in spin coating but also spray coating and dip coating.

Meanwhile, since the ITO film contains indium, which is a rare metal and thus expensive, the material cost of the transparent conductive film itself is expensive. Moreover, since indium is a rare metal, fluctuations (inflation) in price of the indium metal disadvantageously tend to significantly fluctuate the material cost of the transparent conductive film. Therefore, When the transparent conductive film is applied to a transparent electrode for an element of a touch panel, a touch sensor, a liquid-crystal display (which may be referred to as an LCD), an electroluminescent display (which may be referred to as an ELD), electronic paper, an electrochromic display (which may be referred to as an ECD), or others, there is a limitation to aim at stable low cost.

Therefore, inexpensive transparent conductive films in place of the ITO film have been searched for, and a method of obtaining high transparency and conductivity equivalent to those of the ITO film by using a $TiO_2$ film (a $Nb:TiO_2$ film) doped with niobium has been reported (refer to Furubayashi, et al., Applied Physics Letter, vol. 86, 2005, p. 252101; and Proceedings of the 67th Meeting of the Japan Society of Applied Physics, autumn 2006, pp. 566 to 567, 30p-RA-12 to 16. The niobium-doped $TiO_2$ film (NTO film) has low resistance that has been provided by performing a film formation on a glass substrate at a substrate temperature of 250° C. to 500° C. using a physical vapor phase growth method such as a sputtering method, a pulsed laser deposition method (a PLD method), or an electron beam deposition method (an EB deposition method), and then performing a heating process (reducing annealing) under a reducing atmosphere at 250° C. to 500° C.

As such, in place of the transparent conductive film having indium oxide as a main component, for example, a transparent conductive film having titanium oxide, which is a metal oxide other than indium oxide as described above, as a main component is desirable. Furthermore, a coating liquid for forming transparent conductive film capable of forming, at low cost, the transparent conductive film as described above also having excellent transparency and conductivity has been desired.

As to a metal oxide film, a wide variety of use application thereof, not limited to that of a transparent conductive film, has been considered. For example, a metal oxide film made of hafnium oxide ($HfO_2$), zirconium oxide ($ZrO_2$), or the like has attracted attention in recent years as a gate insulating film of a thin-film transistor element, and has been actively studied.

So far, as a gate insulating film of a field-effect thin-film transistor (TFT) element, silicon dioxide ($SiO_2$), which forms a silicon oxide film, has been widely used in general. However, with rapid advance of microfabrication of elements, due to a low relative permittivity of silicon oxide ($\epsilon=3.9$), making the gate insulating film thinner by microfabrication of elements has a limitation (an increase in gate leak current due to tunnel current). To address this problem, as described above, application of a metal oxide with high permittivity (hafnium oxide has a relative permittivity $\epsilon=$approximately 30, and zirconium oxide has a relative permittivity $\epsilon=$approximately 25) to a gate insulating film has been disclosed (refer to Takeshi Yamaguchi et al., "Study on Zr-Silicate Interfacial Layer of ZrO2-MIS Structure Fabricated by Pulsed Laser Ablation Deposition Method", Extended Abstracts of the 2000 International Conference on Solid State Devices and Materials, Aug. 29 to 31, 2000, pp. 228 to 229.

To form such a metal oxide film with high permittivity, a vapor deposition method (a vapor phase method) such as Metal-Organic Chemical Vapor Deposition (MOCVD) or Atomic Layer Deposition (ALD) is generally used, and no coating method is used.

Also, it has been studied in recent years that a metal oxide film with a work function larger than that of an ITO film as a transparent conductive film (on the order of 4.6 eV to 4.8 eV) is applied to an organic electroluminescent element (also referred to as an organic EL element) as mentioned below.

Specifically, as referred to in Japanese Unexamined Patent Application Publication No. 9-063771, an attempt has been suggested in which any single or more of metal oxide films with a high work function such as ruthenium oxide ($RuO_2$), vanadium oxide ($VO_{2.5}$), and molybdenum oxide ($MoO_3$) are laminated on the ITO film described above to facilitate injection of holes (positive holes) from the ITO film side as an anode electrode to a hole (positive hole) transport layer (in some cases, directly to a light emitting layer) and thereby achieve low-voltage driving, an improvement in luminous efficiency, and long life of the organic EL element. However, while Japanese Unexamined Patent Application Publication No. 9-063771 describes the use of a physical vapor phase growth method such as an electron beam deposition method, a direct current sputtering method, an RF magnetron sputtering method, or an ICB deposition method to form a metal oxide film with high work function, the use of a coating method is not described.

Furthermore, as metal oxide films, titanium oxide and cerium oxide can be used as ultraviolet ray cut coating; aluminum oxide (refractive index=1.62), silicon oxide (refractive index=1.46), titanium oxide (refractive index=2.5 to 2.7), zirconium oxide (refractive index=2.15), cerium oxide (refractive index=2.1 to 2.5), hafnium oxide (refractive index=1.91 to 2.15) and niobium oxide (refractive index=2.2 to 2.3) can be used for, by way of example, various optical coatings such as antireflective films and highly reflective films with application of their refractive indexes and transparency. Also, aluminum oxide, silicon oxide, titanium oxide, zirconium oxide, and cerium oxide can be used for, by way of example, insulating overcoating formed on a (transparent) conductive film with application of their transparency and insulating property, and tungsten oxide can be used as an electrochromic display material or a near-infrared-ray absorbing material (a heat-ray shielding material) as a cesium-doped tungsten oxide doped with cesium or the like.

It has been difficult to obtain a metal oxide film with high quality and high permittivity suitable as a gate insulating film of a thin-film transistor element, a metal oxide film with high quality and high work function suitable as a hole (positive hole) injection layer of an organic EL element, or various metal oxides suitable also for other purposes by using a coating method at a relatively low baking temperature. That is, in a metal oxide film formed with processes of coating a substrate with a coating liquid for forming metal oxide film, drying, and heating, in the course of inversion of an organometallic compound and the like in that coating liquid to a metal oxide film by thermal decomposition and burning (oxidation) at the time of the heating process, the formed metal oxide fine particles are difficult to become dense, and therefore the obtained metal oxide film has low denseness, thereby posing problems such as a decrease in film strength and deterioration in film flatness. To address these problems, a metal oxide film with higher quality in view of aspects including film strength has been desired for use as a gate insulating film of a thin-film transistor element; a hole (positive hole) injection layer of an organic EL element; or a transparent electrode of a display, a touch panel, a solar cell, or the like.

In view of these circumstances, an object of the present invention is to provide a metal oxide film having high density and excellent in film strength formed by using an ink coating method, which is a low-cost and simple method of manufacturing a metal oxide film, a method of manufacturing the metal oxide film, an element using the metal oxide film, a substrate with the metal oxide film, and a device using the substrate with the metal oxide film.

SUMMARY OF THE INVENTION

In view of the problems described above, as a result of diligent studies about a metal oxide film obtained by coating a substrate with a coating liquid for forming metal oxide film containing, as a main component, any one or more types of an organic aluminum compound, an organic silicon compound, an organic scandium compound, an organic titanium compound, an organic vanadium compound, an organic chromium compound, an organic manganese compound, an organic iron compound, an organic cobalt compound, an organic nickel compound, an organic copper compound, an organic gallium compound, an organic germanium compound, an organic yttrium compound, an organic zirconium compound, an organic niobium compound, an organic molybdenum compound, an organic ruthenium compound, an organic antimony compound, an organic lanthanum compound, an organic hafnium compound, an organic tantalum compound, an organic tungsten compound, an organic bismuth compound, an organic cerium compound, an organic neodymium compound, an organic samarium compound, an organic gadolinium compound, an organic magnesium compound, an organic calcium compound, an organic strontium compound, and an organic barium compound; then drying and heating, the inventors has invented a metal oxide film having high density and also excellent in film strength from the fact that, in the course of elevation of temperature at the time of the heating process, when an air atmosphere having a low dew-point temperature, that is, containing a small water vapor content, is applied, crystal growth of the metal oxide at an initial stage of the heating process is suppressed, thereby obtaining a film structure having a metal oxide fine-particle layer densely packed with metal oxide fine particles.

That is, a first aspect of the present invention is directed to a method of manufacturing a metal oxide film to be formed through the following processes: a coating process of coating a substrate with a coating liquid for forming metal oxide film containing an organometallic compound as a main component to form a coating film; a drying process of drying the coating film to form a dried coating film; and a heating process of mineralizing the dried coating film to form an inorganic film having an inorganic component, which is a metal oxide, as a main component, wherein the heating process is a process of performing a heating treatment to elevate a temperature of the dried coating film, which has the organometallic compound as a main component and has been formed in the drying process, up to a heating temperature or higher at which at least mineralization of the organometallic compound components occurs, under an oxygen-containing atmosphere having a dew-point temperature equal to or lower than −10° C., and then removing an organic component contained in the dried coating film by thermal decomposition, burning, or thermal decomposition and burning, thereby forming a metal oxide fine-particle layer densely packed with metal oxide fine particles having a metal oxide as a main component, and furthermore wherein the organometallic compound is formed of any one or more types of an organic aluminum compound, an organic silicon compound, an organic scandium compound, an organic titanium compound, an organic vanadium compound, an organic chromium compound, an organic manganese compound, an organic iron compound, an organic cobalt compound, an organic nickel compound, an organic copper compound, an organic gallium compound, an organic germanium compound, an organic yttrium compound, an organic zirconium compound, an organic niobium compound, an organic molybdenum compound, an organic ruthenium compound, an organic antimony compound, an organic lanthanum compound, an organic hafnium compound, an organic tantalum compound, an organic tungsten compound, an organic bismuth compound, an organic cerium compound, an organic neodymium compound, an organic samarium compound, an organic gadolinium compound, an organic magnesium compound, an organic calcium compound, an organic strontium compound, and an organic barium compound; and the metal oxide is any one or more types of aluminum oxide, silicon oxide, scandium oxide, titanium oxide, vanadium oxide, chromium oxide, manganese oxide, iron oxide, cobalt oxide, nickel oxide, copper oxide, gallium oxide, germanium oxide, yttrium oxide, zirconium oxide, niobium oxide, molybdenum oxide, ruthenium oxide, antimony oxide, lanthanum oxide, hafnium oxide, tantalum oxide, tungsten oxide, bismuth oxide, cerium oxide, neodymium oxide, samarium oxide, gadolinium oxide, magnesium oxide, calcium oxide, strontium oxide, and barium oxide.

A second aspect of the present invention is directed to the method of manufacturing the metal oxide film according to the first aspect, wherein subsequently to the heating treatment to elevate the temperature up to the heating temperature or higher at which at least mineralization of the organometallic compound occurs, under the oxygen-containing atmosphere having the dew-point temperature equal to or lower than −10° C., a further heating treatment is performed under an oxygen-containing atmosphere having a dew-point temperature equal to or higher than 0° C.

A third aspect of the present invention is directed to the method of manufacturing the metal oxide film according to the first aspect, wherein subsequently to the heating treatment to elevate the temperature up to the heating temperature or higher at which at least mineralization of the organometallic compound occurs, under the oxygen-containing atmosphere having the dew-point temperature equal to or lower than −10° C., a further heating treatment is performed under a neutral atmosphere or a reducing atmosphere.

A fourth aspect of the present invention is directed to the method of manufacturing the metal oxide film according to the second aspect, wherein subsequently to the heating treatment under the oxygen-containing atmosphere having the dew-point temperature equal to or higher than 0° C., a further heating treatment is performed under a neutral atmosphere or a reducing atmosphere.

A fifth aspect of the present invention is directed to the method of manufacturing the metal oxide film according to the third aspect, wherein the neutral atmosphere is an atmosphere containing any one or more types of nitrogen gas and inert gas, or the reducing atmosphere is a hydrogen gas atmosphere or an atmosphere containing at least one or more types of hydrogen gas or organic solvent vapor in the neutral atmosphere.

A sixth aspect of the present invention is directed to the method of manufacturing the metal oxide film according to the first aspect, wherein the dew-point temperature of the oxygen-containing atmosphere in the heating treatment under the oxygen-containing atmosphere having the dew-point temperature equal to or lower than −10° C. is equal to or lower than −20° C.

A seventh aspect of the present invention is directed to the method of manufacturing the metal oxide film according to the first aspect, wherein when the heating treatment under the oxygen-containing atmosphere having the dew-point temperature equal to or lower than −10° C. is performed, energy ray irradiation is performed.

An eighth aspect of the present invention is directed to the method of manufacturing the metal oxide film according to the seventh aspect, wherein the energy ray irradiation is irradiation of ultraviolet rays including at least a component having a wavelength equal to or smaller than 200 nm as a main component.

A ninth aspect of the present invention is directed to the method of manufacturing the metal oxide film according to the eighth aspect, wherein the irradiation of the ultraviolet rays including at least the component having the wavelength equal to or smaller than 200 nm as the main component is irradiation of ultraviolet rays emitted from any of a low-pressure mercury lamp, an amalgam lamp, or an excimer lamp.

A tenth aspect of the present invention is directed to the method of manufacturing the metal oxide film according to the first aspect, wherein the organometallic compound is an acetylacetonate metal complex compound, a metal alkoxide compound, or the acetylacetonate metal complex compound and the metal alkoxide compound.

An eleventh aspect of the present invention is directed to the method of manufacturing the metal oxide film according to the first aspect, wherein the coating of the substrate with the coating liquid for forming metal oxide film in the coating process is performed by a method which is any of an inkjet printing method, a screen printing method, a gravure printing method, an offset printing method, a flexor printing method, a dispenser printing method, a slit coating method, a die coating method, a doctor blade coating method, a wire bar coating method, a spin coating method, a dip coating method, and a spray coating method.

A twelfth aspect of the present invention is directed to a metal oxide film obtained by the method of manufacturing the metal oxide film according to the first aspect.

A thirteenth aspect of the present invention is directed to an element including a metal oxide fine-particle layer, wherein the metal oxide fine-particle layer is the metal oxide film according to the twelfth aspect.

A fourteenth aspect of the present invention is directed to the element according to the thirteenth aspect, wherein the element is a thin-film transistor using the metal oxide fine-particle layer as a gate insulating film of the thin-film transistor.

A fifteenth aspect of the present invention is directed to a substrate with a metal oxide film, including the metal oxide film on a substrate, wherein the metal oxide film is the metal oxide film according to the twelfth aspect.

A sixteenth aspect of the present invention is directed to a device including a transparent electrode, wherein the transparent electrode is the substrate with the metal oxide film according to the fifteenth aspect.

A seventeenth aspect of the present invention is directed to the device according to the sixteenth aspect, wherein the device is of one type selected from among a light emitting device, an electric power generating device, a display device, and an input device.

According to the method of manufacturing the metal oxide film of the present invention, in the course of elevation of temperature at the time of the heating process, when an air atmosphere having a low dew-point temperature, that is, containing a small water vapor content, is applied, crystal growth of the metal oxide at an initial stage of the heating process is suppressed, thereby forming a metal oxide fine-particle layer densely packed with metal oxide fine particles having, as a main component, any one or more types of aluminum oxide, silicon oxide, scandium oxide, titanium oxide, vanadium oxide, chromium oxide, manganese oxide, iron oxide, cobalt oxide, nickel oxide, copper oxide, gallium oxide, germanium oxide, yttrium oxide, zirconium oxide, niobium oxide, molybdenum oxide, ruthenium oxide, antimony oxide, lanthanum oxide, hafnium oxide, tantalum oxide, tungsten oxide, bismuth oxide, cerium oxide, neodymium oxide, samarium oxide, gadolinium oxide, magnesium oxide, calcium oxide, strontium oxide, and barium oxide. Therefore, the obtained metal oxide film has high density and is also excellent in film strength.

The metal oxide film according to the present invention can be used for various coatings, elements, and devices. When the metal oxide film is applied as a transparent conductive film (for example, the NTO film as described above), the metal oxide film is suitable, as a substrate with the metal oxide film, which substrate has the metal oxide film formed thereon, for light-emitting devices such as an LED element, an electroluminescent lamp (an electroluminescent element), and a field emission lamp; electric power generating devices such as a solar cell; display devices such as a liquid-crystal display (a liquid-crystal element), an electroluminescent display (an electroluminescent element), a plasma display, an electronic paper element, and an electrochromic element; and input devices such as a touch panel.

Furthermore, the metal oxide film of the present invention can be used for use purposes other than the transparent conductive film described above. For example, titanium oxide and cerium oxide can be used as ultraviolet ray cut coating; aluminum oxide (refractive index=1.62), silicon oxide (refractive index=1.46), titanium oxide (refractive index=2.5 to 2.7), yttrium oxide (refractive index=1.82), zirconium oxide (refractive index=2.15), cerium oxide (refractive index=2.1 to 2.5), neodymium oxide (refractive index=2.0), hafnium oxide (refractive index=1.91 to 2.15), niobium oxide (refractive index=2.2 to 2.3), antimony oxide (refractive index=2.04), lanthanum oxide (refractive index=1.88), tantalum oxide (refractive index=2.16), and magnesium oxide (refractive index=1.72) can be used for various optical coatings such as antireflective films and highly reflective films with application of their refractive indexes and transparency. Also, aluminum oxide, silicon oxide, titanium oxide, zirconium oxide, and cerium oxide can be used for, by way of example, insulating overcoating formed on a (transparent) conductive film with application of their transparency and insulating property, and tungsten oxide can be used as an electrochromic display material or a near-infrared-ray absorbing material (a heat-ray shielding material) as a cesium-doped tungsten oxide doped with cesium or the like.

DETAILED DESCRIPTION OF THE PREFERRED EMBODIMENTS

Figure 1:
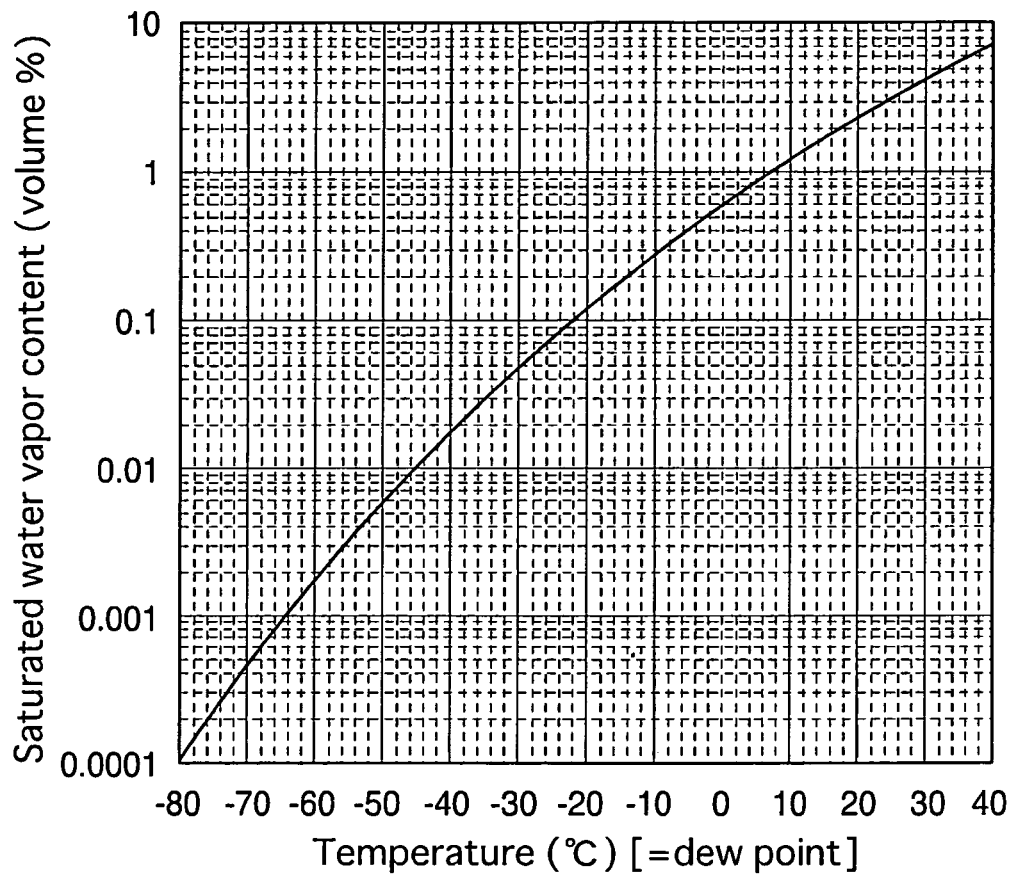
FIG. 1 is a drawing that shows a relation between a saturated water vapor content (volume %) in the air and a dew-point temperature (° C.).

The method of manufacturing a metal oxide film of the present invention is a method of manufacturing a metal oxide film formed by coating a substrate with a coating liquid for forming metal oxide film having an organometallic compound as a main component, drying, and heating. Since crystal growth of metal oxide fine particles having a metal oxide as a main component proceeds to form a metal oxide fine-particle layer densely packed therewith, film strength of the metal oxide film can be improved. Furthermore, conductivity can be improved when the obtained metal oxide film is used as a transparent conductive film, and the refractive index can be improved when the metal oxide film is used as a high refractive index film.

That is, when the metal oxide film is used as any of various functional films, an improvement of the functions of that film can be achieved.

[Metal Oxide Film Structure]

First, the structure of the metal oxide film is described.

For example, when the metal oxide film is formed by using a vapor phase growth method such as a sputtering method, a polycrystalline metal oxide film structure is normally formed, in which crystal particles of a metal oxide are arranged via a grain boundary. In the film structure, metal oxide fine particles are hardly observed.

Also, the metal oxide film formed by the coating method of coating a substrate with a coating liquid for forming metal oxide film having an organometallic compound as a main component, drying, and heating normally has a film structure in which metal oxide fine particles are binding to each other. Although the particle diameter of each metal oxide fine particle and the size of an air gap between the metal oxide fine particles vary depending on the heating process conditions and others, it has been known that a metal oxide film composed of metal oxide fine particles with not a small number of open air gaps (open pores) is obtained.

When the metal oxide film with the metal oxide fine particles binding to each other formed by this coating method is applied to a transparent conductive film, a conductive mechanism in the metal oxide film intervenes a contact portion (a binding portion) of the metal oxide fine particles. Therefore, conductivity at the contact portion is decreased possibly because the metal oxide fine particles are contacted with each other in a fine area, conductivity is degraded with time in air exposure possibly because oxygen and water vapor in the air enter the inside of the film through open pores to degrade the contact of the metal oxide fine particles with each other, and film strength is decreased possibly because the film is roughly filled with the metal oxide fine particles.

The present invention makes such a conventional metal oxide film to be densely packed with metal oxide fine particles and to promote crystal growth of the metal oxide fine particles, thereby forming a film structure having a metal oxide fine-particle layer that is dense with less air gaps (open pores) and has strengthened contacts of the metal oxide fine particles to each other. With this, conductivity and also film strength can be improved. Furthermore, degradation of conductivity with time can be significantly suppressed.

In other words, in the present invention, the densely-packed metal oxide fine-particle layer is formed by applying an oxygen-containing atmosphere with a small water vapor content, that is, having a low dew-point temperature in the course of elevation of temperature at the time of a heating process, in the coating method using the coating liquid for forming metal oxide film described above.

The mechanism of forming this densely-packed metal oxide fine-particle layer has not yet been clarified. As will be described in detail further below, it is assumed that, in short, if water vapor is present in an oxygen-containing atmosphere, crystallization and crystal growth of a metal oxide due to mineralization occurring as an organometallic compound and others are thermally decomposed and burnt is promoted by water vapor, thereby causing the metal oxide fine particles to be adhered to each other so as not to move at an initial stage of a heating process for thermal decomposition and burning and therefore inhibiting densification of the metal oxide fine particles.

On the other hand, in the metal oxide film of the present invention, an oxygen-containing atmosphere with a small water vapor content, that is, having a low dew-point temperature, is applied. Although it depends on the type of metal oxide, for example, filling density of the metal oxide fine particles in the metal oxide film can be increased to approximately 90% of the absolute specific gravity of the metal oxide, while in the case of applying an oxygen-containing atmosphere containing water vapor, density stays at approximately 60% to 70%.

[Coating Liquid for Forming Metal Oxide Film]

Next, the coating liquid for forming metal oxide film for use in the present invention is described in detail.

The present invention employs the coating liquid for forming metal oxide film having, as a main component, an organometallic compound formed of any one or more types of an organic aluminum compound, an organic silicon compound, an organic scandium compound, an organic titanium compound, an organic vanadium compound, an organic chromium compound, an organic manganese compound, an organic iron compound, an organic cobalt compound, an organic nickel compound, an organic copper compound, an organic gallium compound, an organic germanium compound, an organic yttrium compound, an organic zirconium compound, an organic niobium compound, an organic molybdenum compound, an organic ruthenium compound, an organic antimony compound, an organic lanthanum compound, an organic hafnium compound, an organic tantalum compound, an organic tungsten compound, an organic bismuth compound, an organic cerium compound, an organic neodymium compound, an organic samarium compound, an organic gadolinium compound, an organic magnesium compound, an organic calcium compound, an organic strontium compound, and an organic barium compound, to form a more metal oxide being any one or types of aluminum oxide, silicon oxide, scandium oxide, titanium oxide, vanadium oxide, chromium oxide, manganese oxide, iron oxide, cobalt oxide, nickel oxide, copper oxide, gallium oxide, germanium oxide, yttrium oxide, zirconium oxide, niobium oxide, molybdenum oxide, ruthenium oxide, antimony oxide, lanthanum oxide, hafnium oxide, tantalum oxide, tungsten oxide, bismuth oxide, cerium oxide, neodymium oxide, samarium oxide, gadolinium oxide, magnesium oxide, calcium oxide, strontium oxide, and barium oxide.

First, the coating liquid for forming metal oxide film having an organometallic compound as a main component is described below.

Preferably, the organometallic compound for use in the present invention is formed of any one or more type of an organic aluminum compound, an organic silicon compound, an organic scandium compound, an organic titanium compound, an organic vanadium compound, an organic chromium compound, an organic manganese compound, an organic iron compound, an organic cobalt compound, an organic nickel compound, an organic copper compound, an organic gallium compound, an organic germanium compound, an organic yttrium compound, an organic zirconium compound, an organic niobium compound, an organic molybdenum compound, an organic ruthenium compound, an organic antimony compound, an organic lanthanum compound, an organic hafnium compound, an organic tantalum compound, an organic tungsten compound, an organic bismuth compound, an organic cerium compound, an organic neodymium compound, an organic samarium compound, an organic gadolinium compound, an organic magnesium compound, an organic calcium compound, an organic strontium compound, and an organic barium compound, and the metal oxide is any one or more types of aluminum oxide, silicon oxide, scandium oxide, titanium oxide, vanadium oxide, chromium oxide, manganese oxide, iron oxide, cobalt oxide, nickel oxide, copper oxide, gallium oxide, germanium oxide, yttrium oxide, zirconium oxide, niobium oxide, molybdenum oxide, ruthenium oxide, antimony oxide, lanthanum oxide, hafnium oxide, tantalum oxide, tungsten oxide, bismuth oxide, cerium oxide, neodymium oxide, samarium oxide, gadolinium oxide, magnesium oxide, calcium oxide, strontium oxide, barium oxide, and others.

Examples of the organic aluminum compound include aluminum acetylacetonate (standard nomenclature: aluminum(III)-2,4-pentanedionate) $[Al(C_5H_7O_2)_3]$ as an aluminum acetylacetonate complex; and aluminum(III)ethoxide $[Al(C_2H_5O)_3]$, aluminum(III)-n-butoxide $[Al(C_4H_9O)_3]$, aluminum(III)-tert-butoxide $[Al(C_4H_9O)_3]$, aluminum(III)isopropoxide $[Al(C_3H_7O)_3]$, and others as aluminum alkoxides. Basically, however, any organic aluminum compound can be used as long as it is dissolved in a solvent and is decomposed to an oxide without generating harmful gas such as chlorine gas or nitrogen oxide gas at the time of the heating process. Among these, aluminum acetylacetonate and aluminum(III)-n-butoxide are preferable because they are relatively inexpensive and easily available.

Many types of the organic silicon compound as the organometallic compound are present, and examples include silicon(IV)tetramethoxide $[Si(CH_3O)_4]$, silicon(IV)tetraethoxide $[Si(C_2H_5O)_4]$, silicon(IV)-tert-butoxide $[Si(C_4H_9O)_4]$, silicon(IV)tetra-n-butoxide $[Si(C_4H_9O)_4]$, silicon(IV)tetraisopropoxide $[Si(C_3H_7O)_4]$, and others as silicon alkoxides. Basically, however, any organic silicon compound can be used as long as it is dissolved in a solvent and is decomposed to an oxide without generating harmful gas such as chlorine gas or nitrogen oxide gas at the time of the heating process.

Examples of the organic scandium compound as the organometallic compound include scandium acetylacetonate (standard nomenclature: scandium(III)-2,4-pentanedionate) $[Sc(C_5H_7O_2)_3]$ and others as scandium acetylacetonate complexes. Basically, however, any organic scandium compound can be used as long as it is dissolved in a solvent and is decomposed to an oxide without generating harmful gas such as chlorine gas or nitrogen oxide gas at the time of the heating process.

Examples of the organic titanium compound as the organometallic compound include titanium acetylacetonate (standard nomenclature: titanium(IV)-di-n-butoxide bis(2,4-pentanedionate) $[Ti(C_4H_9O)_2(C_5H_7O_2)_2])$, titanyl(IV) acetylacetonate $[(C_5H_7O_2)_2TiO]$, titanium(IV) diisopropoxide bis(2,4-pentanedionate) $[Ti(C_3H_7O)_2(C_5H_7O_2)_2]$, and others as titanium acetylacetonate complexes; and titanium(IV)tetraethoxide $[Ti(C_2H_5O)_4]$, titanium(IV)-tert-butoxide $[Ti(C_4H_9O)_4]$, titanium(IV)tetra-n-butoxide $[Ti(C_4H_9O)_4]$, titanium(IV)tetraisopropoxide $[Ti(C_3H_7O)_4]$, and others as titanium alkoxides. Basically, however, any organic titanium compound can be used as long as it is dissolved in a solvent and is decomposed to an oxide without generating harmful gas such as chlorine gas or nitrogen oxide gas at the time of the heating process. Among these, titanium acetylacetonate, titanium(IV)tetra-n-butoxide, and titanium(IV)tetraisopropoxide are preferable because they are inexpensive and easily available.

Examples of the organic vanadium compound as the organometallic compound include vanadium(IV)oxide bis-2,4-pentanedionate $[VO(C_5H_7O_2)_2]$, vanadium acetylacetonate (standard nomenclature: vanadium(III)-2,4-pentanedionate) $[V(C_5H_7O_2)_3]$ and others as vanadium acetylacetonate complexes. Basically, however, any organic vanadium compound can be used as long as it is dissolved in a solvent and is decomposed to an oxide without generating harmful gas such as chlorine gas or nitrogen oxide gas at the time of the heating process.

Examples of the organic chromium compound as the organometallic compound include chromium acetylacetonate (standard nomenclature: chromium(III)-2,4-pentanedionate) $[Cr(C_5H_7O_2)_3]$ and others as chromium acetylacetonate complexes; chromium(III)isopropoxide $[Cr(C_3H_7O)_3]$ and others as chromium alkoxides; and chromium acetate(II) [Cr (CH$_3$COO)$_2$], diacetic hydroxy chromium(III) [Cr(CH$_3$COO)$_2$(OH)] and others as organic acid chromium. Basically, however, any organic chromium compound can be used as long as it is dissolved in a solvent and is decomposed to an oxide without generating harmful gas such as chlorine gas or nitrogen oxide gas at the time of the heating process.

Examples of the organic manganese compound as the organometallic compound include manganese acetylacetonate {(standard nomenclature: manganese(II)-2,4-pentanedionate) [Mn(C$_5$H$_7$O$_2$)$_2$], standard nomenclature: manganese (III)-2,4-pentanedionate) [Mn(C$_5$H$_7$O$_2$)$_3$]} and others as manganese acetylacetonate complexes; and manganese acetate(II) [Mn(CH$_3$COO)$_2$] and others as organic acid manganese. Basically, however, any organic manganese compound can be used as long as it is dissolved in a solvent and is decomposed to an oxide without generating harmful gas such as chlorine gas or nitrogen oxide gas at the time of the heating process.

Examples of the organic iron compound as the organometallic compound include iron acetylacetonate (standard nomenclature: iron(III)-2,4-pentanedionate) [Fe(C$_5$H$_7$O$_2$)$_3$] and others as iron acetylacetonate complexes; iron(III)ethoxide [Fe(C$_2$H$_5$O)$_3$] and others as iron alkoxides; and iron acetate(III) [Fe(CH$_3$COO)$_3$] and others as organic acid iron. Basically, however, any organic iron compound can be used as long as it is dissolved in a solvent and is decomposed to an oxide without generating harmful gas such as chlorine gas or nitrogen oxide gas at the time of the heating process.

Examples of the organic cobalt compound as the organometallic compound include cobalt acetylacetonate {(standard nomenclature: cobalt(II)-2,4-pentanedionate) [Co(C$_5$H$_7$O$_2$)$_2$] and (standard nomenclature: cobalt(III)-2,4-pentanedionate) [Co(C$_5$H$_7$O$_2$)$_3$]} and others as cobalt acetylacetonate complexes; and cobalt acetate(II) [Co(CH$_3$COO)$_2$] and others as organic acid cobalt. Basically, however, any organic cobalt compound can be used as long as it is dissolved in a solvent and is decomposed to an oxide without generating harmful gas such as chlorine gas or nitrogen oxide gas at the time of the heating process.

Examples of the organic nickel compound as the organometallic compound include nickel acetylacetonate (standard nomenclature: nickel(II)-2,4-pentanedionate) [Ni(C$_5$H$_7$O$_2$)$_2$] and others as nickel acetylacetonate complexes; and nickel formate(II) [Ni(HCOO)$_2$], nickel acetate(II) [Ni(CH$_3$COO)$_2$], and others as organic acid nickel. Basically, however, any organic nickel compound can be used as long as it is dissolved in a solvent and is decomposed to an oxide without generating harmful gas such as chlorine gas or nitrogen oxide gas at the time of the heating process.

Examples of the organic copper compound as the organometallic compound include copper acetylacetonate (standard nomenclature: copper(II)-2,4-pentanedionate) [Cu(C$_5$H$_7$O$_2$)$_2$] and others as copper acetylacetonate complexes; copper(II)ethoxide [Cu(C$_2$H$_5$O)$_2$] and others as copper alkoxides; and copper formate(II) [Cu(HCOO)$_2$], copper acetate (II) [Cu(CH$_3$COO)$_2$] and others as organic acid copper. Basically, however, any organic copper compound can be used as long as it is dissolved in a solvent and is decomposed to an oxide without generating harmful gas such as chlorine gas or nitrogen oxide gas at the time of the heating process.

Examples of the organic gallium compound as the organometallic compound include gallium acetylacetonate (standard nomenclature: gallium(III)-2,4-pentanedionate) [Ga(C$_5$H$_7$O$_2$)$_3$] as a gallium acetylacetonate complex; and gallium(III)ethoxide [Ga(C$_2$H$_5$O)$_3$] and others as gallium alkoxides. Basically, however, any organic gallium compound can be used as long as it is dissolved in a solvent and is decomposed to an oxide without generating harmful gas such as chlorine gas or nitrogen oxide gas at the time of the heating process.

Examples of the organic germanium compound as the organometallic compound include germanium(IV)tetraethoxide [Ge(C$_2$H$_5$O)$_4$], germanium(IV)tetra-n-butoxide [Ge(C$_4$H$_9$O)$_4$], germanium(IV)tetraisopropoxide [Ge(C$_3$H$_7$O)$_4$], and others as germanium alkoxides; β-carboxyethylgermanium(IV)oxide [(GeCH$_2$CH$_2$COOH)$_2$O$_3$], tetraethylgermanium(IV) [Ge(C$_2$H$_5$)$_4$], tetrabutylgermanium(IV) [Ge(C$_4$H$_9$)$_4$], tributylgermanium(IV)hydride[Ge(C$_4$H$_9$)$_3$H], and others. Basically, however, any organic germanium compound can be used as long as it is dissolved in a solvent and is decomposed to an oxide without generating harmful gas such as chlorine gas or nitrogen oxide gas at the time of the heating process. Among these, germanium(IV)tetraethoxide, germanium(IV)tetra-n-butoxide, and germanium(IV)tetraisopropoxide are preferable because they are relatively inexpensive and easily available.

Examples of the organic yttrium compound as the organometallic compound include yttrium acetylacetonate (standard nomenclature: yttrium(III)-2,4-pentanedionate) [Y(C$_5$H$_7$O$_2$)$_3$] and others as yttrium acetylacetonate complexes; yttrium(III)isopropoxide [Y(C$_3$H$_7$O)$_3$] and others as yttrium alkoxides; and yttrium acetate(III) [Y(CH$_3$COO)$_3$] and others as organic acid yttrium. Basically, however, any organic yttrium compound can be used as long as it is dissolved in a solvent and is decomposed to an oxide without generating harmful gas such as chlorine gas or nitrogen oxide gas at the time of the heating process.

Examples of the organic zirconium compound as the organometallic compound include zirconium(IV)di-n-butoxide bis(2,4-pentanedionate) [Zr(C$_4$H$_9$O)$_2$(C$_5$H$_7$O$_2$)$_2$] and zirconium acetylacetonate (standard nomenclature: zirconium (IV)-2,4-pentanedionate) [Zr(C$_5$H$_7$O$_2$)$_4$] as zirconium acetylacetonate complexes; and zirconium(IV)ethoxide [Zr(C$_2$H$_5$O)$_4$], zirconium(IV)-n-propoxide [Zr(C$_3$H$_7$O)$_4$], zirconium (IV) isopropoxide [Zr(C$_3$H$_7$O)$_4$], zirconium-(IV)-n-butoxide [Zr(C$_4$H$_9$O)$_4$], zirconium(IV)-tert-butoxide [Zr(C$_4$H$_9$O)$_4$], zirconium(IV)-2-methyl-2-butoxide [Zr(C$_5$H$_{11}$O)$_4$], zirconium(IV)-2-methoxymethyl-2-propoxide [Zr(CH$_3$OC$_4$H$_9$O)$_4$], and others as zirconium alkoxides. Basically, however, any organic zirconium compound can be used as long as it is dissolved in a solvent and is decomposed to an oxide without generating harmful gas such as chlorine gas or nitrogen oxide gas at the time of the heating process. Among these, zirconium(IV)-n-propoxide and a zirconium (IV)-n-butoxide are preferable because they are relatively inexpensive and easily available.

Examples of the organic niobium compound as the organometallic compound include niobium(V)ethoxide [Nb(C$_2$H$_5$O)$_5$], niobium(V)-n-butoxide [Nb(C$_4$H$_9$O)$_5$], and others as niobium alkoxides. Basically, however, any organic niobium compound can be used as long as it is dissolved in a solvent and is decomposed to an oxide without generating harmful gas such as chlorine gas or nitrogen oxide gas at the time of the heating process.

Examples of the organic molybdenum compound as the organometallic compound include molybdenum(VI)oxide bis-2,4-pentanedionate [MoO$_2$(C$_5$H$_7$O$_2$)$_2$] as a molybdenum acetylacetonate complex; and molybdenum(V)ethoxide [Mo(C$_2$H$_5$O)$_5$] and others as molybdenum alkoxides. Basically, however, any organic molybdenum compound can be used as long as it is dissolved in a solvent and is decomposed to an oxide without generating harmful gas such as chlorine gas or nitrogen oxide gas at the time of the heating process.

Examples of the organic ruthenium compound as the organometallic compound include ruthenium acetylacetonate (standard nomenclature: ruthenium(III)-2,4,-pentanedionate [Ru($C_5H_7O_2$)$_3$] and others as ruthenium acetylacetonate complexes. Basically, however, any organic ruthenium compound can be used as long as it is dissolved in a solvent and is decomposed to an oxide without generating harmful gas such as chlorine gas or nitrogen oxide gas at the time of the heating process.

Examples of the organic antimony compound as the organometallic compound include antimony acetate(III) [Sb($CH_3COO$)$_3$]; and antimony(III)ethoxide [Sb($C_2H_5O$)$_3$], antimony (III)-n-butoxide [Sb($C_4H_9O$)$_3$] and others as antimony alkoxides. Basically, however, any organic antimony compound can be used as long as it is dissolved in a solvent and is decomposed to an oxide without generating harmful gas such as chlorine gas or nitrogen oxide gas at the time of the heating process. Among these, antimony(III)-n-butoxide is preferable because it is relatively inexpensive and easily available.

Examples of the organic lanthanum compound as the organometallic compound include lanthanum acetylacetonate (standard nomenclature: lanthanum(III)-2,4-pentanedionate) [La($C_5H_7O_2$)$_3$] and others as lanthanum acetylacetonate complexes; lanthanum(III)isopropoxide [La($C_3H_7O$)$_3$] and others as lanthanum alkoxides; and lanthanum acetate(III) [La($CH_3COO$)$_3$] and others as organic acid lanthanum. Basically, however, any organic lanthanum compound can be used as long as it is dissolved in a solvent and is decomposed to an oxide without generating harmful gas such as chlorine gas or nitrogen oxide gas at the time of the heating process.

Examples of the organic hafnium compound as the organometallic compound include hafnium(IV)di-n-butoxide bis (2,4-pentanedionate) [Hf($C_4H_9O$)$_2$($C_5H_7O_2$)$_2$], hafnium acetylacetonate (standard nomenclature: hafnium(IV)-2,4-pentanedionate) [Hf($C_5H_7O_2$)$_4$], and others as hafnium acetylacetonate complexes; and hafnium(IV)ethoxide [Hf($C_2H_5O$)$_4$], hafnium(IV)-n-butoxide [Hf($C_4H_9O$)$_4$], hafnium (IV)-tert-butoxide [Hf($C_4H_9O$)$_4$], hafnium (IV) isopropoxidemonoisopropylate [Hf($C_3H_7O$)$_4$($C_3H_7OH$)], and others as hafnium alkoxides. Basically, however, any organic hafnium compound can be used as long as it is dissolved in a solvent and is decomposed to an oxide without generating harmful gas such as chlorine gas or nitrogen oxide gas at the time of the heating process. Among these, hafnium(IV)-n-butoxide is preferable because it is relatively inexpensive and easily available.

Examples of the organic tantalum compound as the organometallic compound include tantalum(V)tetraethoxidepentanedionate) [Ta($C_5H_7O_2$)($OC_2H_5$)$_4$] as a tantalum acetylacetonate complex; and tantalum(V)methoxide [Ta($CH_3O$)$_5$], tantalum(V)ethoxide [Ta($C_2H_5O$)$_5$], tantalum(V)isopropoxide [Ta($C_3H_7O$)$_5$], tantalum(V)-n-butoxide [Ta($C_4H_9O$)$_5$], tetraethoxyacetylacetonato tantalum(V) [Ta($C_2H_5O$)$_4$($C_5H_7O_2$)], and others as tantalum alkoxides. Basically, however, any organic tantalum compound can be used as long as it is dissolved in a solvent and is decomposed to an oxide without generating harmful gas such as chlorine gas or nitrogen oxide gas at the time of the heating process.

Examples of the organic tungsten compound as the organometallic compound include tungsten(V)ethoxide [W($C_2H_5O$)$_5$], tungsten(VI)ethoxide [W($C_2H_5O$)$_6$], and others as tungsten alkoxides. Basically, however, any organic tungsten compound can be used as long as it is dissolved in a solvent and is decomposed to an oxide without generating harmful gas such as chlorine gas or nitrogen oxide gas at the time of the heating process.

Examples of the organic bismuth compound as the organometallic compound include bismuth acetylacetonate (standard nomenclature: bismuth(III)-2,4-pentanedionate) [Bi($C_5H_7O_2$)$_3$], and others as bismuth acetylacetonate complexes; and bismuth(III)pentoxide [Bi($C_5H_{11}O$)$_3$] and others as bismuth alkoxides. Basically, however, any organic bismuth compound can be used as long as it is dissolved in a solvent and is decomposed to an oxide without generating harmful gas such as chlorine gas or nitrogen oxide gas at the time of the heating process.

Examples of the organic cerium compound as the organometallic compound include cerium acetylacetonate (standard nomenclature: cerium(III)-2,4-pentanedionate) [Ce($C_5H_7O_2$)$_3$] as a cerium acetylacetonate complex; and cerium (IV)methoxyethoxide [Ce($CH_3OC_2H_5O$)$_4$], cerium(IV)-tert-butoxide [Ce($C_4H_9O$)$_4$], cerium(IV)isopropoxide [Ce($C_3H_7O$)$_4$], and others as cerium alkoxides. Basically, however, any organic cerium compound can be used as long as it is dissolved in a solvent and is decomposed to an oxide without generating harmful gas such as chlorine gas or nitrogen oxide gas at the time of the heating process.

Examples of the organic neodymium compound as the organometallic compound include neodymium acetylacetonate (standard nomenclature: neodymium(III)-2,4-pentanedionate) [Nd($C_5H_7O_2$)$_3$] and others as neodymium acetylacetonate complexes; neodymium(III)methoxyethoxide [Nd($CH_3OC_2H_4O$)$_3$] and others as neodymium alkoxides; and neodymium acetate(III) [Nd($CH_3COO$)$_3$] and others as organic acid neodymium. Basically, however, any organic neodymium compound can be used as long as it is dissolved in a solvent and is decomposed to an oxide without generating harmful gas such as chlorine gas or nitrogen oxide gas at the time of the heating process.

Examples of the organic samarium compound as the organometallic compound include samarium acetylacetonate (standard nomenclature: samarium(III)-2,4-pentanedionate) [Sm($C_5H_7O_2$)$_3$] and others as samarium acetylacetonate complexes; samarium(III)isopropoxide [Sm($C_3H_7O$)$_3$] and others as samarium alkoxides; and samarium acetate(III) [Sm($CH_3COO$)$_3$] and others as organic acid samarium. Basically, however, any organic samarium compound can be used as long as it is dissolved in a solvent and is decomposed to an oxide without generating harmful gas such as chlorine gas or nitrogen oxide gas at the time of the heating process.

Examples of the organic gadolinium compound as the organometallic compound include gadolinium acetylacetonate (standard nomenclature: gadolinium(III)-2,4-pentanedionate) [Gd($C_5H_7O_2$)$_3$] and others as gadolinium acetylacetonate complexes; and gadolinium acetate(III) [Gd($CH_3COO$)$_3$] and others as organic acid gadolinium. Basically, however, any organic gadolinium compound can be used as long as it is dissolved in a solvent and is decomposed to an oxide without generating harmful gas such as chlorine gas or nitrogen oxide gas at the time of the heating process.

Examples of the organic magnesium compound as the organometallic compound include magnesium acetylacetonate (standard nomenclature: magnesium(II)-2,4-pentanedionate) [Mg($C_5H_7O_2$)$_2$] and others as magnesium acetylacetonate complexes; and magnesium(II)ethoxide [Mg($C_2H_5O$)$_2$], magnesium(II)-n-propoxide [Mg($C_3H_7O$)$_2$], and others as magnesium alkoxides. Basically, however, any organic magnesium compound can be used as long as it is dissolved in a solvent and is decomposed to an oxide without generating harmful gas such as chlorine gas or nitrogen oxide gas at the time of the heating process.

Examples of the organic calcium compound as the organometallic compound include calcium acetylacetonate (standard nomenclature: calcium(II)-2,4-pentanedionate) [Ca$(C_5H_7O_2)_2$] and others as calcium acetylacetonate complexes; calcium(II)ethoxide [Ca$(C_2H_5O)_2$] and others as calcium alkoxides; and calcium acetate(II) [Ca$(CH_3COO)_2$] and others as organic acid calcium. Basically, however, any organic calcium compound can be used as long as it is dissolved in a solvent and is decomposed to an oxide without generating harmful gas such as chlorine gas or nitrogen oxide gas at the time of the heating process.

Examples of the organic strontium compound as the organometallic compound include strontium acetylacetonate (standard nomenclature: strontium(II)-2,4-pentanedionate) [Sr$(C_5H_7O_2)_2$] and others as strontium acetylacetonate complexes; strontium(II)isopropoxide [Sr$(C_3H_7O)_2$] and others as strontium alkoxides; and strontium acetate(II) [Sr$(CH_3COO)_2$] and others as organic acid strontium. Basically, however, any organic strontium compound can be used as long as it is dissolved in a solvent and is decomposed to an oxide without generating harmful gas such as chlorine gas or nitrogen oxide gas at the time of the heating process.

Examples of the organic barium compound as the organometallic compound include barium acetylacetonate (standard nomenclature: barium(II)-2,4-pentanedionate) [Ba$(C_5H_7O_2)_2$] and others as barium acetylacetonate complexes; barium(II)isopropoxide [Ba$(C_3H_7O)_2$] and others as barium alkoxides; and barium acetate(II) [Ba$(CH_3COO)_2$] and others as organic acid barium. Basically, however, any organic barium compound can be used as long as it is dissolved in a solvent and is decomposed to an oxide without generating harmful gas such as chlorine gas or nitrogen oxide gas at the time of the heating process.

Each organometallic compound described above in the coating liquid for forming metal oxide film is a main compound material for forming a metal oxide film on a substrate, and its content is preferably in a range of 1 weight % to 30 weight %, and more preferably 5 weight % to 20 weight %. If the total content is smaller than 1 weight %, only a metal oxide with a thin film thickness can be obtained, and therefore sufficient conductivity cannot be obtained. Also, if the total content exceeds 30 weight %, the organometallic compound in the coating liquid for forming metal oxide film easily precipitates to decrease stability of the coating liquid, or the obtained metal oxide film becomes too thick and a split (crack) may occurs.

As required, a small amount of any one or more of an organic indium compound, an organic tin compound, and an organic zinc compound may be added to the coating liquid for forming metal oxide film described above.

For example, examples of the organic indium compound include indium acetylacetonate (standard nomenclature: tris (acetylacetonato)indium(III)) [In$(C_5H_7O_2)_3$], indium 2-ethylhexanoate(III) [In$(C_7H_{15}COO_2)_3$], indium formate(III) [In$(HCOO)_3$], indium acetate(III) [In$(CH_3COO)_3$]; and indium (III)methoxyethoxide [In$(CH_3OC_2H_4O)_3$] and others as indium alkoxides. Basically, however, any organic indium compound can be used as long as it is dissolved in a solvent and is decomposed to an oxide without generating harmful gas such as chlorine gas or nitrogen oxide gas at the time of the heating process. Among these, indium acetylacetonate is preferable because it has a high degree of solubility in an organic solvent and becomes an oxide by being thermally decomposed and burnt (oxidized) at a temperature of 200° C. to 250° C.

Examples of the organic tin compound (the valence of tin in the compound may be 2 or 4) include tin acetylacetonate (standard nomenclature: di-n-butyl bis(2,4-pentanedionato) tin(IV), [Sn$(C_4H_9)_2(C_5H_7O_2)_2$], 2-ethyl hexanoic tin(II) (also known as tin octylate(II)) [Sn$(C_7H_{15}COO_2)_2$], tin acetate(II) [Sn$(CH_3COO)_2$], tin acetate(IV) [Sn$(CH_3COO)_4$], di-n-butyl tin(IV)diacetate [Sn$(C_4H_9)_2(CH_3COO)_2$], tin formate(II) [Sn$(HCOO)_2$]; tin(IV)-tert-butoxide [Sn$(C_4H_9O)_4$] and others as tin alkoxides. Basically, however, any organic tin compound can be used as long as it is dissolved in a solvent and is decomposed to an oxide without generating harmful gas such as chlorine gas or nitrogen oxide gas at the time of the heating process. Among these, tin acetylacetonate is preferable because it is relatively inexpensive and easily available.

Examples of the organic zinc compound include zinc acetylacetonate (standard nomenclature: zinc(II)-2,4-pentanedionate) [Zn$(C_5H_7O_2)_2$], and zinc(II)-2,2,6,6-tetramethyl-3,5-heptanedionate [Zn$(C_{11}H_{19}O_2)_2$] as zinc acetylacetonate complexes; and zinc(II)methoxyethoxide [Zn$(CH_3OC_2H_4O)_2$] and others as zinc alkoxides. Basically, however, any organic zinc compound can be used as long as it is dissolved in a solvent and is decomposed to an oxide without generating harmful gas such as chlorine gas or nitrogen oxide gas at the time of the heating process. Among these, zinc acetylacetonate is preferable because it is inexpensive and easily available.

Furthermore, an organic binder can be added, as required, to the coating liquid for forming metal oxide film. With addition of the organic binder, wettability with respect to the substrate is improved. At the same time, the viscosity of the coating liquid can be adjusted. The above organic binder is preferably made of a material that is thermally decomposable or burnable at the time of the heating process. As this material, a cellulose derivative, an acrylic resin, or the like is effective.

Examples of the cellulose derivative for use as an organic binder include methylcellulose, ethylcellulose, hydroxymethylcellulose, hydroxyethylcellulose, hydroxypropylcellulose, hydroxyethylmethylcellulose, hydroxypropylmethylcellulose, ethylhydroxyethylcellulose, carboxymethylcellulose, carboxyethylcellulose, carboxyethylmethylcellulose, nitrocellulose, and others. Among these, hydroxypropylcellulose (hereinafter may be referred to as "HPC") is preferable.

Note that in various cellulose derivatives and acrylic resins, many types having different molecular weights have been commercially available. For example, as for HPC, there are a high molecular weight type, an intermediate molecular weight type, and a low molecular weight type according to the magnitude of the molecular weight. As the molecular weight is larger, the viscosity of the coating liquid for forming metal oxide film mixed as a binder can be increased. It is required to optimally select the molecular weight type and determine the content to be mixed whenever necessary according to the coatability of the coating liquid for forming metal oxide film as well as the coating method and coating film thickness of the coating liquid for forming metal oxide film.

With the use of HPC described above, sufficient wettability with a content equal to or smaller than 5 weight % can be normally obtained, and significant viscosity adjustment can be performed. Furthermore, while a burning start temperature of HPC is approximately 300° C., and HPC burns if the heating treatment is performed at a heating temperature equal to or higher than 300° C., preferably equal to or higher than 350° C. Therefore, without inhibiting particle growth of conductive particles to be generated, a metal oxide film with high conductivity can be fabricated. If the content of HPC is larger than 5 weight %, HPC becomes gelated and tends to be left in the coating liquid, thereby forming an extremely porous metal oxide film to significantly impair transparency and conductivity.

Here, for example, when ethylcellulose is used as the cellulose derivative in place of HPC, the viscosity of the coating liquid can be normally set lower than the case of using HPC. However, pattern printability is slightly degraded in screen printing or the like in which a coating liquid with high viscosity is preferable.

Meanwhile, nitrocellulose is excellent in thermal decomposability, but may generate harmful nitrogen oxide gas at the time of the heating process, thereby possibly posing degradation of a heating furnace or a problem in exhaust gas processing. As described above, the cellulose derivate for use is required to be selected as appropriate according to the situation.

Also, as the acrylic resin, an acrylic resin burnable at a relatively low temperature is preferable.

As the solvent for use as the coating liquid for forming metal oxide film, N-methyl-2-pyrrolidone (NMP) or γ-butyrolactone capable of dissolving various metal acetylacetonate complex compounds and various metal alkoxide compounds with high concentration is preferable.

Furthermore, examples of other preferable solvents include either one or both of alkylphenol and alkenylphenol and dibasic acid ester; either one or both of alkylphenol and alkenylphenol and benzyl acetate; or a solution of mixture thereof.

Examples of alkylphenol or alkenylphenol include cresols, xylenol, ethylphenol, p-tert-butylphenol, octylphenol, nonylphenol, cashew nut shell liquid [3 pentadecadesylphenol], and others. As the dibasic acid ester (for example, dibasic acid dimethyl, dibasic acid diethyl), any of succinic acid ester, glutaric acid ester, adipic acid ester, malonic acid ester, phthalic acid ester, and others is used.

Furthermore, as a solvent to be mixed in the coating liquid for forming metal oxide film to decrease viscosity of the coating liquid or improve coatability, any can be used as long as it has compatibility with a solvent in which any of various organometallic compounds and a cellulose derivative or acrylic resin are dissolved. Examples other than the solvents described above include, although not restrictive: water; alcohol-based solvents such as methanol (MA), ethanol (EA), 1-propanol (NPA), isopropanol (IPA), butanol, pentanol, benzil alcohol, and diacetone alcohol (DAA); ketone-based solvents such as acetone, methyl ethyl ketone (MEK), methyl propyl ketone, methyl isobutyl ketone (MIBK), cyclohexanone, and isophorone; ester-based solvents such as ethyl acetate, butyl acetate, isobutyl acetate, amyl formate, isoamyl acetate, butyl propionate, isopropyl butyrate, ethyl butyrate, butyl butyrate, methyl lactate, ethyl lactate, methyl oxyacetate, ethyl oxyacetate, butyl oxyacetate, methoxy methyl acetate, methoxy ethyl acetate, methoxy butyl acetate, ethoxy methyl acetate, ethoxy ethyl acetate, 3-oxypropionic acid methyl, 3-oxypropionic acid ethyl, 3-methoxy propionic acid methyl, 3-methoxypropionic acid ethyl, 3-ethoxypropionic acid methyl, 3-ethoxypropionic acid ethyl, 2-oxypropionic acid methyl, 2-oxypropionic acid ethyl, 2-oxypropionic acid propyl, 2-methoxypropionic acid methyl, 2-methoxypropionic acid ethyl, 2-methoxypropionic acid propyl, 2-ethoxypropionic acid methyl, 2-ethoxypropionic acid ethyl, 2-oxy-2-methylpropionic acid methyl, 2-oxy-2-methylpropionic acid ethyl, 2-methoxy-2-methylpropionic acid methyl, 2-ethoxy-2-methylpropionic acid ethyl, methyl pyruvic acid, ethyl pyruvic acid, propyl pyruvic acid, aceto methyl acetate, aceto ethyl acetate, 2-oxobutanoate methyl, and 2-oxobutanoate ethyl; glycol derivatives such as ethylene glycol monomethyl ether (MCS), ethylene glycol monoethyl ether (ECS), ethylene glycol isopropyl ether (IPC), ethylene glycol monobutyl ether (BCS), ethylene glycol monoethyl ether acetate, ethylene glycol monobutyl ether acetate, propylene glycol monomethyl ether (PGM), propylene glycol ethyl ether (PE), propylene glycol monomethyl ether acetate (PGM-AC), propylene glycol ethyl ether acetate (PE-AC), diethylene glycol monomethyl ether, diethylene glycol monoethyl ether, diethylene glycol monobutyl ether, diethylene glycol monomethyl ether acetate, diethylene glycol monoethyl ether acetate, diethylene glycol monobutyl ether acetate, diethylene glycol dimethyl ether, diethylene glycol diethyl ether, diethylene glycol dibutyl ether, dipropylene glycol monomethyl ether, dipropylene glycol monoethyl ether, and dipropylene glycol monobutyl ether; benzene derivatives such as toluene, xylene, mesitylene, and dodecylbenzene; formamide (FA), N-methyl formamide, dimethyl formamide (DMF), dimethyl acetamide, dimethyl sulfoxide (DMSO), ethylene glycol, diethylene glycol, propylene glycol, dipropylene glycol, 1,3-butylene glycol, pentamethylene glycol, 1,3-octylene glycol, tetrahydrofuran (THF), chloroform, mineral spirits, terpineol, and a solution of mixture of some of these components.

In consideration of stability and film formability of the coating liquid, as the solvent for use, methyl ethyl ketone (MEK), cyclohexanone, propylene glycol monomethyl ether (PGM), N-methyl-2-pyrrolidone (NMP), γ-butyrolactone, and others are preferable.

The coating liquid for forming metal oxide film for use in the present invention is formed of any one or more types of an organic aluminum compound, an organic silicon compound, an organic scandium compound, an organic titanium compound, an organic vanadium compound, an organic chromium compound, an organic manganese compound, an organic iron compound, an organic cobalt compound, an organic nickel compound, an organic copper compound, an organic gallium compound, an organic germanium compound, an organic yttrium compound, an organic zirconium compound, an organic niobium compound, an organic molybdenum compound, an organic ruthenium compound, an organic antimony compound, an organic lanthanum compound, an organic hafnium compound, an organic tantalum compound, an organic tungsten compound, an organic bismuth compound, an organic cerium compound, an organic neodymium compound, an organic samarium compound, an organic gadolinium compound, an organic magnesium compound, an organic calcium compound, an organic strontium compound, and an organic barium compound as described above, and the above metal oxide is manufactured by heating and dissolving an organometallic compound of any one or more types of an aluminum oxide, a silicon oxide, a scandium oxide, a titanium oxide, a vanadium oxide, a chromium oxide, a manganese oxide, an iron oxide, a cobalt oxide, a nickel oxide, a copper oxide, a gallium oxide, a germanium oxide, a yttrium oxide, a zirconium oxide, a niobium oxide, a molybdenum oxide, a ruthenium oxide, an antimony oxide, a lanthanum oxide, a hafnium oxide, a tantalum oxide, a tungsten oxide, a bismuth oxide, a cerium oxide, a neodymium oxide, a samarium oxide, a gadolinium oxide, a magnesium oxide, a calcium oxide, a strontium oxide, a barium oxide, and others; as required, any one or more types of various organometallic compounds other than those described above; and, furthermore, a mixture added with an organic binder as required.

Heating and dissolving are performed normally at a heating temperature of 60° C. to 200° C. and by agitating for 0.5 hour to 12 hours. If the heating temperature is lower than 60° C., sufficient dissolution cannot be achieved. For example, in the case of a coating liquid for forming metal conductive film having the organic indium compound as a main component, precipitation and separation of the metal compound such as indium acetylacetonate occur to decrease stability of the coating liquid. If the heating temperature is higher than 200° C., evaporation of the solvent becomes apparent to change the composition of the coating liquid. Therefore, such temperatures are not preferable.

Since the viscosity of the coating liquid for forming metal oxide film can be adjusted based on the molecular weight and content of the organic binder and the type of the solvent as described above, the viscosity can be adjusted so as to be suitable for various coating methods such as an inkjet printing method, a screen printing method, a gravure printing method, an offset printing method, a flexor printing method, a dispenser printing method, a slit coating method, a die coating method, a doctor blade coating method, a wire bar coating method, a spin coating method, and a spray coating method.

A coating liquid with a high viscosity (approximately 5000 mPa·s to 50000 mPa·s) can be fabricated by making 5 weight % or smaller, preferably 2 weight % to 4 weight %, of an organic binder with a high molecular weight contained therein. A coating liquid with a low viscosity (approximately 5 mPa·s to 500 mPa·s) can be fabricated by making 5 weight % or smaller, preferably 0.1 weight % to 2 weight %, of an organic binder with a low molecular weight contained therein and diluting the coating liquid with a dilution solvent with a low viscosity. Also, a coating liquid with an intermediate viscosity (approximately 500 mPa·s to 5000 mPa·s) can be fabricated by mixing the coating liquid with the high viscosity and the coating liquid with the low viscosity together.

[Metal Oxide Film Manufacturing Method]

The method of manufacturing the metal oxide film of the present invention is described in detail.

The metal oxide film of the present invention is formed through a coating process of coating a substrate with a coating liquid for forming metal oxide film to form a coating film, a drying process of drying the coating film to form a dried coating film, and a heating process of performing a heating treatment on the dried coating film under an oxygen-containing atmosphere having a low dew-point temperature to form an inorganic film.

(a) Coating Process

The substrate is coated with the coating liquid for forming metal oxide film by using various coating methods such as an inkjet printing method, a screen printing method, a gravure printing method, an offset printing method, a flexor printing method, a dispenser printing method, a slit coating method, a die coating method, a doctor blade coating method, a wire bar coating method, a spin coating method, and a spray coating method.

This coating is preferably performed in a clean atmosphere such as a clean room where temperature and humidity are controlled. In general, the temperature is at a room temperature (approximately 25° C.) and the humidity is 40% RH to 60% RH.

As the heat-resistant substrate, an inorganic substrate made of soda lime glass, non-alkali glass, quartz glass, or the like or a resin substrate (a heat-resistant plastic film) made of polyethylene naphthalate (PEN), polyethylene terephthalate (PET), nylon, polyethersulfone (PES), urethane, cycloolefin resin (such as ZEONOR [manufactured by Zeon Corporation] and ARTON [manufactured by JSR Corporation]), fluorine-based resin, polyimide (PI), or others can be used.

(b) Drying Process

In the next drying process, the substrate coated with the coating liquid for forming metal oxide film is kept in the atmosphere normally at 80° C. to 180° C. for one minute to thirty minutes, preferably for two minutes to ten minutes, to dry the coating film, thereby fabricating a dried coating film.

Drying conditions (drying temperature and drying time) can be selected as appropriate according a type of the substrate for use, a coating thickness of the coating liquid for forming metal oxide film, and others, and are not restricted to the drying conditions described above. However, in consideration of productivity, the drying time is desirably reduced to a minimum with which the film quality of the obtained dried coating film is not deteriorated.

Also, the drying temperature is required to be equal to or lower than the heat-resistant temperature of the substrate for use. For example, in the case of the above PEN film, the drying temperature is required to be set to be approximately equal to or lower than 200° C. (although it depends on the drying time). Note that drying under reduced pressure (ultimate pressure: normally equal to or lower than 1 kPa) can be applied, as required, in place of drying in the atmosphere. In this drying under reduced pressure, the solvent in the coating liquid for forming metal oxide film used for coating is forcibly removed under reduced pressure to cause drying to proceed. Therefore, drying at a lower temperature can be performed compared with drying in the atmosphere. Thus, this is useful when a substrate made of a material with poor heat resistance or solvent resistance.

This fabricated dried coating film has the above organic solvent vaporized and removed from the coating liquid for forming metal oxide film, and is composed of an organic-based component such as the organometallic compound described above, (a small amount of an organic indium compound, an organic tin compound, or an organic zinc compound added, as required), an organic binder, and others.

(c) Heating Process

In the heating process, the dried coating film fabricated in the drying process is subjected to a heating treatment under an oxygen-containing atmosphere having a low dew-point temperature, to mineralize the organic-based component of such as the organometallic compound described above, the organometallic compound containing a small amount of the above organometallic compound added, and the organic binder in the dried coating film by being thermally decomposed and burnt (oxidized), thereby forming a dense inorganic film formed of inorganic components (having a metal oxide as a main component) (the dense inorganic film is a metal oxide film as a metal oxide fine-particle layer densely packed with metal oxide fine particles).

That is, when the heating temperature is increased in the course of elevation of temperature in the heating process, the organometallic compound in the dried coating film (also including the one containing a small amount of an organometallic compound) is gradually thermally decomposed and burnt (oxidized) to be first converted to a metal oxide in an amorphous state (here, referring to the state of extremely fine particles having a crystallite size found by X-ray diffraction, of smaller than 3 nm), that is, mineralization occurs. Then, when the heating temperature is further increased to normally exceed a range of 300° C. to 330° C. or when the heating time is long even if the heating temperature stays in the range of 300° C. to 330° C., crystallization of the above-described metal oxide occurs, and crystal growth further proceeds to produce conductive oxide fine particles, which are final components of the metal oxide film.

Note that the temperatures from 300° C. to 330° C. indicate a general temperature range at which the above-described mineralization and crystallization tend to occur. For example, when the heating time is long, mineralization, crystallization, and crystal growth may occur even if the heating temperature is approximately 270° C. Therefore, the heating temperature in the heating process according to the present invention is not restricted to be equal to or higher than 300° C.

On the other hand, similarly, the organic binder is gradually thermally decomposed and burnt (oxidized) in the course of elevation of temperature in the heating process, and is converted mainly to carbon dioxide ($CO_2$) to be vaporized into the atmosphere to disappear from the film (although it depends on the type of organic binder, in the case of HPC described above, for example, it almost completely disappears at a temperature approximately 300° C. to 350° C.). Therefore, eventually, the organic binder is hardly left in the metal oxide film. It is considered that the organic binder remains much until an initial stage of the heating process (this stage is a stage in the course of elevation of temperature, for example, a stage where the temperature is increased from room temperature up to 300° C.), and uniformly intervenes in the metal oxide in the amorphous state described above to suppress crystallization, and then, with the heating process further proceeding, the organic binder components gradually disappear and crystallization of the metal oxide described above starts to occur.

The heating process is descried in more detail below.

In the process of heating the dried coating film of the present invention, an oxygen-containing atmosphere having a low dew-point temperature, that is, with a small water vapor content, (for reference, FIG. 1 depicts a relation between a saturated water vapor content (volume %) in the air and a dew-point temperature (° C.)) is firstly applied to an atmosphere in the course of elevation of temperature. With this, crystallization of the metal oxide due to mineralization occurring at the initial stage of the heating process as described above and crystal growth are suppressed, which makes it possible to obtain a film structure of the metal oxide fine-particle layer densely packed with metal oxide fine particles according to the present invention. Note that a mechanism in which the film is densely packed with metal oxide fine particles can be considered as follows, although this is not necessarily clear.

That is, the following can be assumed that; at least until the time when crystallization of the metal oxide due to mineralization occurring in the course of elevation of temperature in the heating process (the initial stage of the heating process; in the present invention, normally around at 300° C. to 330° C.), the film structure is kept with the organic binder uniformly intervening in the metal oxide in the amorphous state described above. This film structure has flexibility with the action of the organic binder, which is an organic substance, to allow shrinkage (densification) of the film in a vertical direction to the substrate. Therefore, when the temperature is increased and a heating treatment is performed under an air atmosphere having a low dew-point temperature, crystallization of the metal oxide is suppressed to the fullest extent possible up to a temperature at which the organic binder disappears (up to approximately 300° C. to 350° C.), and the contractive film structure described above can be taken, leading to densification of the film.

Note that the reason why crystallization of the metal oxide and crystal growth are suppressed under the above-described air atmosphere having a low dew-point temperature, that is, with a small water vapor content, is not clear, but can be considered as follows. For example, water vapor in the air atmosphere (1) has an action of promoting thermal decomposition and burning (oxidation) of the organic binder components intervening in the metal oxide, and (2) has an action of promoting crystallization and crystal growth of the metal oxide itself.

Specifically, first, while an oxygen-containing atmospheric gas having a dew-point temperature equal to or lower than −10° C. is being supplied, the temperature is increased to a temperature or higher at which crystallization of the meal oxide occurs (normally, a temperature equal to or higher than 300° C. to 330° C.) to perform a heating treatment, thereby achieving densification of the film.

A dense metal oxide film can be obtained even with a simple heating treatment under the oxygen-containing atmosphere having a dew-point temperature equal to or lower than −10° C. as described above, while if energy ray irradiation is also used together with the above simple heating treatment in the heating process (hereinafter may be referred to as "heat energy ray irradiation"), the heating temperature of the heating process under the oxygen-containing atmosphere having a dew-point temperature equal to or lower than −10° C. can be significantly decreased (as will be described further below, the heating temperature can be decreased to 100° C. to 200° C.).

That is, in this method, while being heated under the oxygen-containing atmosphere having a dew-point temperature equal to or lower than −10° C., the dried coating film obtained in the drying process is subjected to energy ray irradiation. With this method, the organic components of the dried coating film are gradually decomposed and burnt (oxidized) to proceed mineralization of the film, and then the thickness of the film is gradually decreased to further promote densification. For example, with heat energy ray irradiation at a low temperature of 150° C. to 200° C. under the oxygen-containing atmosphere, a dried coating film having a thickness of 300 nm to 500 nm can be eventually changed into a dense inorganic film having a thickness of approximately 80 nm to 100 nm.

Here, for example, after the heat energy ray irradiation at 100° C. to 200° C. is performed, a simple heating process under the oxygen-containing atmosphere having a dew-point temperature equal to or lower than −10° C. can also be performed at 300° C. or higher. In this case, while densification of the film is promoted with heat energy ray irradiation at a relatively low temperature (100° C. to 200° C.), crystallization is also promoted with the simple heating process at a relatively high temperature (equal to or higher than 300° C.). Therefore, a metal oxide film with higher quality can be obtained.

Note that the heating temperature in heat energy ray irradiation is desirably lower than 300° C., preferably in a range of 40° C. to 250° C., more preferably 100° C. to 200° C., further preferably 100° C. to 150° C. If the heating temperature is equal to or higher than 300° C., thermal decomposition of the dried coating film to be subjected to energy ray irradiation starts before energy ray irradiation. This inhibits densification of the film, and therefore is not preferable. Although a heating temperature lower than 40° C. is not completely impractical, it is required to pay careful enough attention to the fact that the speed of mineralization and densification of the dried coating film with the heat energy ray irradiation is decreased.

Here, energy ray irradiation for use in the heat energy ray irradiation described above is desirably ultraviolet ray irradiation including at least a wavelength equal to or smaller than 200 nm as a main component and, more specifically, irradiation of ultraviolet rays emitted from any of a low-pressure mercury lamp, an amalgam lamp, or an excimer lamp. The amount of irradiation of ultraviolet rays is equal to or larger than the illuminance of light having a wavelength equal to or smaller than 200 nm: equal to or larger than 2 $mW/cm^2$, preferably equal to or larger than 4 $mW/cm^2$.

The irradiation time is equal to or longer than one minute, preferably equal to or longer than two minutes, and preferably equal to or longer than four minutes. If the irradiation time is too short, the effect of energy ray irradiation (mineralization and densification) is insufficient. If the irradiation time is too long (for example, in the case of a long time exceeding sixty minutes), productivity (process efficiency) is significantly decreased, and the effect of energy ray (mineralization and densification) is almost saturated, and therefore this is not preferable.

This irradiation amount of ultraviolet rays can be adjusted as appropriate depending on a distance between the substrate and the lamp (an irradiation distance), irradiation time, or lamp output. In this energy ray irradiation to the entire surface of the substrate using the lamp, for example, a straight-tube lamp may be arranged in parallel for irradiation, or a surface light source of a grid lamp may be used.

Meanwhile, from the lamp for energy ray irradiation described above, not only energy rays such as ultraviolet rays but also heat rays are normally emitted. Therefore, for example, when the heating temperature in the heat energy ray irradiation is low such as 40° C. to 50° C., the substrate is not necessarily heated by a heating apparatus (such as a hot plate). In other words, even not being heated by the heating apparatus, the substrate is heated to at least approximately 40° C. to 50° C. with heat ray irradiation from the energy ray irradiation lamp.

Here, the energy ray irradiation in the heat energy ray irradiation may be performed on the entire surface of the dried coating film, or may be performed only on a specific portion of the dried coating film in a pattern shape. In this case, since mineralization and densification of the film described above proceed only on the portion subjected to energy ray irradiation, a metal oxide fine-particle layer having a pattern shape can be formed.

Note that when a portion of the dried coating film where the metal oxide fine-particle layer is not formed (a portion of the dried coating film not irradiated with energy rays) is required to be removed, since that portion is not mineralized, the portion can be removed by dissolving the portion in an organic solvent capable of dissolving the dried coating film. On the other hand, the mineralized portion of the metal oxide fine-particle layer is not dissolved in the organic solvent at all, and therefore only the portion of the metal oxide fine-particle layer can be left on the substrate.

Examples of the organic solvent excellent in solubility of the above-described dried coating film include methyl ethyl ketone (MEK), methyl propyl ketone, methyl isobutyl ketone (MIBK), cyclohexanone, acetylacetone (2,4-pentanedione), dimethyl formamide (DMF), dimethyl sulfoxide (DMSO), N-methyl-2-pyrrolidone (NMP), γ-butyrolactone, and others.

The low-pressure mercury lamp and the excimer lamp capable of emitting light having a wavelength equal to or smaller than 200 nm are described in detail below. In heat energy ray irradiation, the low-pressure mercury lamp is preferably used, which has less use restrictions and, when a heating treatment is performed concurrently, can make an influence of heating on the lamp small.

While the low-pressure mercury lamp generally has argon gas and mercury enclosed in a quartz glass tube, the amalgam lamp has an amalgam alloy which is an alloy of mercury and a special rare metal enclosed therein, thereby allowing high output approximately twice to three fold compared with the low-pressure mercury lamp, and the output wavelength characteristics are approximately the same as those of the low-pressure mercury lamp, and therefore detailed description is omitted. As a matter of course, as with the low-pressure mercury lamp, the amalgam lamp is also preferably used in the heat energy ray irradiation because the amalgam lamp has less use restrictions and, when the heating treatment is performed concurrently, can make an influence of heating on the lamp small.

However, a special apparatus that cools a lamp with nitrogen gas or the like without absorption of ultraviolet rays as cooling gas can be used. In this case, the above does not apply.

The low-pressure mercury lamp emits ultraviolet rays having wavelengths of 185 nm and 254 nm. For example, in the air, as shown in reaction formulas (1) to (3) below, light of 185 nm decomposes oxygen to generate ozone and, furthermore, light of 254 nm decomposes that ozone at a speed in units of ms (milliseconds) to generate high-energy active atomic oxygen $O(^1D)$. At the same time, light of 185 nm (photon energy: 647 kJ/mol) and light of 254 nm cut a chemical bond of an organic substance, and ozone and active atomic oxygen act on the organic substance with its chemical bond being cut. With this, the organic substance is considered to be eventually subjected to oxidative destruction and vaporization to water and carbon dioxide, and a relatively long effective irradiation distance of 0 mm to 20 mm can be ensured (its critical irradiation distance is 200 mm).

[Chemical Formula 1]

$$O_2 + h\nu(185\text{ nm}) \rightarrow O(^3P) + O(^3P) \quad (1)$$

$$O(3P) + O_2 \rightarrow O_3 \quad (2)$$

$$O_3 + h\nu(254\text{ nm}) \rightarrow O(^1D) + O_2 \quad (3)$$

h: Planck's constant, ν: optical frequency,
$O(^3P)$: oxygen atom in a basal state,
$O(1D)$: oxygen atom in an excited state On the other hand, the excimer lamp (xenon excimer lamp) emits ultraviolet rays having a wavelength of 172 nm, and has a feature such that, unlike the low-pressure mercury lamp, high-energy active atomic oxygen $O(1D)$ can be directly generated, for example, in air, as shown in reaction formula (4) below (here, for dissociation of an oxygen molecule shown in reaction formula (4), a wavelength equal to or smaller than 175 nm is required, and therefore this dissociation does not occur with light of 185 nm of the low-pressure mercury lamp). Also, ozone is generated with reaction formula (5), and active atomic oxygen can also be generated also based on reaction formula (6) (it is considered that the reaction formula (6) is a secondary reaction and active atomic oxygen is mainly generated based on equation (4)).

Furthermore, since photon has a large energy of 696 kJ/mol, the capability of cutting the bond of the organic substance is advantageously higher (since the energy is higher than molecular bond energies of almost all organic substances, the possibility of cutting a molecular bond is high). However, light of 172 nm has an oxygen absorption coefficient approximately 100 times larger compared with light of 185 nm of the low-pressure mercury lamp, and is strongly absorbed to oxygen. Therefore, the ozone and high-energy active atomic oxygen described above can cause an oxidation reaction only near the surface of the lamp and, disadvantageously, the effective irradiation distance in the air is extremely short, 0 mm to 3 mm (its critical irradiation distance is 8 mm).

As such, the organic components in the dried coating film are densified as being mineralized with thermal decomposition and burning (oxidation), thereby obtaining a dense inorganic film.

[Chemical Formula 2]

$$O_2 + h\nu(172\ nm) \rightarrow O(^1D) + O^3(P) \quad (4)$$

$$O(^3P) + O_2 \rightarrow O_3 \quad (5)$$

$$O_3 + h\nu(172\ nm) \rightarrow O(^1D) + O_2 \quad (6)$$

h: Planck's constant, ν: optical frequency,
O($^3$P): oxygen atom in a basal state,
O(1D): oxygen atom in an excited state Meanwhile, after film densification with the heating treatment under the oxygen-containing atmosphere having a dew-point temperature equal to or lower than −10° C. described above, a further heating treatment can be performed, as required, while an oxygen-containing atmospheric gas having a dew-point temperature equal to or higher than 0° C. is being supplied to promote crystal growth of the metal oxide fine particles.

Furthermore, after film densification (the heating treatment in the oxygen-containing atmospheric gas having a dew-point temperature equal to or lower than −10° C.), or after promotion of crystal growth after the densification described above, in particular, when a metal oxide film is applied as a transparent conductive film, the heating treatment is preferably performed while a neutral gas or a reducing atmospheric gas is being supplied.

The oxygen-containing atmospheric gas for use in the present invention may be air or oxygen gas, or mixture gas of oxygen gas and neutral atmospheric gas (nitrogen)/inert gas (such as argon or helium). Air, which is inexpensive and easily available, is preferable.

The low dew-point temperature of the oxygen-containing atmospheric gas having a dew-point temperature equal to or lower than −10° C. is preferably equal to or lower than −15° C., more preferably equal to or lower than −20° C., further preferably −30° C., and most preferably −40° C.

Furthermore, in a heating treatment of elevating the temperature up to a temperature or higher at which crystallization of the metal oxide occurs under the oxygen-containing atmosphere having a dew-point temperature equal to or lower than −10° C. (in the present invention, a temperature normally 300° C. to 330° C. or higher), if the dew-point temperature exceeds −10° C., in the course of forming a metal oxide fine-particle layer made of metal oxide fine particles, water vapor promotes crystallization of the metal oxide and crystal growth at a stage where the organic binder still remains much at the initial stage of the heating treatment, and then the film structure with the organic binder uniformly intervening in the metal oxide in the amorphous state and shrinkable in the film vertical direction, as described above, is destroyed, and thereby causing the metal oxide fine particles to be adhered to each other and be unable to move. This inhibits densification of the film and decreases conductivity and film strength of the metal oxide film, and therefore is not preferable.

Furthermore, in the heating treatment in the oxygen-containing atmospheric gas having a dew-point temperature equal to or higher than 0° C. for promoting crystallization, as required, being performed after film densification, the dew-point temperature of the oxygen-containing atmospheric gas equal to or higher than 0° C. is preferably equal to or higher than 10° C., further preferably equal to or higher than 20° C. If this dew-point temperature is equal to or higher than 0° C., water vapor promotes crystal growth of metal oxide fine particles of the densified film, and therefore densification and crystal growth of the film can be both achieved, and conductivity and film strength of the metal oxide film can be increased.

In the heating treatment of elevating the temperature up to a temperature or higher at which crystallization of the metal oxide under the oxygen-containing atmosphere having a dew-point temperature equal to or lower than −10° C. occurs (in the present invention, a temperature normally 300° C. to 330° C. or higher), a heating temperature (a peak temperature) reaching at the elevation of temperature is equal to or higher than 300° C., more preferably equal to or higher than 350° C., most preferably equal to or higher than 400° C. for 5 to 120 minutes, more preferably for 15 minutes to 60 minutes.

With a heating temperature lower than 300° C. (in particular, a heating temperature lower than 270° C.), thermal decomposition or burning of the organic components contained in the dried coating film (organic components contained in the organometallic compound, the organic binder, or others) normally tend to be insufficient, and these organic components are left in the metal oxide film to prevent the occurrence of crystallization of the metal oxide and also make densification of the film insufficient, thereby possibly degrading transparency and conductivity of the film. Therefore, this is not preferable. However, in the case of a long heating process time, for example, approximately 60 minutes, or in the case of a thin film thickness of the final metal oxide film, such as equal to or smaller than approximately 130 nm, thermal decomposition or burning of the organic components proceeds even at a temperature of, for example, approximately 270° C. Therefore, there may be the case in which transparency and conductivity of the film may not be degraded. Therefore, while a heating temperature equal to or higher than 300° C. is generally preferable, a heating temperature of approximately 270° C. can be applied, depending on the conditions of each process (and the film thickness, the heating processing time, and others).

Also, while the upper limit of the heating temperature is not particularly restrictive, the upper limit is influenced by the type of the heating apparatus for use in the heating process and heat resistance of the substrate. In the case of a soda lime glass substrate, which is inexpensive and most generally used, the strain point is approximately 510° C., and therefore the heating treatment is preferably performed at a temperature lower than that temperature. However, if the heating treatment is performed on a heat-resistant substrate with a heat resistance higher than that of the soda lime glass substrate, distortion of the substrate can be relatively made small, and therefore the heating treatment at approximately 600° C. can also be performed. As a matter of course, when a glass substrate with a higher resistance such as a quartz glass substrate, non-alkali glass, or high-strain-point glass substrate is used, a further higher heating temperature can be applied.

Note that when a polyimide (PI) film, which is a heat-resistant plastic, is used as a substrate, the heating treatment can be performed up to approximately 400° C., although depending on the type of polyimide.

Examples of the heating apparatus for use in the heating process include a hot plate, a hot-air circulation heating furnace, a far-infrared heating apparatus, and others, but the heating apparatus is not restricted to these. However, to carry out the present invention, it is required to use the oxygen-containing atmosphere having a dew-point temperature equal to or lower than −10° C., and therefore the heating apparatus is desired to be able to control the heating process atmosphere.

Note that the temperature elevation rate to the temperature or higher at which crystallization of the metal oxide in the course of elevation of temperature in the heating process is not particularly restrictive, but is in a range of 5° C./min to 40° C./min, more generally 10° C./min to 30° C./min. If the temperature elevation rate is slower than 5° C./min, it takes too long to increase the temperature to degrade efficiency. On the other hand, if the temperature elevation rate exceeding 40° C./min is tried to be achieved in the heating apparatus described above, the heater capacity is too large, which is impractical.

Also, regarding process conditions of the heating treatment under the oxygen-containing atmosphere having a dew-point temperature equal to or higher than 0° C. described above, as with normal process conditions of the heating treatment under the oxygen-containing atmosphere having a dew-point temperature equal to or lower than −10° C. to increase the temperature to a temperature or higher at which crystallization of the metal oxide occurs (normally 300° C. to 330° C.), the process is performed at a heating temperature equal to or higher than 300° C., more preferably equal to or higher than 350° C., further preferably equal to or higher than 400° C., for 5 minutes to 120 minutes, more preferably 15 minutes to 60 minutes.

At a heating temperature lower than 300° C. (in particular, at a heating temperature lower than 270° C.), as with the description above, the effect of promoting crystallization of the metal oxide fine particles normally tends to be insufficient, and a significant improvement in conductivity and film strength cannot be expected. Therefore, this is not preferable.

When the metal oxide film is applied to a transparent conductive film, subsequently to the heating treatment under the oxygen-containing atmosphere described above, if a heating treatment under a neutral atmosphere or a reducing atmosphere is performed, depending on the type of the metal oxide, oxygen vacancies are formed in metal oxide fine particles to increase carrier concentration, thereby improving conductivity of the metal oxide film. Therefore, this is preferable.

Note that in this heating treatment under a neutral atmosphere or a reducing atmosphere, the oxygen vacancies formed in the film make complement elements (such as metal elements and oxygen) of the metal oxide fine particles easily diffuse, thereby achieving a promoting effect stronger than promotion of crystal growth of the metal oxide fine particles with the heating treatment under the oxygen-containing atmosphere having a dew-point temperature equal to or higher than 0° C. Thus, this is effective in view of not only improving conductivity of the metal oxide film as described above but also stabilizing conductivity (suppressing conductivity changes with time), and therefore is preferable.

This neutral atmosphere is formed of any one or more types of a nitrogen gas and an inert gas (such as argon or helium), and the reducing atmosphere is a hydrogen gas atmosphere or an atmosphere containing at least one or more types of hydrogen or organic solvent vapor (organic gas such as methanol) in the neutral atmosphere. However, these are not restrictive, and any atmosphere can be used as long as it can deprive oxygen atoms from the metal oxide fine particles with which the film is densely packed to form oxygen vacancies to increase conductive carrier concentration.

If the heating temperature is approximately 250° C. to 600° C., a mixture gas of 1% to 2% hydrogen-99% to 98% nitrogen has no possibility of explosion even if leaking to the air, and therefore is a preferable atmosphere.

Process conditions of the heating treatment under the neutral atmosphere or the reducing atmosphere have a heating temperature equal to or higher than 250° C., more preferably equal to or higher than 350° C., for 5 minutes to 120 minutes, more preferably 15 minutes to 60 minutes. Note that in view of further promoting crystal growth of the metal oxide fine particles described above, the heating temperature is desirably equal to or higher than 350° C., further preferably equal to or higher than 450° C.

If the heating temperature is lower than 250° C., oxygen vacancies are not sufficiently formed in the metal oxide fine particles, and an improvement in conductivity of the metal oxide film due to an increase in carrier concentration cannot be expected. Therefore, this is not preferable when the metal oxide film is applied to a transparent conductive film.

Also, while the upper limit of the heating temperature is not particularly restrictive, the upper limit is influenced by the type of the heating apparatus for use in the heating process and heat resistance of the substrate, which is similar to the case of the heating treatment under the oxygen-containing atmosphere. Furthermore, in the heating treatment under the reducing atmosphere, if the heating temperature is too high, attention is required because the metal oxide configuring the metal oxide film is excessively reduced. For example, in the case of a heating temperature exceeding 600° C., if a reducing atmosphere having strong reducing properties such as hydrogen gas is used, the metal oxide may be reduced to metal elements within a short time, depending on the type of the metal oxide. Therefore, it is required to select an appropriate reducing atmosphere and set an appropriate reducing time.

Note that the heating treatment of elevating the temperature up to a temperature or higher at which crystallization of the metal oxide occurs under the oxygen-containing atmosphere having a dew-point temperature equal to or lower than −10° C., the heating treatment under the oxygen-containing atmosphere having a dew-point temperature equal to or higher than 0° C., and the heating treatment under the neutral atmosphere or the reducing atmosphere can be successively performed. That is, in the process of heating the substrate having the dried coating film formed thereon, for example, after the temperature of the substrate is increased to a heating temperature equal to or higher than 300° C., with the temperature being kept, only the atmosphere can be changed from the oxygen-containing atmosphere having a dew-point temperature equal to or lower than −10° C. to the oxygen-containing atmosphere having a dew-point temperature equal to or higher than 0° C., or the neutral atmosphere or the reducing atmosphere.

As described above, the heating treatment under the neutral atmosphere or the reducing atmosphere has the above-described function of forming oxygen vacancies in the metal oxide to increase carrier concentration and also a function of making the component elements of the metal oxide film easily move with the presence of the oxygen vacancies to promote crystal growth, thereby contributing to more improvement in strength and conductivity of the metal oxide film.

Next, a thin-film transistor element to which the metal oxide film of the present invention is applied is described.

An example of the thin-film transistor element (TFT element) is a field-effect transistor element having a coplanar-type structure or a staggered-type structure. In either structure, although details are omitted, the element is provided with a source/drain electrode, a gate insulating film, a channel active layer, and a gate electrode on a substrate.

The thin-film transistor element is used as a driver element in displays such as a liquid-crystal display of an active matrix type and an electroluminescent display, which will be described further below, and in an image sensor.

So far, in general, as a gate insulating film of a thin-film transistor element, silicon dioxide (SiO2: relative permittivity $\epsilon=3.9$), which forms a silicon oxide film, has been widely used. However, with rapid advance of microfabrication of elements, due to a low relative permittivity of silicon oxide, making the gate insulating film thinner by microfabrication of elements has a limitation (an increase in gate leak current due to tunnel current). Thus, an attempt has been performed in which a metal oxide with high permittivity capable of driving the element even the gate insulating film is thickened is applied to the gate insulating film. Examples of the metal oxide with high permittivity include a hafnium oxide (HfO2: a relative permittivity ϵ=approximately 30), zirconium oxide (ZrO2: relative permittivity ϵ=approximately 25), and others.

To form the metal oxide film with high permittivity, a method such as Metal-Organic Chemical Vapor Deposition (MOCVD) or Atomic Layer Deposition is generally used.

Since the metal oxide film obtained in the present invention has a metal oxide fine-particle layer extremely densely packed with metal oxide fine particles having a metal oxide as a main component, a high-quality metal oxide film with high permittivity applicable to, for example, a gate insulating film of a thin-film transistor, can be formed by heating at a low temperature, for example, lower than 300° C.

Next, according to the present invention, a device which applies the metal oxide film and a substrate with the metal oxide film thereto, when the metal oxide film is used as a transparent conductive film, will be described.

Examples of this device include light-emitting devices such as an LED element, an electroluminescent lamp (an electroluminescent element), and a field emission lamp; electric power generating devices such as a solar cell; display devices such as a liquid-crystal display (a liquid-crystal element), an electroluminescent display (an electroluminescent element), a plasma display, an electronic paper element, and an electrochromic element; and input devices such as a touch panel. The metal oxide film and the substrate with the metal oxide film of the present invention are suitable for these transparent electrodes.

Several devices are described below.

Here, the electroluminescent elements described above as light-emitting devices include an organic EL element using an organic light-emitting material and an inorganic EL element using an inorganic light-emitting material. In recent years, the organic EL element has attracted attention.

This organic EL element is a self-emitting element, unlike a liquid-crystal display element, and high luminance can be obtained with low voltage driving, and therefore is expected as a display apparatus such as a display. The organic EL element is classified into a low-molecular type and a high-molecular type. An example of structure of the high-molecular type is such that a positive-hole injection layer formed of a conductive polymer such as a polythiophene derivative (hole injection layer), an organic light-emitting layer (a polymer light-emitting layer formed by coating), a cathode electrode layer [a metal layer with excellent electron injectability to the light-emitting layer and low work function, such as magnesium (Mg), calcium (Ca), or aluminum (Al)], and then a gas barrier coating layer (or a process of sealing with a metal or glass) are sequentially formed on a metal oxide film as an anode electrode layer. The gas barrier coating layer described above is required to prevent degradation of the organic EL element, and oxygen barrier and water vapor barrier are desired. For example, as for water vapor, extremely high barrier performance with a water vapor transmission rate being approximately equal to or lower than $10^{-5}$ g/m²/day is required, and the inside of the organic EL element (device) is configured to be completely sealed from outside.

Note that, for the transparent conductive film as a transparent electrode of the organic EL element and the positive-hole injection layer (the hole injection layer), high film flatness (for example, center line average roughness (Ra: Roughness average) is equal to or smaller than 3 nm and the maximum height (Rmax: Roughness maximum) is equal to or smaller than 30 nm) is desired. The metal oxide film obtained in the preset invention is formed in the manner such that an extremely flat liquid surface of the coating liquid for forming metal oxide film applied onto the substrate becomes a surface of the dried coating film and then eventually becomes a surface of an inorganic film. Also, the heating process is performed under an air atmosphere having a low dew-point temperature, that is, with a small water vapor content, to densify the inorganic film described above and suppress formation of asperities on the surface. Therefore, the metal oxide film has an extremely high film flatness (for example, center line average roughness Ra=0.5 nm to 2.0 nm and the maximum height Rmax=5 nm to 30 nm), and is suitable for its transparent conductive film and positive-hole injection layer (the hole injection layer).

Furthermore, as described above, the metal oxide film to be applied as a transparent conductive film or a positive-hole injection layer (a hole injection layer), which is an anode electrode layer of the organic EL element, requires a high work function equal to or higher than approximately 5 eV so as to facilitate injection of positive holes (holes) to a positive-hole (hole) transfer (in some cases, directly to a light-emitting layer) and achieve low-voltage driving, an improvement in luminous efficiency, and long life of the organic EL element.

Here, examples of the metal oxide film suitable for a positive-hole injection layer (a hole injection layer) include, since a high work efficiency is required to show excellent hole injectability, a vanadium oxide film, a niobium oxide film, a molybdenum oxide film, a ruthenium oxide film, and others having a large work function equal to or larger than 5 eV (electron volts).

The solar cell as an electric power generating device is an electric power generating element that converts sunbeams to electric energy. Examples of the solar cell include a silicon solar cell (of a thin film type, a fine crystal type, and a crystal type), a CIS solar cell (a copper-indium-selenium thin film), a CIGS solar cell (a copper-indium-gallium-selenium thin film), and a dye-sensitized solar cell. For example, in the silicon solar cell, a transparent electrode, a semiconductor electric power generating layer (silicon), and then a metal electrode are sequentially formed on a transparent substrate.

The liquid-crystal element as a display device is an electronic display element of a non-light-emitting type widely used in displays of portable phones, PDAs (Personal Digital Assistants), PCs (Personal Computers), and others, and is classified into a simple matrix type (a passive matrix type) and an active matrix type. In view of image quality and response speed, the active matrix type is superior. The basic structure is such that a liquid crystal is interposed between transparent electrodes (each corresponding to the metal oxide film of the present invention), and liquid-crystal molecules are oriented by voltage driving for display. In an actual element, in addition to the transparent electrodes, a color filter, a retardation film, a polarizing film, and others are further laminated for use.

Also, liquid-crystal elements of another type also include a polymer dispersed liquid crystal element (hereinafter abbreviated as a PDLC element) used for an optical shutter such as a window or others and a polymer network liquid crystal element (hereinafter abbreviated as a PNLC element). In either liquid crystal, the basic structure is as described above, such that a liquid crystal layer is interposed between electrodes (at least one is a transparent electrode, which corresponds to the metal oxide film of the present invention), and liquid-crystal molecules are oriented by voltage driving for display to cause a change in appearance of the liquid-crystal layer as transparent/opaque. Unlike the liquid-crystal display element described above, however, there is a feature in which no retardation film or polarizing film is required in an actual element, thereby simplifying the element structure.

Meanwhile, the PDLC element adopts a structure in which liquid crystal microcapsulated in a polymer resin matrix is dispersed, and the PNLC element adopts a structure in which a netted portion of a resin netted network is packed with liquid crystal. In general, the PDLC element has a high resin content ratio in the liquid-crystal layer, and therefore an alternating current driving voltage equal to or higher than several tens of volts (for example, on the order of 80 V) is required. By contrast, the PNLC element, where the resin content ratio of the liquid-crystal layer can be low, has a feature in which it can be driven with an alternating current on the order of several V to 15 V.

Note that, to ensure display stability of the liquid-crystal element described above, it is required to prevent water vapor from being mixed into the liquid crystal. For example, the water vapor transmission rate is required to be equal to or lower than 0.01 g/m$^2$/day, and the inside of the liquid-crystal element (device) is configured to be completely sealed from outside.

The electronic paper element as a display device is an electronic display element of a non-light-emitting type, which does not emit light by itself, includes a memory effect in which a display is left as it is even if powered off, and is expected to be as a display for character display.

Examples of this display type that have been developed include an electrophoretic type in which coloring particles are moved in liquid between electrodes by electrophoresis; a twist ball type in which dichroic particles are rotated in an electric field for coloring; a liquid crystal type in which, for example, cholesteric liquid crystal is interposed between transparent electrodes for display; a powder base type in which coloring particles (toner) or electronic liquid powder (Quick Response Liquid Powder) are moved in the air for display; an electrochromic type in which coloring is performed based on electrochemical oxidation and reduction; and an electrodeposition type in which a metal is precipitated and dissolved by electrochemical oxidation and reduction and accompanying changes in color are used for display. In any of these types, the structure is such that a display layer is interposed between a metal oxide film (a transparent electrode) and a counter electrode.

Note that, to ensure display stability in the electronic paper elements of these various types, it is required to prevent water vapor from being mixed into the display layer. Although it depends on the type, for example, the water vapor transmission rate is required to be equal to or lower than 0.01 g/m$^2$/day to 0.1 g/m$^2$/day, and the inside of the electronic paper element (device) is configured to be completely sealed from outside.

The electrochromic element as a display device is a display element using an electrochromic material in which light absorption of a substance is reversibly changed with an electrochemical oxidation-reduction reaction, and normally has a structure in which a thin film made of the electrochromic material and an electrolytic solution (or a solid electrolyte) are interposed between two electrodes (at least one electrode is a transparent electrode or a translucent electrode) facing each other.

Examples of the electrochromic material for use include, as inorganic-base materials, metal oxides such as tungsten oxide (WO3), molybdenum oxide (MoO3), and vanadium oxide (VO2.5) and, as organic-base materials, low molecular materials such as a viologen derivative, a carbazole derivative, a styryl-based compound, and metal complexes (phthalocyanine, phenanthroline, Prussian blue, and a bipyridine complex); a high molecular material to which any of the low molecular materials is introduced; and furthermore, conductive polymers (polypyrrole, polythiophene, and polyaniline).

In this electrochromic element, a voltage is applied between the facing electrodes, and the color of the thin film of the electrochromic material described above in contact with the electrolytic solution (or the solid electrolyte) is developed or discharged by electrochemical oxidation-reduction reaction for image display. Therefore, the electrochromic element has a feature in which clear display with a low driving voltage and without view angle dependence even under external light can be obtained.

The touch panel is a position input element, and there are a resistive type, a capacitive type, and others.

For example, the resistive type touch panel has a structure in which two substrates with the metal oxide films as coordinate-detection resistive films for detecting coordinates are laminated together via a dotted transparent spacer. In the substrates with the metal oxide films, hitting durability is required. In the metal oxide film, flexibility without causing a crack is demanded. Also, in the capacitive type, with an increased resolution, a further improvement in conductivity of the metal oxide film is demanded.

In any of the light-emitting device, the electric power generating device, the display device, the input device, and others described above, an improvement in device characteristics is demanded. By applying the metal oxide film and the substrate with the metal oxide film according to the present invention to a transparent electrode of these devices, the basic device characteristics can be further improved, and therefore, such application can significantly contribute to, for example, energy saving and size reduction of the device and others.

The present invention is described in detail below by using examples, but the present invention is not meant to be restricted to these examples. Note that "%" of hydrogen-nitrogen mixed gas indicates "volume %".

EXAMPLE 1

[Formulation of Coating Liquid]

10 g of hafnium-n-butoxide (liquid at room temperature) [Hf(OC4H9)4](molecular weight=470.95), 14 g of N-methyl-2-pyrrolidone (NMP), 25 g of diethylene glycol monoethyl ether (ethyl carbitol), and 1 g of hydroxypropylcellulose (HPC; low molecular weight type) were mixed together, heated to 120° C., and agitated for 60 minutes for dissolution. Next, 50 g of the obtained solution, 43 g of ethyl alcohol (EA), and 7 g of isopropyl alcohol (IPA) were mixed together and agitated well until they became uniform, thereby formulating a coating liquid for forming metal oxide film containing 10 weight % of hafnium-n-butoxide and 1 weight % of hydroxypropylcellulose. The viscosity of this coating liquid for forming metal oxide film (25° C.) was approximately 10 mPa·s.

[Fabrication of Metal Oxide Film]

Figure 2:
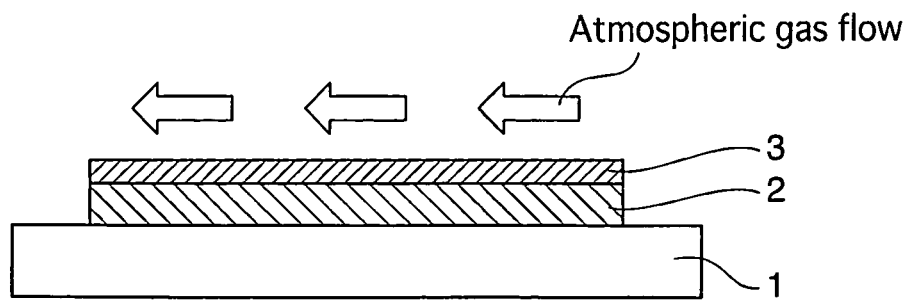
FIG. 2 is a schematic view showing an example of a heating process in a manufacturing process of a metal oxide film with a coating method according to the present invention.

After spin coating (500 rpm×30 sec) was performed with the formulated coating liquid for forming metal oxide film on an entire surface of a soda lime glass substrate (10 cm×10 cm×thickness of 3 mm; haze value=0.26%; visible light transmittance=91.1%; and refractive index=1.53) at 25° C., the surface was dried at 150° C. for 10 minutes by using a hot-air dryer. As depicted in a schematic view of FIG. 2, a hot plate was further used to increase the temperature to 500° C. for 50 minutes (temperature elevation rate: 10° C./minute) in a low-humidity air atmosphere having a dew-point temperature of −50° C. (3 litters/minute supply and the average velocity of flow of the atmospheric gas over the substrate was approximately 0.045 m/second). The heating treatment was then performed at 500° C. for minutes. The atmosphere was then switched as it was to 1% hydrogen-99% nitrogen (3 litters/minute supply and the average velocity of flow of the atmospheric gas over the substrate was approximately 0.045 m/second), and the heating treatment was further performed at 500° C. for 15 minutes, thereby fabricating a metal oxide film according to Example 1 having hafnium oxide ($HfO_2$) as a main component.

[Evaluation of Characteristics]

Figure 3:
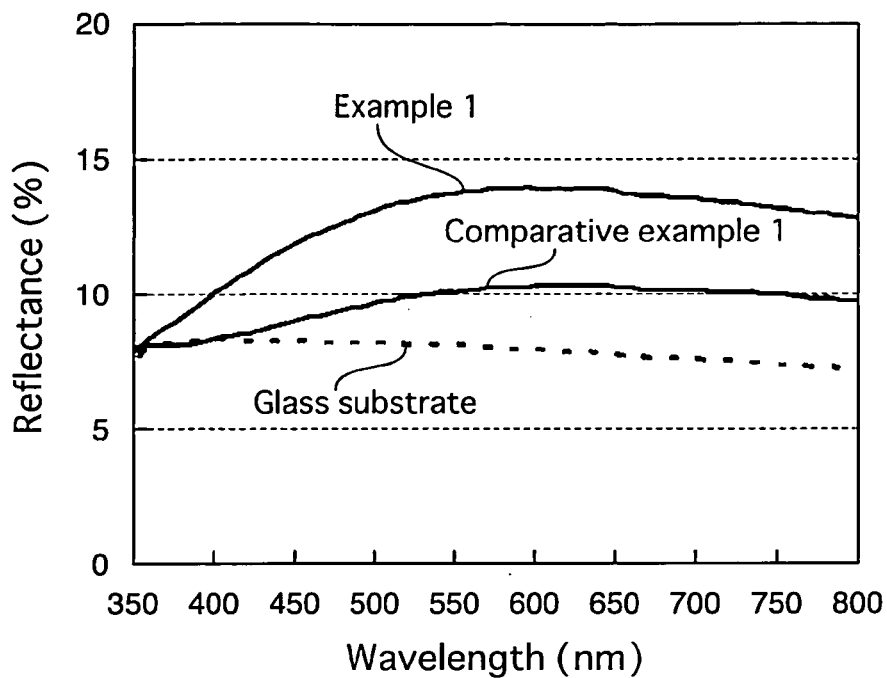
FIG. 3 is a drawing that shows reflection profiles of metal oxide films according to Example 1 and Comparative Example 1.

Next, various characteristics including surface resistivity, haze value, visible light transmittance, film thickness, specific resistance, crystallite size, and pencil hardness of the fabricated metal oxide film were measured, and the results are shown in Table 1. Also, a reflection profile of the obtained metal oxide film according to Example 1 is depicted in FIG. 3, together with a reflection profile of a metal oxide film of Comparative Example 1.

Figure 4:
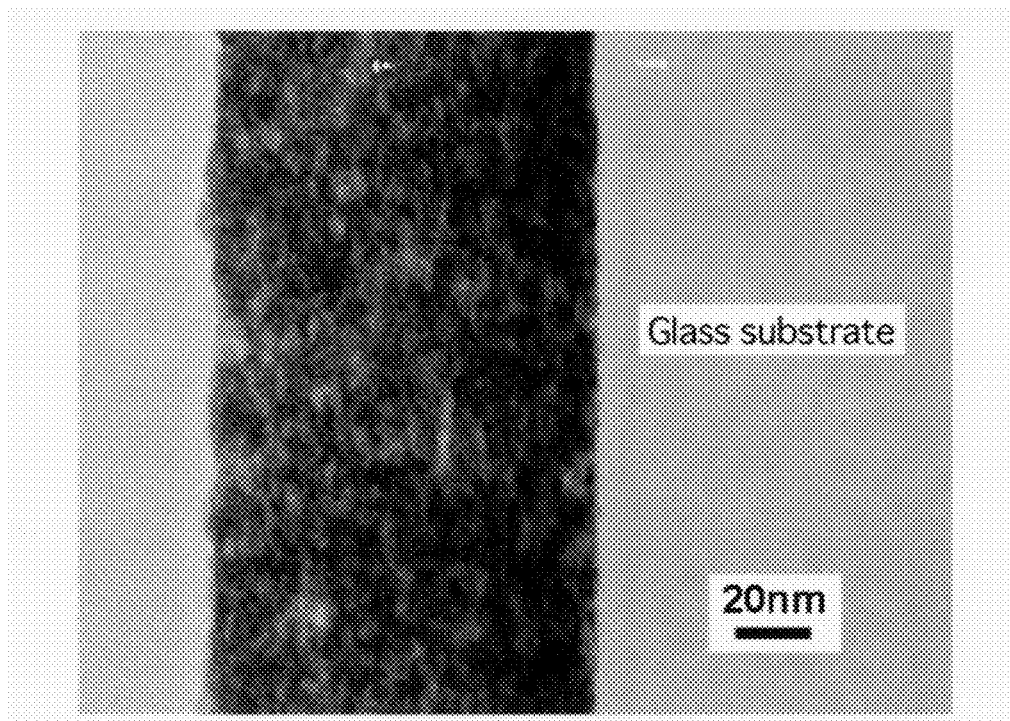
FIG. 4 shows a transmission electron microscope photograph (a TEM image) of a section of the metal oxide film according to Example 1.

Furthermore, a transmission electron microscope photograph (a TEM image) of a cross section of the metal oxide film of Example 1 observed with a transmission electron microscope is shown in FIG. 4. From the results of X-ray diffraction measurement, it has been observed that the metal oxide film described above is an amorphous film and has a metal oxide fine-particle layer densely packed mainly with metal oxide fine particles (amorphous microcrystals) equal to or smaller than 3 nm.

The surface resistivity of the metal oxide film was measured by using a surface resistivity meter Loresta AP (MCP-T400) manufactured by Mitsubishi Chemical Corporation.

The haze value and the visible light transmittance were measured by using a haze meter (NDH 5000) manufactured by Nippon Denshoku Industries Co., Ltd., based on JIS K 7136 (haze value) and JIS K 7361-1 (transmittance).

The film thickness was measured by using a stylus-type film thickness meter (Alpha-Step IQ) manufactured by KLA-Tencor Corporation.

The crystallite size was found by performing an X-ray diffraction measurement, and was found by the Scherrer method.

The pencil hardness was measured based on JIS K 5400.

The reflection profile of the metal oxide film was measured by using a spectrophotometer (U-4000) manufactured by Hitachi, Ltd.

Note that the visible light transmittance and the haze value are values only for the metal oxide film, and they were found from Equation 1 and Equation 2, respectively, below.

$$\text{Transmittance of a metal oxide film (\%)} = \frac{\text{Transmittance of a substrate together with the metal oxide film formed thereon}}{\text{Transmittance of only the substrate}} \times 100 \quad \text{[Equation 1]}$$

$$\text{Haze value (\%) of a metal oxide film} = \text{Haze value of a substrate together with the metal oxide film formed thereon} - \text{Haze value of only the substrate} \quad \text{[Equation 2]}$$

EXAMPLE 2

[Formulation of Coating Liquid]

10 g of niobium-n-butoxide (liquid at room temperature) [$Nb(C_4H_9O)_5$](molecular weight=458.12), 14 g of N-methyl-2-pyrrolidone (NMP), 25 g of diethylene glycol monoethyl ether (ethyl carbitol), and 1 g of hydroxypropylcellulose (HPC; low molecular weight type) were mixed together, heated to 120° C., and agitated for 60 minutes for dissolution. Next, 50 g of the obtained solution, 43 g of ethyl alcohol (EA), and 7 g of isopropyl alcohol (IPA) were mixed together and agitated well until they became uniform, thereby formulating a coating liquid for forming metal oxide film containing 10 weight % of niobium-n-butoxide and 1 weight % of hydroxypropylcellulose. The viscosity of this coating liquid for forming metal oxide film (25° C.) was approximately 10 mPa·s.

After spin coating (500 rpm×30 sec) was performed with the formulated coating liquid for forming metal oxide film on an entire surface of a soda lime glass substrate (10 cm×10 cm×thickness of 3 mm; haze value=0.26%; visible light transmittance=91.1%; and refractive index=1.53) at 25° C., the surface was dried at 150° C. for 10 minutes by using a hot-air dryer. As depicted in the schematic view of FIG. 2, a hot plate was further used to increase the temperature to 500° C. for 50 minutes (temperature elevation rate: 10° C./minute) in a low-humidity air atmosphere having a dew-point temperature of −50° C. (3 litters/minute supply and the average velocity of flow of the atmospheric gas over the substrate was approximately 0.045 m/second). The heating treatment was then performed at 500° C. for fifteen minutes, thereby fabricating a metal oxide film according to Example 2 having niobium oxide ($NbO_{2.5}$) as a main component.

Figure 5:
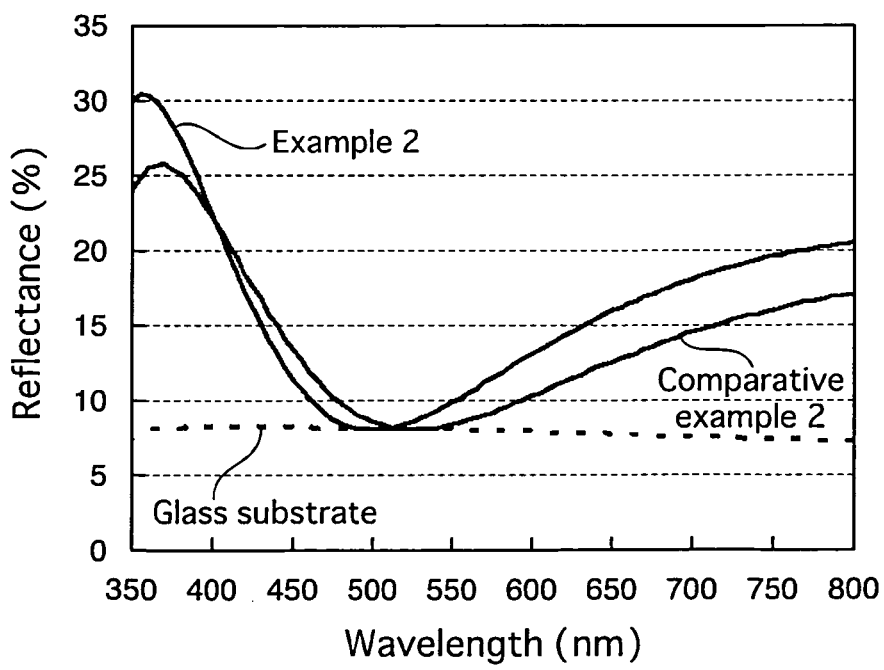
FIG. 5 is a drawing that shows reflection profiles of metal oxide films according to Example 2 and Comparative Example 2.

Various characteristics of the fabricated metal oxide film were measured in a manner similar to that of Example 1, and the results are shown in Table 1. Also, a reflection profile of the obtained metal oxide film according to Example 2 is depicted in FIG. 5, together with a reflection profile of a metal oxide film of Comparative Example 2.

Figure 6:
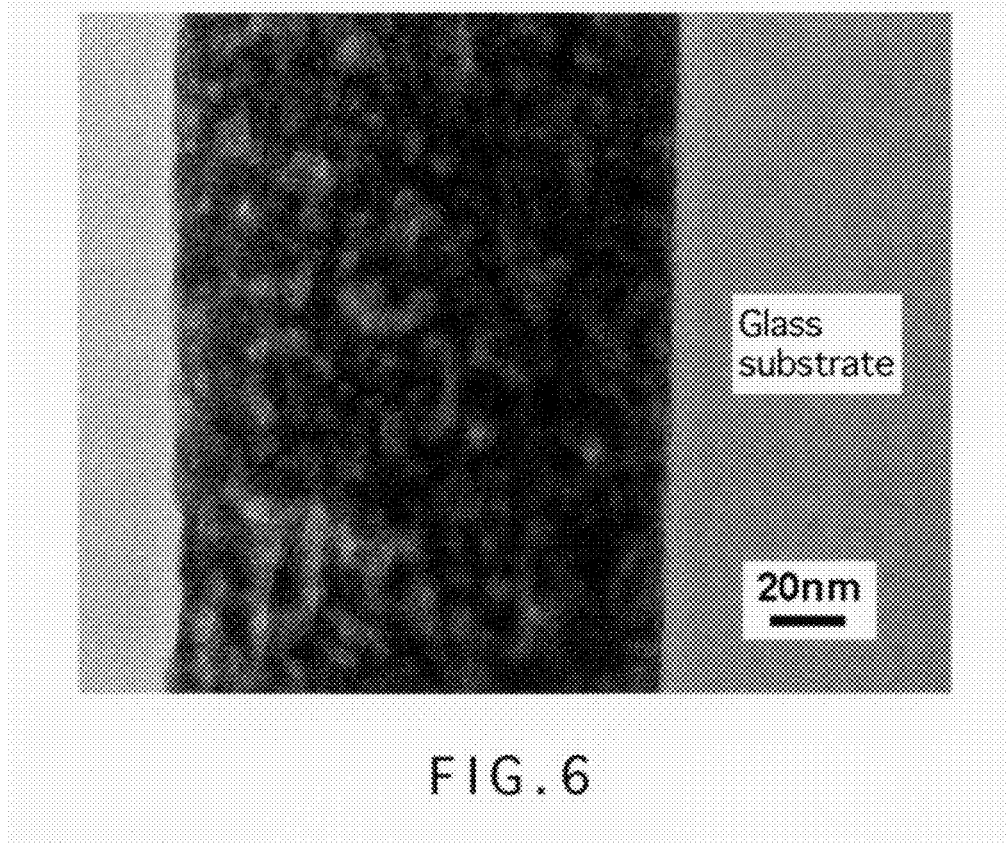
FIG. 6 shows a transmission electron microscope photograph (a TEM image) of a section of the metal oxide film according to Example 2.

Furthermore, a transmission electron microscope photograph (a TEM image) of a cross section of the metal oxide film of Example 2 observed with a transmission electron microscope is shown in FIG. 6. From the results of X-ray diffraction measurement, it has been observed that the metal oxide film described above is an amorphous film and has a metal oxide fine-particle layer densely packed mainly with metal oxide fine particles (amorphous microcrystals) equal to or smaller than 3 nm.

EXAMPLE 3

[Formulation of Coating Liquid]

10 g of zirconium-n-butoxide (liquid at room temperature) [$Zr(C_4H_9O)_4$](molecular weight=383.68), 14 g of N-methyl-2-pyrrolidone (NMP), 25 g of diethylene glycol monoethyl ether (ethyl carbitol), and 1 g of hydroxypropylcellulose (HPC; low molecular weight type) were mixed together, heated to 120° C., and agitated for 60 minutes for dissolution. Next, 50 g of the obtained solution, 43 g of ethyl alcohol (EA), and 7 g of isopropyl alcohol (IPA) were mixed together and agitated well until they became uniform, thereby formulating a coating liquid for forming metal oxide film containing 10 weight % of zirconium-n-butoxide and 1 weight % of hydroxypropylcellulose. The viscosity of this coating liquid for forming metal oxide film (25° C.) was approximately 10 mPa·s.

The film was formed in a manner similar to that of Example 2 except that this coating liquid for forming metal oxide film was used, thereby fabricating a metal oxide film according to Example 3 having zirconium oxide ($ZrO_2$) as a main component.

Figure 7:
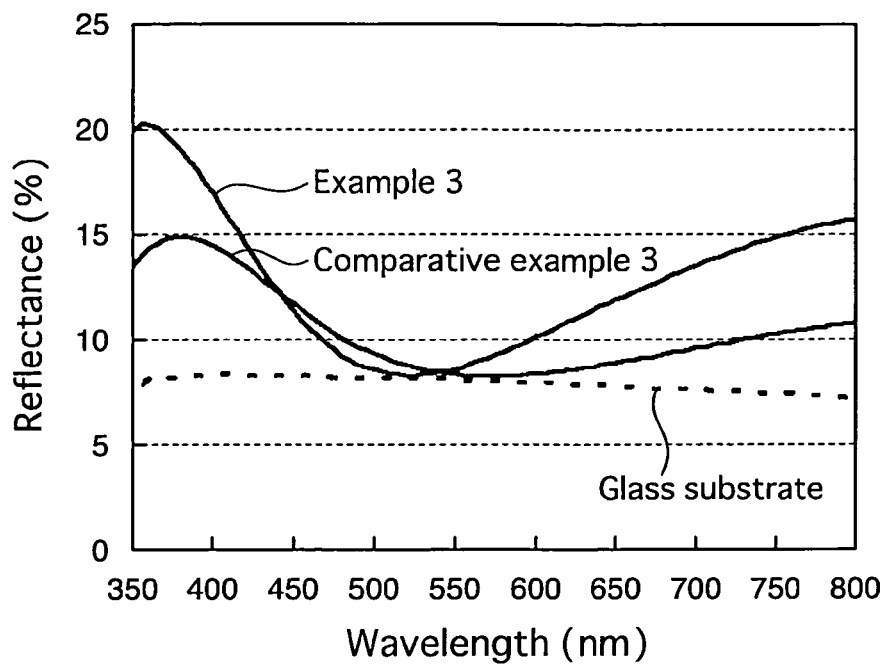
FIG. 7 is a drawing that shows reflection profiles of metal oxide films according to Example 3 and Comparative Example 3.

Various characteristics of the fabricated metal oxide film were measured in a manner similar to that of Example 1, and the results are shown in Table 1. Also, a reflection profile of the obtained metal oxide film according to Example 3 is depicted in FIG. 7, together with a reflection profile of a metal oxide film of Comparative Example 3.

Figure 8:
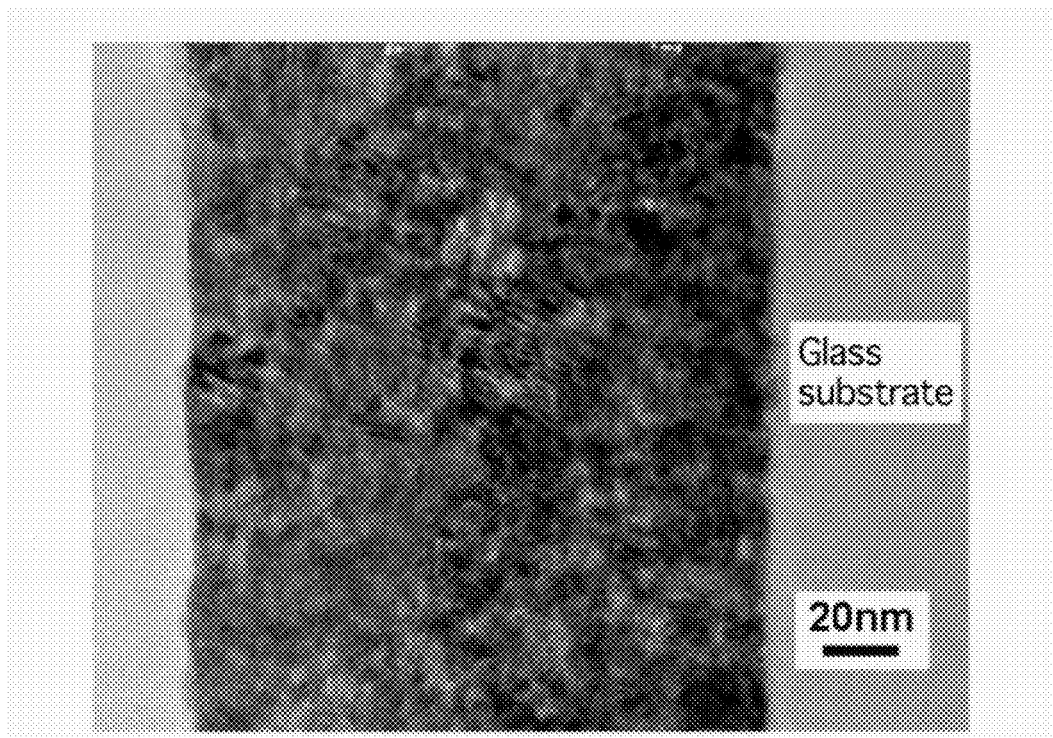
FIG. 8 shows a transmission electron microscope photograph (a TEM image) of a section of the metal oxide film according to Example 3.

Furthermore, a transmission electron microscope photograph (a TEM image) of a cross section of the metal oxide film of Example 3 observed with a transmission electron microscope is shown in FIG. 8. From the results of X-ray diffraction measurement, it has been observed that the metal oxide film described above is an amorphous film and has a metal oxide fine-particle layer densely packed mainly with metal oxide fine particles (amorphous microcrystals) equal to or smaller than 3 nm.

EXAMPLE 4

[Formulation of Coating Liquid]

10 g of titanium tetraisopropoxide (liquid at room temperature) [$Ti(C_3H_7O)_4$](molecular weight=284.25), 14 g of N-methyl-2-pyrrolidone (NMP), 75 g of diethylene glycol monoethyl ether (ethyl carbitol), and 1 g of hydroxypropylcellulose (HPC; low molecular weight type) were mixed together, heated to 120° C., and agitated for 60 minutes for dissolution, thereby formulating a coating liquid for forming metal oxide film containing 10 weight % of titanium tetraisopropoxide and 1 weight % of hydroxypropylcellulose. The viscosity of this coating liquid for forming metal oxide film (25° C.) was approximately 10 mPa·s.

The film was formed in a manner similar to that of Example 2 except that this coating liquid for forming metal oxide film was used, thereby fabricating a metal oxide film according to Example 4 having titanium oxide ($TiO_2$) as a main component.

Next, various characteristics of the fabricated metal oxide film were measured in a manner similar to that of Example 1, and the results are shown in Table 1.

Figure 9:
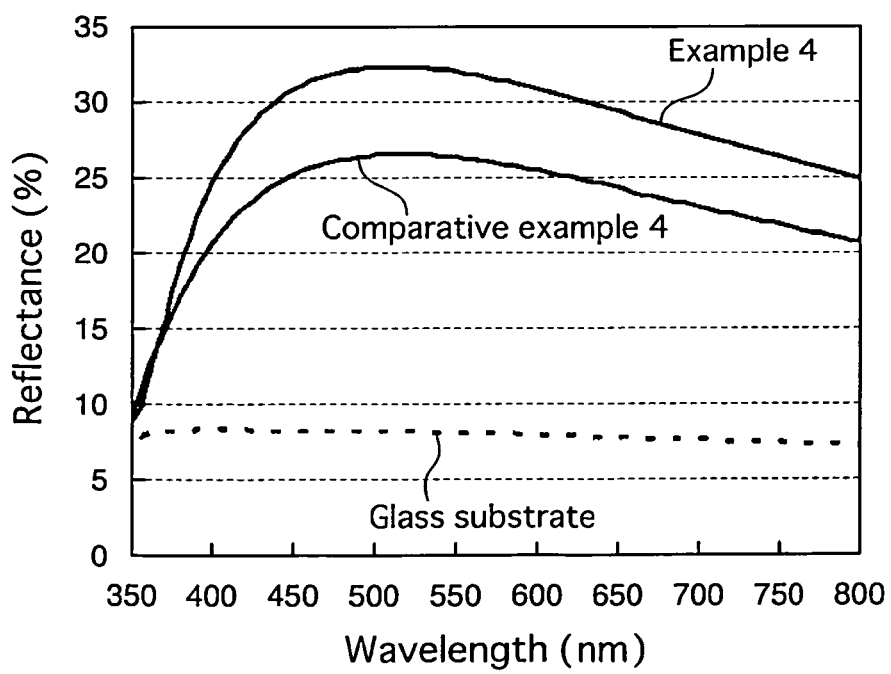
FIG. 9 is a drawing that shows reflection profiles of metal oxide films according to Example 4 and Comparative Example 4.

Also, a reflection profile of the obtained metal oxide film according to Example 4 is depicted in FIG. 9, together with a reflection profile of a metal oxide film of Comparative Example 4.

Figure 10:
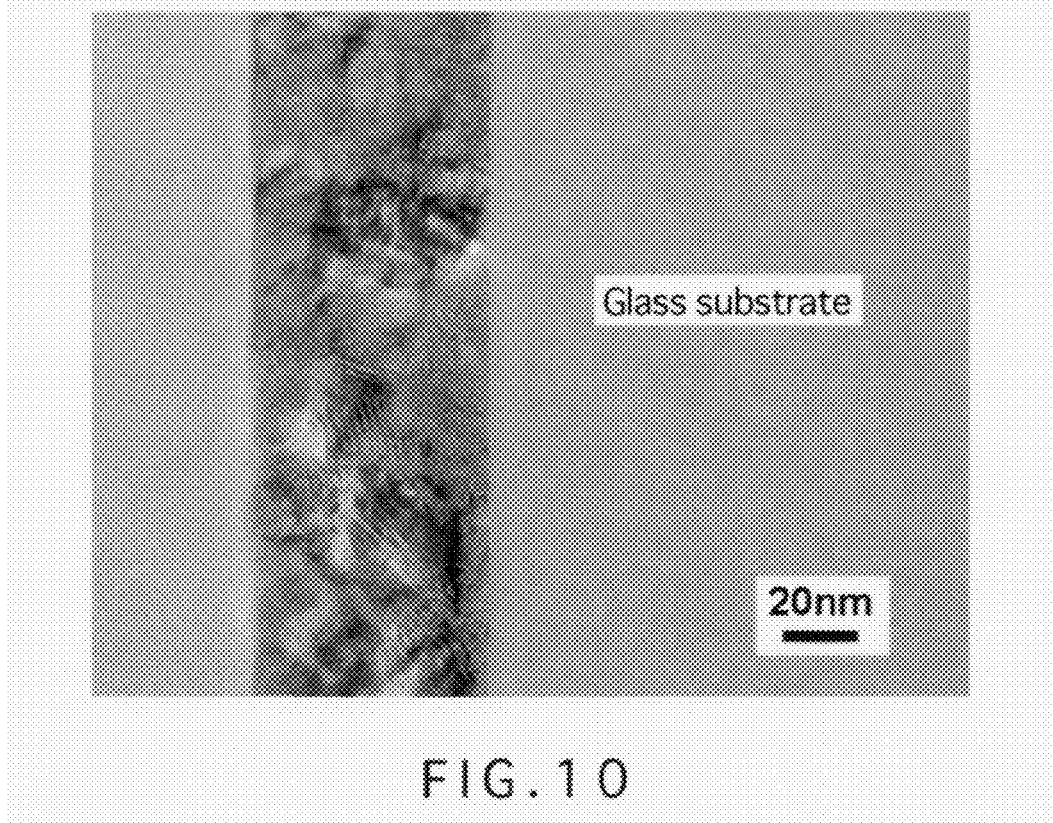
FIG. 10 shows a transmission electron microscope photograph (a TEM image) of a section of the metal oxide film according to Example 4.

Furthermore, a transmission electron microscope photograph (a TEM image) of a cross section of the metal oxide film of Example 4 observed with a transmission electron microscope is shown in FIG. 10. From the results of X-ray diffraction measurement, it has been observed that the metal oxide film described above is an amorphous film and has a metal oxide fine-particle layer densely packed mainly with metal oxide fine particles (amorphous microcrystals) equal to or smaller than 3 nm.

EXAMPLE 5

[Formulation of Coating Liquid]

10 g of aluminum acetylacetonate (solid at room temperature) (standard nomenclature: aluminum-2,4-pentanedionate) [$Al(C_5H_7O_2)_3$](molecular weight=324.31), 34.6 g of p-tert-butylphenol, 51.8 g of dibasic acid ester (manufactured by Du Pont Japan), and 3.6 g of hydroxypropylcellulose (HPC; high molecular weight type) were mixed together, heated to 120° C., and agitated for 60 minutes for dissolution until they became uniform, thereby formulating a coating liquid for forming metal oxide film containing 10 weight % of aluminum acetylacetonate and 3.6 weight % of hydroxypropylcellulose. The viscosity of this coating liquid for forming metal oxide film (25° C.) was approximately 15000 mPa·s.

[Fabrication of Metal Oxide Film]

After a pattern of a 4 cm×5 cm size of the formulated coating liquid for forming metal oxide film was printed by screen printing (polyester, 200 mesh plate) over a soda lime glass substrate (10 cm×10 cm×thickness of 3 mm; haze value=0.26%; visible light transmittance=91.1%; and refractive index=1.53) at 25° C., the surface was dried at 180° C. for 20 minutes by using a hot-air dryer. As depicted in the schematic view of FIG. 2, a hot plate was further used to increase the temperature to 500° C. for 50 minutes (temperature elevation rate: 10° C./minute) in a low-humidity air atmosphere having a dew-point temperature of −50° C. (3 litters/minute supply and the average velocity of flow of the atmospheric gas over the substrate was approximately 0.045 m/second). The heating treatment was then performed at 500° C. for minutes, thereby fabricating a metal oxide film according to Example 5 having aluminum oxide ($AlO_{1.5}$) as a main component.

Figure 11:
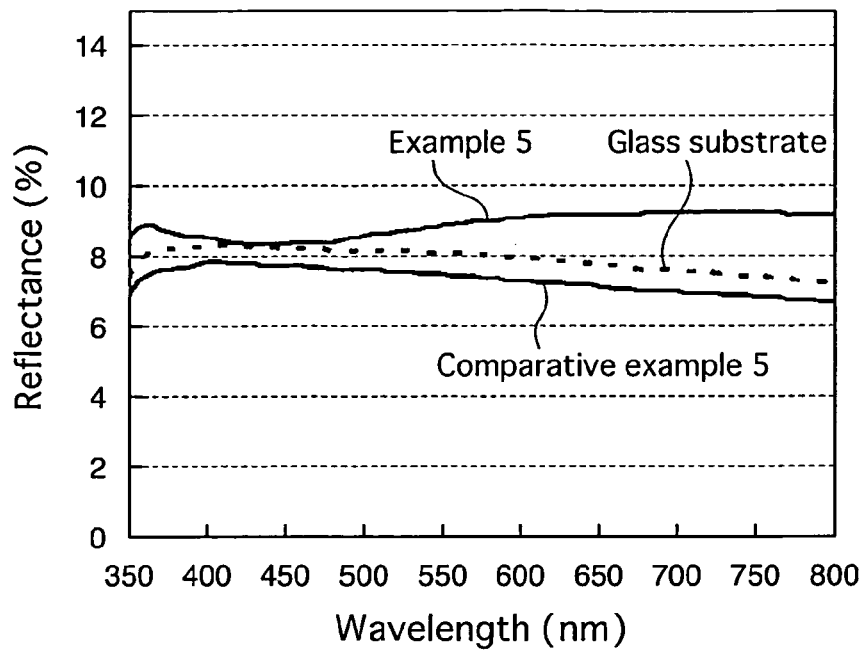
FIG. 11 is a drawing that shows reflection profiles of metal oxide films according to Example 5 and Comparative Example 5.

Next, various characteristics of the fabricated metal oxide film were measured in a manner similar to that of Example 1, and the results are shown in Table 1. Also, a reflection profile of the obtained metal oxide film according to Example 5 is depicted in FIG. 11, together with a reflection profile of a metal oxide film of Comparative From the results of X-ray diffraction measurement, it has been observed that the metal oxide film described above is an amorphous film. Furthermore, when a cross section of the metal oxide film of Example 5 was observed with a transmission electron microscope, a metal oxide fine-particle layer densely packed mainly with metal oxide fine particles (amorphous microcrystals) equal to or smaller than 3 nm has been observed.

EXAMPLE 6

[Formulation of Coating Liquid]

10 g of molybdenum acetylacetonate (solid at room temperature) (standard nomenclature: molybdenum(VI)oxide bis-2,4-pentanedionate [$MoO_2(C_5H_7O_2)_2$](molecular weight=326.17), 22.3 g of N-methyl-2-pyrrolidone (NMP), and 1 g of hydroxypropylcellulose (HPC; low molecular weight type) were mixed together, heated to 120° C., and agitated for 60 minutes for dissolution. Next, 50 g of the obtained solution, 25 g of cyclohexanone, 10 g of propylene glycol monomethyl ether (PGM), and 31.7 g of methyl ethyl ketone (MEK) were mixed together and agitated well until they became uniform, thereby formulating a coating liquid for forming metal oxide film containing 10 weight % of molybdenum acetylacetonate and 1 weight % of hydroxypropylcellulose. The viscosity of this coating liquid for forming metal oxide film (25° C.) was approximately 10 mPa·s.

[Fabrication of Metal Oxide Film]

After spin coating (1000 rpm×60 sec) was performed with the formulated coating liquid for forming metal oxide film on an entire surface of a non-alkali glass substrate (10 cm×10 cm×thickness of 0.7 mm; haze value=0.26%; visible light transmittance=91.2%; and refractive index=1.52) at 25° C., the surface was dried at 150° C. for 10 minutes by using a hot-air dryer. As depicted in the schematic view of FIG. 2, a hot plate was further used to increase the temperature to 350° C. for 35 minutes (temperature elevation rate: 10° C./minute) in a low-humidity air atmosphere having a dew-point temperature of −55° C. (3 litters/minute supply and the average velocity of flow of the atmospheric gas over the substrate was approximately 0.045 m/second). The heating treatment was then performed at 350° C. for 30 minutes, thereby fabricating a metal oxide film according to Example 6 having molybdenum oxide ($MoO_3$) as a main component.

Next, various characteristics of the fabricated metal oxide film were measured in a manner similar to that of Example 1, and the results are shown in Table 1.

Note that the flatness of the film surface of this metal oxide film was excellent with a center line average roughness (Ra) =2.6 nm and a maximum height (Rmax)=28 nm. Also, its work function was 5.4 eV.

From the results of X-ray diffraction measurement, it has been observed that the metal oxide film described above is an amorphous film. Furthermore, when a cross section of the metal oxide film of Example 6 was observed with a transmission electron microscope, a metal oxide fine-particle layer densely packed mainly with metal oxide fine particles (amorphous microcrystals) equal to or smaller than 3 nm has been observed.

EXAMPLE 7

[Formulation of Coating Liquid]

10 g of tungsten(V)ethoxide (liquid at room temperature) [$W(C_2H_5O)_5$](molecular weight=409.15), 16 g of p-tert-butylphenol, and 24 g of dibasic acid ester (manufactured by Du Pont Japan) were mixed together, heated to 120° C., and agitated for 60 minutes for dissolution. Next, 50 g of the obtained solution, 12 g of diethylene glycol monoethyl ether (ethyl carbitol), 32.3 g of ethyl alcohol (EA), and 5.7 g of isopropyl alcohol (IPA) were mixed together and agitated well until they became uniform, thereby formulating a coating liquid for forming metal oxide film containing 10 weight % of tungsten(V)ethoxide. The viscosity of this coating liquid for forming metal oxide film (25° C.) was approximately 5 mPa·s.

[Fabrication of Metal Oxide Film]

After spin coating (1000 rpm×60 sec) was performed with the formulated coating liquid for forming metal oxide film on an entire surface of a non-alkali glass substrate (10 cm×10 cm×thickness of 0.7 mm; haze value=0.26%; visible light transmittance=91.2%; and refractive index=1.52) at 25° C., the surface was dried at 150° C. for 10 minutes by using a hot-air dryer. As depicted in the schematic view of FIG. 2, a hot plate was further used to increase the temperature to 300° C. for 30 minutes (temperature elevation rate: 10° C./minute) in a low-humidity air atmosphere having a dew-point temperature of −55° C. (3 litters/minute supply and the average velocity of flow of the atmospheric gas over the substrate was approximately 0.045 m/second). The heating treatment was then performed at 300° C. for 60 minutes, thereby fabricating a metal oxide film according to Example 7 having tungsten oxide ($WO_3$) as a main component.

Next, various characteristics of the fabricated metal oxide film were measured in a manner similar to that of Example 1, and the results are shown in Table 1.

From the results of X-ray diffraction measurement, it has been observed that the metal oxide film described above is an amorphous film. Furthermore, when a cross section of the metal oxide film of Example 7 was observed with a transmission electron microscope, a metal oxide fine-particle layer densely packed mainly with metal oxide fine particles (amorphous microcrystals) equal to or smaller than 3 nm has been observed.

EXAMPLE 8

[Formulation of Coating Liquid]

40 g of titanium acetylacetonate (liquid at room temperature) (standard nomenclature: titanium(IV)-di-n-butoxide bis (2,4-pentanedionate) [$Ti(C_4H_9O)_2(C_5H_7O_2)_2$]) (molecular weight=392.32), 59 g of N-methyl-2-pyrrolidone (NMP), and 1 g of hydroxypropylcellulose (HPC; low molecular weight type) were mixed together, heated to 120° C., and agitated for 120 minutes for dissolution. Next, 25 g of the obtained solution, 25 g of cyclohexanone, 10 g of propylene glycol monomethyl ether (PGM), and 40 g of methyl ethyl ketone (MEK) were mixed together and agitated well until they became uniform, thereby formulating a coating liquid for forming metal oxide film containing 10 weight % of titanium acetylacetonate and 1 weight % of hydroxypropylcellulose. The viscosity of this coating liquid for forming metal oxide film (25° C.) was approximately 10 mPa·s.

[Fabrication of Metal Oxide Film]

After spin coating (1000 rpm×60 sec) was performed with the formulated coating liquid for forming metal oxide film on an entire surface of a non-alkali glass substrate (10 cm×10 cm×thickness of 0.7 mm; haze value=0.26%; visible light transmittance=91.2%; and refractive index=1.52) at 25° C., the surface was dried at 150° C. in the atmosphere for 10 minutes, thereby obtaining a dried coating film (film thickness: approximately 300 nm, surface resistivity: >1×10$^{13}$ Ω/sq (insulated)). The temperature of a substrate 2 having this dried coating film 3 was increased as depicted in a schematic view of FIG. 12 to 150° C. (temperature elevation rate: 30° C./minute) in the low-humidity air having a dew-point temperature of −55° C. In the state where 150° C. was kept while low-humidity air having a dew-point temperature of −55° C. was being supplied between an ultraviolet ray irradiation window 5 (a synthetic quartz plate having a thickness of 2 mm) and the substrate 2, a heating treatment was performed in which irradiation of heat energy rays from a low-pressure mercury lamp 4 for twenty minutes was performed to promote mineralization of the dried coating film 3 (decomposition or burning of organic components) and densification, thereby fabricating a metal oxide film (film thickness: 98 nm) according to Example 8 having titanium oxide ($TiO_2$) as a main component.

Note that the distance (irradiation distance) between the low-pressure mercury lamp 4 and the substrate 2 was 10.5 mm, illuminance of light of 254 nm was approximately 20 mW/cm$^2$, and estimated illuminance of light of 185 nm was approximately 5 mW/cm$^2$. Furthermore, a space between the substrate 2 and the ultraviolet ray irradiation window 5 was 3.5 mm, and the average velocity of flow of the atmospheric gas (low-humidity air having a dew-point temperature of −55° C.) flowing therebetween was approximately 0.29 m/sec).

Next, various characteristics of the fabricated metal oxide film were measured in a manner similar to that of Example 1, and the results are shown in Table 1.

From the results of X-ray diffraction measurement, it has been observed that the metal oxide film described above is an amorphous film. Furthermore, when a cross section of the metal oxide film of Example 8 was observed with a transmission electron microscope, a metal oxide fine-particle layer densely packed mainly with metal oxide fine particles (amorphous microcrystals) equal to or smaller than 3 nm has been observed.

EXAMPLE 9

[Formulation of Coating Liquid]

40 g of hafnium acetylacetonate (solid at room temperature) (standard nomenclature: hafnium(IV)-2,4-pentanedionate) [Hf($C_5H_7O_2$)$_4$](molecular weight=574.91), 59 g of N-methyl-2-pyrrolidone (NMP), and 1 g of hydroxypropylcellulose (HPC; low molecular weight type) were mixed together, heated to 120° C., and agitated for 120 minutes for dissolution. Next, 25 g of the obtained solution, 25 g of cyclohexanone, 10 g of propylene glycol monomethyl ether (PGM), and 40 g of methyl ethyl ketone (MEK) were mixed together and agitated well until they became uniform, thereby formulating a coating liquid for forming metal oxide film containing 10 weight % of hafnium acetylacetonate and 1 weight % of hydroxypropylcellulose. The viscosity of this coating liquid for forming metal oxide film (25° C.) was approximately 10 mPa·s.

[Fabrication of Metal Oxide Film]

After spin coating (500 rpm×60 sec) was performed with the formulated coating liquid for forming metal oxide film on an entire surface of a non-alkali glass substrate (10 cm×10 cm×thickness of 0.7 mm; haze value=0.26%; visible light transmittance=91.2%; and refractive index=1.52) at 25° C., the surface was dried at 150° C. in the atmosphere for 10 minutes, thereby obtaining a dried coating film (film thickness: approximately 470 nm, surface resistivity: >1×10$^{13}$ Ω/sq (insulated)). The temperature of the substrate 2 having this dried coating film 3 was increased as depicted in the schematic view of FIG. 12 to 150° C. (temperature elevation rate: 30° C./minute) in the low-humidity air having a dew-point temperature of −55° C. In the state where 150° C. was kept while low-humidity air having a dew-point temperature of −55° C. was being supplied between the ultraviolet ray irradiation window 5 (a synthetic quartz plate having a thickness of 2 mm) and the substrate 2, a heating treatment was performed in which irradiation of heat energy rays from the low-pressure mercury lamp 4 for 20 minutes was performed to promote mineralization of the dried coating film 3 (decomposition or burning of organic components) and densification, thereby fabricating a metal oxide film (film thickness: 87 nm) according to Example 9 having hafnium oxide (HfO$_2$) as a main component.

Note that the distance between (irradiation distance) the low-pressure mercury lamp 4 and the substrate 3 was 10.5 mm, illuminance of light of 254 nm was approximately 20 mW/cm$^2$, and estimated illuminance of light of 185 nm was approximately 5 mW/cm$^2$. Furthermore, a space between the substrate 2 and the ultraviolet ray irradiation window 5 was 3.5 mm, and the average velocity of flow of the atmospheric gas (low-humidity air having a dew-point temperature of −55° C.) flowing therebetween was approximately 0.29 m/sec).

Next, various characteristics of the fabricated metal oxide film were measured in a manner similar to that of Example 1, and the results are shown in Table 1.

From the results of X-ray diffraction measurement, it has been observed that the metal oxide film described above is an amorphous film. Furthermore, when a cross section of the metal oxide film of Example 9 was observed with a transmission electron microscope, a metal oxide fine-particle layer densely packed mainly with metal oxide fine particles (amorphous microcrystals) equal to or smaller than 3 nm has been observed.

EXAMPLE 10

[Formulation of Coating Liquid]

10 g of tantalum(V)-n-butoxide (liquid at room temperature) [Ta($C_4H_9O$)$_5$](molecular weight=543.53), 35.0 g of p-tert-butylphenol, 52.4 g of dibasic acid ester (manufactured by Du Pont Japan), and 2.6 g of hydroxypropylcellulose (HPC; high molecular weight type) were mixed together, heated to 120° C., and agitated for 60 minutes for dissolution. Next, 20 g of the obtained solution, 10 g of cyclohexanone, 4 g of propylene glycol monomethyl ether (PGM), and 16 g of methyl ethyl ketone (MEK) were mixed together and agitated well until they became uniform, thereby formulating a coating liquid for forming metal oxide film containing 4 weight % of tantalum(V)-n-butoxide and 1.04 weight % of hydroxypropylcellulose. The viscosity of this coating liquid for forming metal oxide film (25° C.) was approximately 23 mPa·s.

[Fabrication of Metal Oxide Film]

After spin coating (1000 rpm×60 sec) was performed with the formulated coating liquid for forming metal oxide film on an entire surface of a non-alkali glass substrate (10 cm×10 cm×thickness of 0.7 mm; haze value=0.26%; visible light transmittance=91.2%; and refractive index=1.52) at 25° C., the surface was dried at 150° C. for 10 minutes by using a hot-air dryer, thereby obtaining a dried coating film (film thickness: approximately 370 nm, surface resistivity: >1×10$^{13}$ Ω/sq (insulated)).

Figure 12:
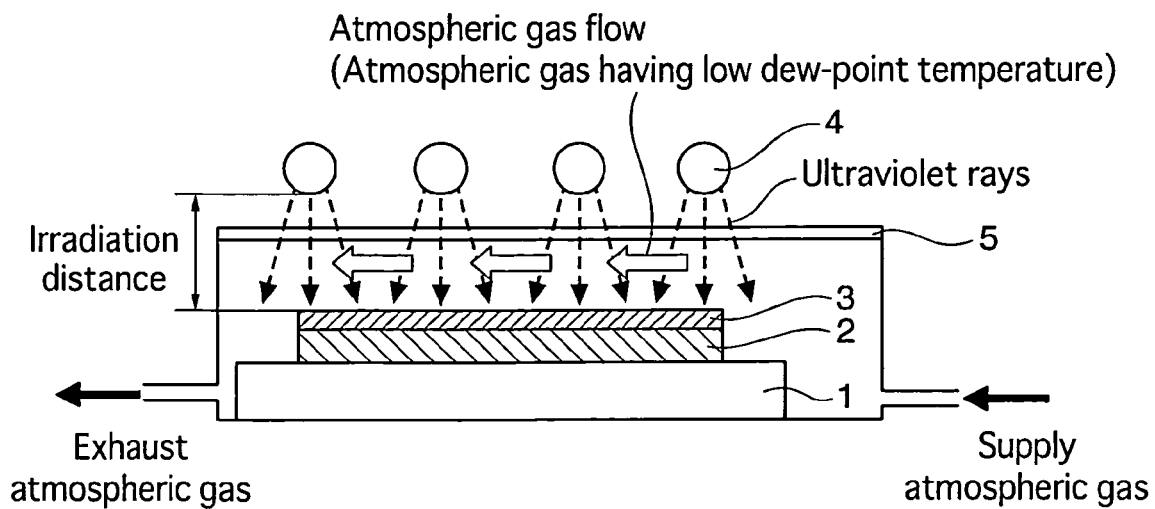
FIG. 12 is a schematic view showing another example of the heating process (using energy ray irradiation together) in the manufacturing process of the metal oxide film with the coating method according to the present invention.

As depicted in the schematic view of FIG. 12, a hot plate (a heating apparatus 1) was used to increase the temperature of the substrate 2 having this dried coating film 3 to 400° C. for 40 minutes (temperature elevation rate: 10° C./minute) in a low-humidity air atmosphere with a dew-point temperature of −55° C. (3 liters/minute supply and the average velocity of flow of the atmospheric gas over the substrate was approximately 0.045 m/second). The heating treatment was then performed at 400° C. for 15 minutes, thereby fabricating a metal oxide film (film thickness: 62 nm) according to Example 10 having tantalum oxide (TaO$_{2.5}$) as a main component.

Next, various characteristics of the fabricated metal oxide film were measured in a manner similar to that of Example 1, and the results are shown in Table 1.

From the results of X-ray diffraction measurement, it has been observed that the metal oxide film described above is an amorphous film. Furthermore, when a cross section of the metal oxide film of Example 10 was observed with a transmission electron microscope, a metal oxide fine-particle layer densely packed mainly with metal oxide fine particles (amorphous microcrystals) equal to or smaller than 3 nm has been observed.

EXAMPLE 11

[Formulation of Coating Liquid]

20 g of vanadium acetylacetonate (solid at room temperature) (standard nomenclature: vanadium(III)-2,4-pentanedionate) [V($C_5H_7O_2$)$_3$](molecular weight=348.26), 78 g of N-methyl-2-pyrrolidone (NMP), and 2 g of hydroxypropylcellulose (HPC; low molecular weight type) were mixed together, heated to 120° C., and agitated for 120 minutes for dissolution. Next, 25 g of the obtained solution, 25 g of cyclohexanone, 10 g of propylene glycol monomethyl ether (PGM), and 40 g of methyl ethyl ketone (MEK) were mixed together and agitated well until they became uniform, thereby formulating a coating liquid for forming metal oxide film containing 5 weight % of vanadium acetylacetonate and 0.5 weight % of hydroxypropylcellulose. The viscosity of this coating liquid for forming metal oxide film (25° C.) was approximately 5 mPa·s.

[Fabrication of Metal Oxide Film]

After spin coating (1000 rpm×60 sec) was performed with the formulated coating liquid for forming metal oxide film on an entire surface of a non-alkali glass substrate (10 cm×10 cm×thickness of 0.7 mm; haze value=0.26%; visible light transmittance=91.2%; and refractive index=1.52) at 25° C., the surface was dried at 150° C. for 10 minutes by using a hot-air dryer, thereby obtaining a dried coating film (film thickness: approximately 110 nm, surface resistivity: >1×10$^{13}$ Ω/sq (insulated)). As depicted in the schematic view of FIG. 12, the hot plate (the heating apparatus 1) was used to increase the temperature of the substrate 2 having this dried coating film 3 to 400° C. for 40 minutes (temperature elevation rate: 10° C./minute) in a low-humidity air atmosphere having a dew-point temperature of −55° C. (3 litters/minute supply and the average velocity of flow of the atmospheric gas over the substrate was approximately 0.045 m/second). The heating treatment was then performed at 400° C. for 15 minutes. The atmosphere was then switched as it was to 1% hydrogen-99% nitrogen (3 litters/minute supply and the average velocity of flow of the atmospheric gas over the substrate was approximately 0.045 m/second), and the heating process was further performed at 400° C. for 15 minutes, thereby fabricating a metal oxide film (film thickness: 42 nm) according to Example 11 having vanadium oxide ($VO_{2.5}$) as a main component.

Next, various characteristics of the fabricated metal oxide film were measured in a manner similar to that of Example 1, and the results are shown in Table 1.

From the results of X-ray diffraction measurement, it has been observed that the metal oxide film described above is an amorphous film. Furthermore, when a cross section of the metal oxide film of Example 11 was observed with a transmission electron microscope, a metal oxide fine-particle layer densely packed mainly with metal oxide fine particles (amorphous microcrystals) equal to or smaller than 3 nm has been observed.

EXAMPLE 12

[Formulation of Coating Liquid]

20 g of cerium acetylacetonate (solid at room temperature) (standard nomenclature: cerium(III)-2,4-pentanedionate) [$Ce(C_5H_7O_2)_3$](molecular weight=437.45), 78 g of N-methyl-2-pyrrolidone (NMP), and 2 g of hydroxypropylcellulose (HPC; low molecular weight type) were mixed together, heated to 120° C., and agitated for 120 minutes for dissolution. Next, 25 g of the obtained solution, 25 g of cyclohexanone, 10 g of propylene glycol monomethyl ether (PGM), and 40 g of methyl ethyl ketone (MEK) were mixed together and agitated well until they became uniform, thereby formulating a coating liquid for forming metal oxide film containing 5 weight % of cerium acetylacetonate and 0.5 weight % of hydroxypropylcellulose. The viscosity of this coating liquid for forming metal oxide film (25° C.) was approximately 5 mPa·s.

[Fabrication of Metal Oxide Film]

After spin coating (1000 rpm×60 sec) was performed with the formulated coating liquid for forming metal oxide film on an entire surface of a non-alkali glass substrate (10 cm×10 cm×thickness of 0.7 mm; haze value=0.26%; visible light transmittance=91.2%; and refractive index=1.52) at 25° C., the surface was dried at 150° C. for 10 minutes by using a hot-air dryer, thereby obtaining a dried coating film (film thickness: approximately 100 nm, surface resistivity: >1×10$^{13}$ Ω/sq (insulated)).

As depicted in the schematic view of FIG. 12, the hot plate (the heating apparatus 1) was used to increase the temperature of the substrate 2 having this dried coating film 3 to 400° C. for 40 minutes (temperature elevation rate: 10° C./minute) in a low-humidity air atmosphere having a dew-point temperature of −55° C. (3 litters/minute supply and the average velocity of flow of the atmospheric gas over the substrate was approximately 0.045 m/second). The heating treatment was then performed at 400° C. for 15 minutes, thereby fabricating a metal oxide film (film thickness: 41 nm) according to Example 12 having cerium oxide ($CeO_2$) as a main component.

Next, various characteristics of the fabricated metal oxide film were measured in a manner similar to that of Example 1, and the results are shown in Table 1.

From the results of X-ray diffraction measurement, it has been observed that the metal oxide film described above is an amorphous film. Furthermore, when a cross section of the metal oxide film of Example 12 was observed with a transmission electron microscope, a metal oxide fine-particle layer densely packed mainly with metal oxide fine particles (amorphous microcrystals) equal to or smaller than 3 nm has been observed.

COMPARATIVE EXAMPLE 1

A film was formed in a manner similar to that of Example 1 except that air having a dew-point temperature of 18° C. was used in place of the low-humidity air having a dew-point temperature of −50° C. in Example 1, thereby fabricating a metal oxide film according to Comparative Example 1 having hafnium oxide ($HfO_2$) as a main component.

Various characteristics of the fabricated metal oxide film were measured in a manner similar to that of Example 1, and the results are shown in Table 1. Also, a reflection profile of the obtained metal oxide film according to Comparative Example 1 is depicted in FIG. 3, together with the reflection profile of the metal oxide film of Example 1.

Figure 13:
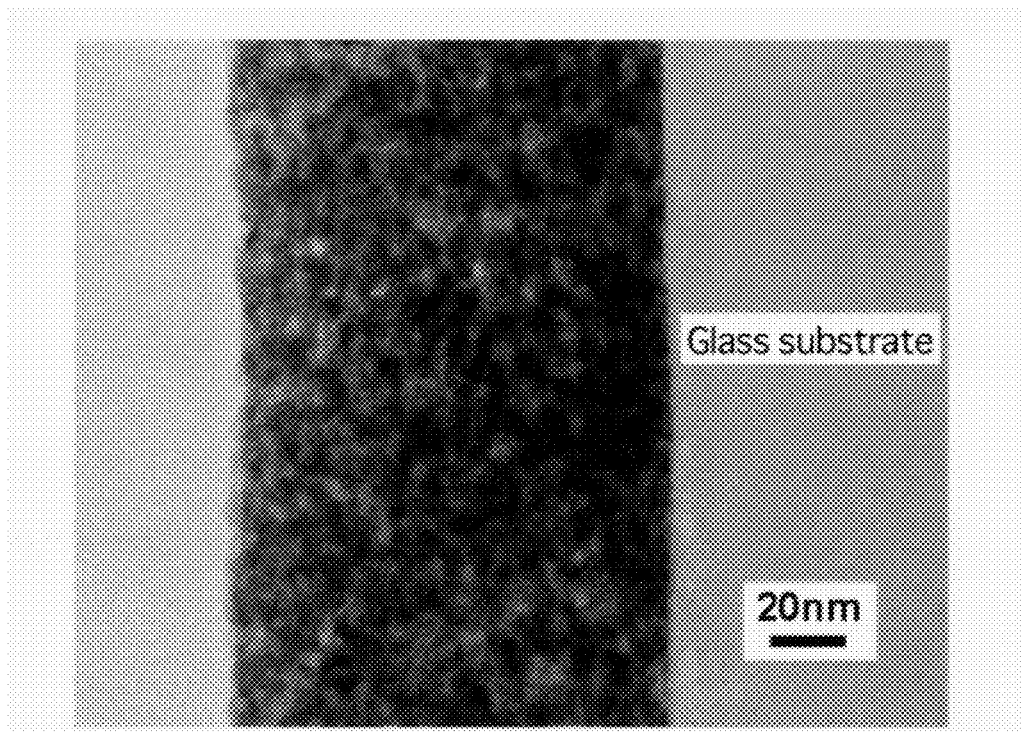
FIG. 13 shows a transmission electron microscope photograph (a TEM image) of a section of the metal oxide film according to Comparative Example 1.

Furthermore, a transmission electron microscope photograph (a TEM image) of a cross section of the metal oxide film of Comparative Example 1 observed with a transmission electron microscope is shown in FIG. 13. From the results of X-ray diffraction measurement, it has been observed that the metal oxide film described above is an amorphous film and has a metal oxide fine-particle layer densely packed mainly with metal oxide fine particles (amorphous microcrystals) equal to or smaller than 3 nm. However, in the metal oxide fine-particle layer, the degree of densification was lower than that of the metal oxide fine-particle layer obtained by using air having a low dew-point temperature in the heating process.

COMPARATIVE EXAMPLE 2

A film was formed in a manner similar to that of Example 2 except that air having a dew-point temperature of 18° C. was used in place of the low-humidity air having a dew-point temperature of −50° C. in Example 2, thereby fabricating a metal oxide film according to Comparative Example 2 having niobium oxide ($NbO_{2.5}$) as a main component.

Various characteristics of the fabricated metal oxide film were measured in a manner similar to that of Example 1, and the results are shown in Table 1. Also, a reflection profile of the obtained metal oxide film according to Comparative Example 2 is depicted in FIG. 5, together with the reflection profile of the metal oxide film of Example 2.

Figure 14:
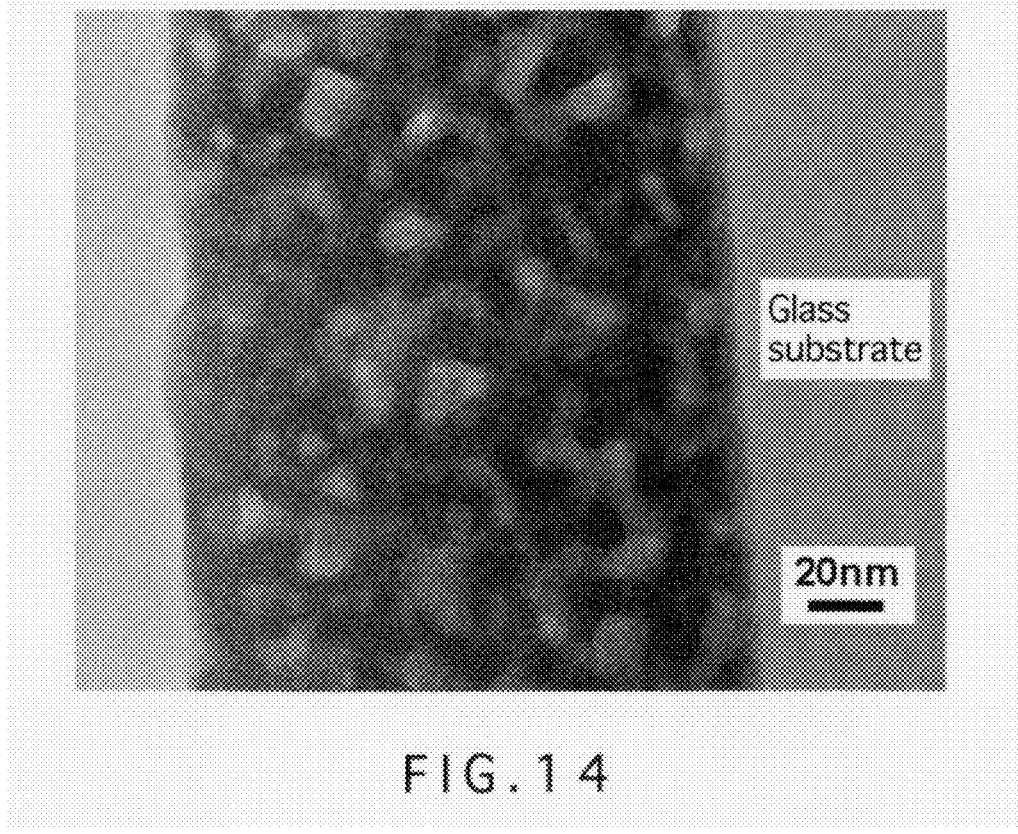
FIG. 14 shows a transmission electron microscope photograph (a TEM image) of a section of the metal oxide film according to Comparative Example 2.

Furthermore, a transmission electron microscope photograph (a TEM image) of a cross section of the metal oxide film of Comparative Example 2 observed with a transmission electron microscope is shown in FIG. 14. From the results of X-ray diffraction measurement, it has been observed that the metal oxide film described above is an amorphous film and has a metal oxide fine-particle layer densely packed mainly with metal oxide fine particles (amorphous microcrystals) equal to or smaller than 3 nm. However, in the metal oxide fine-particle layer, the degree of densification was lower than that of the metal oxide fine-particle layer obtained by using air having a low dew-point temperature in the heating process.

COMPARATIVE EXAMPLE 3

A film was formed in a manner similar to that of Example 3 except that air having a dew-point temperature of 18° C. was used in place of the low-humidity air having a dew-point temperature of −50° C. in Example 3, thereby fabricating a metal oxide film according to Comparative Example 3 having zirconium oxide ($ZrO_2$) as a main component.

Various characteristics of the fabricated metal oxide film were measured in a manner similar to that of Example 1, and the results are shown in Table 1. Also, a reflection profile of the obtained metal oxide film according to Comparative Example 3 is depicted in FIG. 7, together with the reflection profile of the metal oxide film of Example 3.

Figure 15:
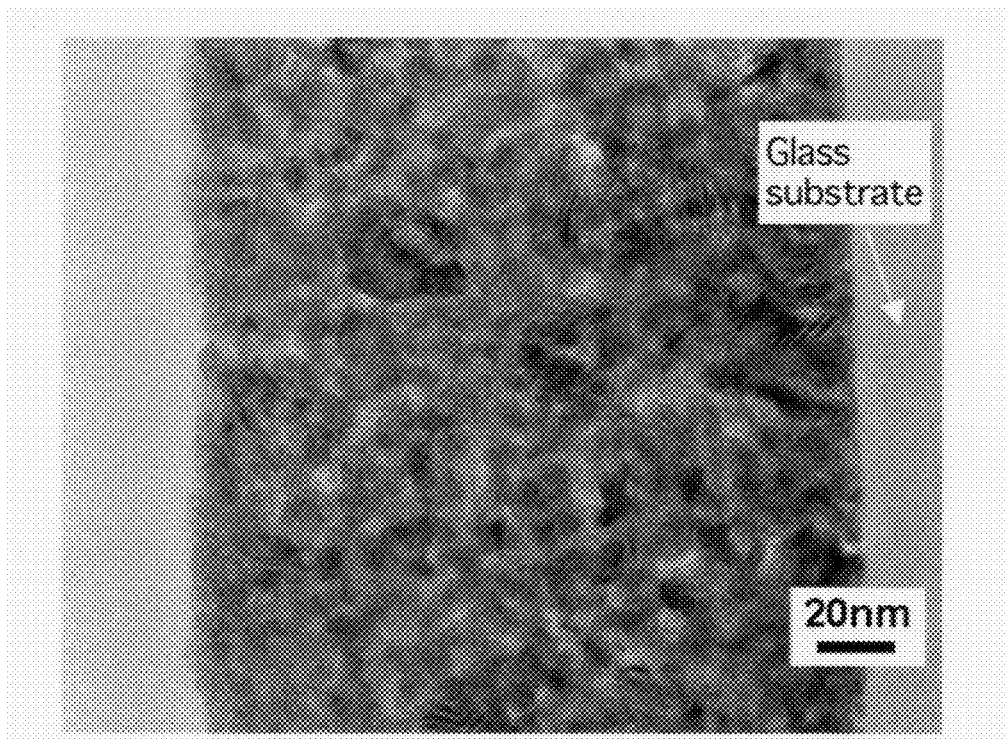
FIG. 15 shows a transmission electron microscope photograph (a TEM image) of a section of the metal oxide film according to Comparative Example 3.

Furthermore, a transmission electron microscope photograph (a TEM image) of a cross section of the metal oxide film of Comparative Example 3 observed with a transmission electron microscope is shown in FIG. 15. From the results of X-ray diffraction measurement, it has been observed that the metal oxide film described above is an amorphous film and has a metal oxide fine-particle layer densely packed mainly with metal oxide fine particles (amorphous microcrystals) equal to or smaller than 3 nm. However, in the metal oxide fine-particle layer, the degree of densification was lower than that of the metal oxide fine-particle layer obtained by using air having a low dew-point temperature in the heating process.

COMPARATIVE EXAMPLE 4

A film was formed in a manner similar to that of Example 4 except that air having a dew-point temperature of 18° C. was used in place of the low-humidity air having a dew-point temperature of −50° C. in Example 4, thereby fabricating a metal oxide film according to Comparative Example 4 having titanium oxide ($TiO_2$) as a main component.

Various characteristics of the fabricated metal oxide film were measured in a manner similar to that of Example 1, and the results are shown in Table 1. Also, a reflection profile of the obtained metal oxide film according to Comparative Example 4 is depicted in FIG. 9, together with the reflection profile of the metal oxide film of Example 4.

Figure 16:
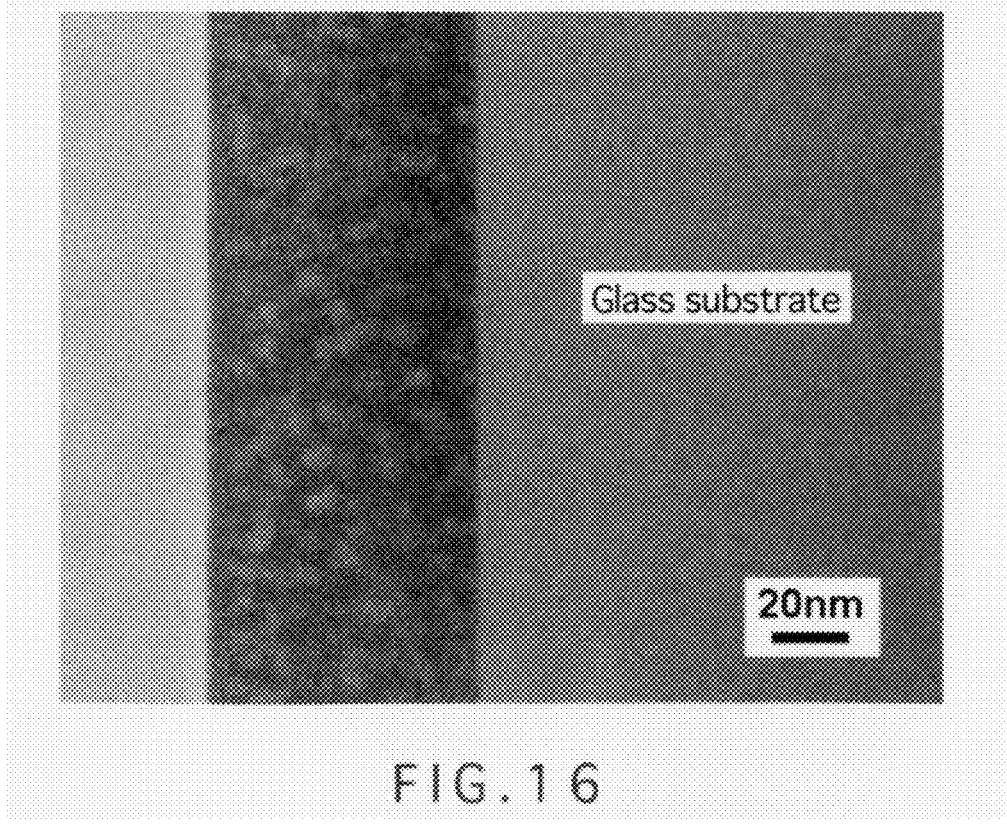
FIG. 16 shows a transmission electron microscope photograph (a TEM image) of a section of the metal oxide film according to Comparative Example 4.

Furthermore, a transmission electron microscope photograph (a TEM image) of a cross section of the metal oxide film of Comparative Example 4 observed with a transmission electron microscope is shown in FIG. 16. From the results of X-ray diffraction measurement, it has been observed that the metal oxide film described above is an amorphous film and has a metal oxide fine-particle layer densely packed mainly with metal oxide fine particles (amorphous microcrystals) equal to or smaller than 3 nm. However, in the metal oxide fine-particle layer, the degree of densification was lower than that of the metal oxide fine-particle layer obtained by using air having a low dew-point temperature in the heating process.

COMPARATIVE EXAMPLE 5

A film was formed in a manner similar to that of Example 5 except that air having a dew-point temperature of 18° C. was used in place of the low-humidity air having a dew-point temperature of −50° C. in Example 5, thereby fabricating a metal oxide film according to Comparative Example 5 having aluminum oxide ($AlO_{1.5}$) as a main component.

Various characteristics of the fabricated metal oxide film were measured in a manner similar to that of Example 1, and the results are shown in Table 1. Also, a reflection profile of the obtained metal oxide film according to Comparative Example 5 is depicted in FIG. 11, together with the reflection profile of the metal oxide film of Example 5.

From the results of X-ray diffraction measurement, the metal oxide film was an amorphous film. Furthermore, Furthermore, when a cross section of the metal oxide film of Comparative Example 5 was observed with a transmission electron microscope, a metal oxide fine-particle layer densely packed mainly with metal oxide fine particles (amorphous microcrystals) equal to or smaller than 3 nm has been observed. However, in the metal oxide fine-particle layer, the degree of densification was lower than that of the metal oxide fine-particle layer obtained by using air having a low dew-point temperature in the heating process.

COMPARATIVE EXAMPLE 6

A film was formed in a manner similar to that of Example 6 except that air having a dew-point temperature of 13° C. was used in place of the low-humidity air having a dew-point temperature of −55° C. in Example 6, thereby fabricating a metal oxide film according to Comparative Example 6 having molybdenum oxide ($MoO_3$) as a main component.

Various characteristics of the fabricated metal oxide film were measured in a manner similar to that of Example 1, and the results are shown in Table 1.

Note that the flatness of the film surface of this metal oxide film was lower than that of the metal oxide film obtained by using air at a low dew-point temperature in the heating process, with a center line average roughness (Ra)=10.6 nm and a maximum height (Rmax)=118 nm. Also, its work function was 5.2 eV.

From the results of X-ray diffraction measurement, it has been observed that the metal oxide film described above is an amorphous film. Furthermore, when a cross section of the metal oxide film of Comparative Example 6 was observed with a transmission electron microscope, a metal oxide fine-particle layer densely packed mainly with metal oxide fine particles (amorphous microcrystals) equal to or smaller than 3 nm has been observed. However, in the metal oxide fine-particle layer, the degree of densification was lower than that of the metal oxide fine-particle layer obtained by using air at a low dew-point temperature in the heating process.

COMPARATIVE EXAMPLE 7

A film was formed in a manner similar to that of Example 7 except that air having a dew-point temperature of 13° C. was used in place of the low-humidity air having a dew-point temperature of −55° C. in Example 7, thereby fabricating a metal oxide film according to Comparative Example 7 having tungsten oxide ($WO_3$) as a main component.

Various characteristics of the fabricated metal oxide film were measured in a manner similar to that of Example 1, and the results are shown in Table 1. From the results of X-ray diffraction measurement, it has been observed that the metal oxide film described above is an amorphous film. Furthermore, when a cross section of the metal oxide film of Comparative Example 7 was observed with a transmission electron microscope, a metal oxide fine-particle layer densely packed mainly with metal oxide fine particles (amorphous microcrystals) equal to or smaller than 3 nm has been observed. However, in the metal oxide fine-particle layer, the degree of densification was lower than that of the metal oxide fine-particle layer obtained by using air at a low dew-point temperature in the heating process.

COMPARATIVE EXAMPLE 8

By using the coating liquid for forming the metal oxide film used in Example 8, the dried coating film 3 (film thickness: approximately 300 nm, surface resistivity: >1×10$^{13}$ Ω/sq (insulated)) similar to that of Example 8 was obtained. Then, in the heating process of performing heat energy ray irradiation shown in the schematic view of FIG. 12, high-humidity air [normal atmosphere; a dew point temperature of 7° C.] was used in place of a low-humidity air having a dew-point temperature of −55° C., thereby promoting mineralization of the dried coating film 3 (decomposition or burning of organic components). Other than that, the process was performed in a manner similar to that of Example 8, thereby fabricating a metal oxide film (film thickness: 115 nm) according to Comparative Example 8 having titanium oxide (TiO$_2$) as a main component.

Various characteristics of the fabricated metal oxide film were measured in a manner similar to that of Example 1, and the results are shown in Table 1.

From the results of X-ray diffraction measurement, it has been observed that the metal oxide film described above is an amorphous film. Furthermore, when a cross section of the metal oxide film of Comparative Example 8 was observed with a transmission electron microscope, a metal oxide fine-particle layer densely packed mainly with metal oxide fine particles (amorphous microcrystals) equal to or smaller than 3 nm has been observed. However, in the metal oxide fine-particle layer, the degree of densification was lower than that of the metal oxide fine-particle layer obtained by using air having a low dew-point temperature in the heating process.

COMPARATIVE EXAMPLE 9

By using the coating liquid for forming the metal oxide film used in Example 9, the dried coating film 3 (film thickness: approximately 470 nm, surface resistivity: >1×10$^{13}$ Ω/sq (insulated)) similar to that of Example 9 was obtained. Then, in the heating process of performing heat energy ray irradiation shown in the schematic view of FIG. 12, high-humidity air [normal atmosphere; a dew point temperature of 7° C.] was used in place of a low-humidity air having a dew-point temperature of −55° C., thereby promoting mineralization of the dried coating film 3 (decomposition or burning of organic components). Other than that, the process was performed in a manner similar to that of Example 9, thereby fabricating a metal oxide film (film thickness: 96 nm) according to Comparative Example 9 having hafnium oxide (HfO$_2$) as a main component.

Various characteristics of the fabricated metal oxide film were measured in a manner similar to that of Example 1, and the results are shown in Table 1.

From the results of X-ray diffraction measurement, it has been observed that the metal oxide film described above is an amorphous film. Furthermore, when a cross section of the metal oxide film of Comparative Example 9 was observed with a transmission electron microscope, a metal oxide fine-particle layer densely packed mainly with metal oxide fine particles (amorphous microcrystals) equal to or smaller than 3 nm has been observed. However, in the metal oxide fine-particle layer, the degree of densification was lower than that of the metal oxide fine-particle layer obtained by using air at a low dew-point temperature in the heating process.

COMPARATIVE EXAMPLE 10

A film was formed in a manner similar to that of Example 10 except that air having a dew-point temperature of 9° C. was used in place of the low-humidity air having a dew-point temperature of −55° C. in Example 10, thereby fabricating a metal oxide film (film thickness: 69 nm) according to Comparative Example 10 having tantalum oxide (TaO$_{2.5}$) as a main component.

Various characteristics of the fabricated metal oxide film were measured in a manner similar to that of Example 1, and the results are shown in Table 1.

From the results of X-ray diffraction measurement, it has been observed that the metal oxide film described above is an amorphous film. Furthermore, when a cross section of the metal oxide film of Comparative Example 10 was observed with a transmission electron microscope, a metal oxide fine-particle layer densely packed mainly with metal oxide fine particles (amorphous microcrystals) equal to or smaller than 3 nm has been observed. However, in the metal oxide fine-particle layer, the degree of densification was lower than that of the metal oxide fine-particle layer obtained by using air at a low dew-point temperature in the heating process.

COMPARATIVE EXAMPLE 11

A film was formed in a manner similar to that of Example 11 except that air having a dew-point temperature of 9° C. was used in place of the low-humidity air having a dew-point temperature of −55° C. in Example 11, thereby fabricating a metal oxide film (film thickness: 47 nm) according to Comparative Example 11 having vanadium oxide (VO$_{2.5}$) as a main component.

Various characteristics of the fabricated metal oxide film were measured in a manner similar to that of Example 1, and the results are shown in Table 1.

From the results of X-ray diffraction measurement, it has been observed that the metal oxide film described above is an amorphous film. Furthermore, when a cross section of the metal oxide film of Comparative Example 11 was observed with a transmission electron microscope, a metal oxide fine-particle layer densely packed mainly with metal oxide fine particles (amorphous microcrystals) equal to or smaller than 3 nm has been observed. However, in the metal oxide fine-particle layer, the degree of densification was lower than that of the metal oxide fine-particle layer obtained by using air at a low dew-point temperature in the heating process.

COMPARATIVE EXAMPLE 12

A film was formed in a manner similar to that of Example 12 except that air having a dew-point temperature of 9° C. was used in place of the low-humidity air having a dew-point temperature of −55° C. in Example 12, thereby fabricating a metal oxide film (film thickness: 46 nm) according to Comparative Example 12 having cerium oxide ($CeO_2$) as a main component.

Various characteristics of the fabricated metal oxide film were measured in a manner similar to that of Example 1, and the results are shown in Table 1.

From the results of X-ray diffraction measurement, it has been observed that the metal oxide film described above is an amorphous film. Furthermore, when a cross section of the metal oxide film of Comparative Example 12 was observed with a transmission electron microscope, a metal oxide fine-particle layer densely packed mainly with metal oxide fine particles (amorphous microcrystals) equal to or smaller than 3 nm has been observed. However, in the metal oxide fine-particle layer, the degree of densification was lower than that of the metal oxide fine-particle layer obtained by using air at a low dew-point temperature in the heating process.

TABLE 1

| | Type of metal oxide | Surface resistivity [Ω/□] | Haze value [%] | Visible light transmittance [%] | Film thickness [nm] | Crystallite size [nm] | Pencil hardness |
|---|---|---|---|---|---|---|---|
| Example 1 | $HfO_2$ | $4 \times 10^9$ | 0.19 | 95.6 | 103 | <3 (Amorphous) | Equal to or harder than 5H |
| Example 2 | $NbO_{2.5}$ | $1 \times 10^{10}$ | 0.16 | 97.7 | 133 | <3 (Amorphous) | Equal to or harder than 5H |
| Example 3 | $ZrO_2$ | $2 \times 10^{10}$ | 0.06 | 99.0 | 155 | <3 (Amorphous) | Equal to or harder than 5H |
| Example 4 | $TiO_2$ | $4 \times 10^{10}$ | 0.68 | 76.7 | 63 | <3 (Amorphous) | Equal to or harder than 5H |
| Example 5 | $AlO_{1.5}$ | $6 \times 10^{10}$ | 0.42 | 99.1 | 129 | <3 (Amorphous) | Equal to or harder than 5H |
| Example 6 | $MoO_3$ | $6 \times 10^9$ | 0.78 | 81.6 | 98 | <3 (Amorphous) | 4H |
| Example 7 | $WO_3$ | $2 \times 10^{11}$ | 1.25 | 82.8 | 90 | <3 (Amorphous) | 3H |
| Example 8 | $TiO_2$ | $1 \times 10^{10}$ | 0.44 | 93.0 | 98 | <3 (Amorphous) | 3H |
| Example 9 | $HfO_2$ | $3 \times 10^{12}$ | 0.31 | 95.1 | 87 | <3 (Amorphous) | 3H |
| Example 10 | $TaO_{2.5}$ | $5 \times 10^{10}$ | 0.45 | 89.1 | 62 | <3 (Amorphous) | Equal to or harder than 5H |
| Example 11 | $VO_{2.5}$ | $9 \times 10^7$ | 0.55 | 72.8 | 42 | <3 (Amorphous) | Equal to or harder than 5H |
| Example 12 | $CeO_2$ | $4 \times 10^{10}$ | 0.68 | 90.3 | 41 | <3 (Amorphous) | Equal to or harder than 5H |
| Comparative example 1 | $HfO_2$ | $7 \times 10^8$ | 0.04 | 98.6 | 117 | <3 (Amorphous) | Softer than H |
| Comparative example 2 | $NbO_{2.5}$ | $3 \times 10^9$ | 0.12 | 98.9 | 150 | <3 (Amorphous) | Softer than H |
| Comparative example 3 | $ZrO_2$ | $2 \times 10^9$ | 0.03 | 99.5 | 175 | <3 (Amorphous) | Softer than H |
| Comparative example 4 | $TiO_2$ | $2 \times 10^{10}$ | 0.47 | 82.2 | 72 | <3 (Amorphous) | Softer than H |
| Comparative example 5 | $AlO_{1.5}$ | $7 \times 10^9$ | 1.75 | 99.0 | 166 | <3 (Amorphous) | Softer than H |
| Comparative example 6 | $MoO_3$ | $3 \times 10^{10}$ | 1.31 | 85.3 | 120 | <3 (Amorphous) | Softer than H |
| Comparative example 7 | $WO_3$ | $1 \times 10^{12}$ | 2.32 | 85.2 | 115 | <3 (Amorphous) | Softer than H |
| Comparative example 8 | $TiO_2$ | $1 \times 10^{10}$ | 0.30 | 95.7 | 115 | <3 (Amorphous) | Softer than H |
| Comparative example 9 | $HfO_2$ | $1 \times 10^{12}$ | 0.34 | 96.7 | 96 | <3 (Amorphous) | Softer than H |
| Comparative example 10 | $TaO_{2.5}$ | $2 \times 10^{10}$ | 0.44 | 90.5 | 69 | <3 (Amorphous) | Softer than H |
| Comparative example 11 | $VO_{2.5}$ | $8 \times 10^7$ | 0.51 | 76.6 | 47 | <3 (Amorphous) | Softer than H |
| Comparative example 12 | $CeO_2$ | $5 \times 10^{10}$ | 0.78 | 92.1 | 46 | <3 (Amorphous) | Softer than H |

When the examples and the comparative examples are compared (in comparison between Example 1 and Comparative Example 1, between Example 2 and Comparative Example 2, between Example 3 and Comparative Example 3, between Example 4 and Comparative Example 4, between Example 5 and Comparative Example 5, between Example 6 and Comparative Example 6, between Example 7 and Comparative Example 7, between Example 8 and Comparative Example 8, between Example 9 and Comparative Example 9, between Example 10 and Comparative Example 10, between Example 11 and Comparative Example 11, and between Example 12 and Comparative Example 12), the metal oxide films in Example 1 and Comparative Example 1 are both obtained from the heating process at 500° C. (the air atmosphere and the 1 volume % hydrogen-99 volume % nitrogen atmosphere); the metal oxide films in Examples 2 to 5 and Comparative Examples 2 to 5 are all obtained from the heating process at 500° C. (the air atmosphere); the metal oxide films in Example 6 and Comparative Example 6 are both obtained from the heating process at 350° C. (the air atmosphere); the metal oxide films in Example 7 and Comparative Example 7 are both obtained from the heating process at 300° C. (the air atmosphere); the metal oxide films in Examples 8 and 9 and Comparative Examples 8 and 9 are all obtained from the heating process at 150° C. (heat energy ray irradiation under the air atmosphere); the metal oxide films in Example 10 and Comparative Example 10 are both obtained from the heating process at 400° C. (the air atmosphere); the metal oxide films in Example 11 and Comparative Example 11 are both obtained from the heating process at 400° C. (the air atmosphere and the 1 volume % hydrogen-99 volume % nitrogen atmosphere); and the metal oxide films in Example 12 and Comparative Example 12 are both obtained from the heating process at 400° C. (the air atmosphere). In each example, the metal oxide film has a metal oxide fine-particle layer densely packed with metal oxide fine particles, and is excellent in film strength (pencil hardness). By contrast, in each comparative example, it can be found that the metal oxide film has a metal oxide fine-particle layer with insufficient densification of metal oxide fine particles, and is significantly low in film strength (pencil hardness).

Also, when the examples and the comparative examples are compared (in comparison between Example 1 and Comparative Example 1, between Example 2 and Comparative Example 2, between Example 3 and Comparative Example 3, between Example 4 and Comparative Example 4, between Example 5 and Comparative Example 5, between Example 6 and Comparative Example 6, between Example 7 and Comparative Example 7, between Example 8 and Comparative Example 8, between Example 9 and Comparative Example 9, between Example 10 and Comparative Example 10, between Example 11 and Comparative Example 11, and between Example 12 and Comparative Example 12), the metal oxide films in Example 1 and Comparative Example 1 are both obtained from the heating process at 500° C. (the air atmosphere and the 1 volume % hydrogen-99 volume % nitrogen atmosphere); the metal oxide films in Examples 2 to 5 and Comparative Examples 2 to 5 are all obtained from the heating process at 500° C. (the air atmosphere); the metal oxide films in Example 6 and Comparative Example 6 are both obtained from the heating process at 350° C. (the air atmosphere); the metal oxide films in Example 7 and Comparative Example 7 are both obtained from the heating process at 300° C. (the air atmosphere); the metal oxide films in Examples 8 and 9 and Comparative Examples 8 and 9 are all obtained from the heating process at 150° C. (heat energy ray irradiation under the air atmosphere); the metal oxide films in Example 10 and Comparative Example 10 are both obtained from the heating process at 400° C. (the air atmosphere); the metal oxide films in Example 11 and Comparative Example 11 are both obtained from the heating process at 400° C. (the air atmosphere and the 1 volume % hydrogen-99 volume % nitrogen atmosphere); and the metal oxide films in Example 12 and Comparative Example 12 are both obtained from the heating process at 400° C. (the air atmosphere). Compared with the metal oxide films of the respective examples, it can be found that the metal oxide films of the respective comparative examples have their film thickness approximately 10% to 20% thicker (117 nm in contrast to 103 nm, 150 nm in contrast to 133 nm, 175 nm in contrast to 155 nm, 72 nm in contrast to 63 nm, 166 nm in contrast to 129 nm, 120 nm in contrast to 98 nm, 115 nm in contrast to 90 nm, 115 nm in contrast to 98 nm, 96 nm in contrast to 87 nm, 69 nm in contrast to 62 nm, 47 nm in contrast to 42 nm, and 46 nm in contrast to 41 nm).

Furthermore, when the examples and the comparative examples are compared (in comparison between Example 1 and Comparative Example 1, between Example 2 and Comparative Example 2, between Example 3 and Comparative Example 3, between Example 4 and Comparative Example 4, and between Example 5 and Comparative Example 5), the metal oxide films in Example 1 and Comparative Example 1 are both obtained from the heating process at 500° C. (the air atmosphere and the 1 volume % hydrogen-99 volume % nitrogen atmosphere); and the metal oxide films in Examples 2 to 5 and Comparative Examples 2 to 5 are all obtained from the heating process at 500° C. (the air atmosphere). As evident from the reflection profiles shown in FIGS. 3, 5, 7, 9, and 11, the reflectance of the metal oxide film of each example has a value higher than the reflectance of the metal oxide film of each comparative example. That is, the metal oxide film of each example has a refractive index higher than that of each comparative example. It is known that, if the degree of densification of the metal oxide film is low, pores (air having a refractive index=1.0) occur in the film to decrease the refractive index of the metal oxide film, thereby decreasing the reflectance. Also from this, it is evident that the metal oxide film of each example is densified.

Note that although reflection profiles are not described herein, even when Examples 8 to 12 and Comparative Examples 8 to 12 are compared with each other (in comparison between Example 8 and Comparative Example 8, between Example 9 and Comparative Example 9, between Example 10 and Comparative Example 10, between Example 11 and Comparative Example 11, and between Example 12 and Comparative Example 12), it has been confirmed that the reflectance of the metal oxide film of each example has a value higher than the reflectance of the metal oxide film of each comparative example.

(For reference, the metal oxides and the glass substrates have refractive indexes as follows: hafnium oxide: 1.91 to 2.15; niobium oxide: 2.2 to 2.3; zirconium oxide: 2.15; titanium oxide: 2.5 to 2.7; aluminum oxide: 1.62; tungsten oxide: 2.2; tantalum oxide: 2.16; vanadium oxide: 2.2 to 2.5; cerium oxide: 2.1 to 2.5; soda lime glass: 1.53, and non-alkali glass: 1.52)

In comparison between the examples and the comparative examples (in comparison between Example 6 and Comparative Example 6), the metal oxide films are both obtained from the heating process at 350° C. (air atmosphere). Compared with the metal oxide film of Example 6, the metal oxide film of Comparative Example 6 has poor flatness of the film surface (a center line average roughness (Ra) of 10.6 nm in contrast to 2.6 nm and a maximum height (Rmax) of 118 nm in contrast to 28 nm). Also, the work function of the metal oxide film of Example 6 is higher than the work function of the metal oxide film of Comparative Example 6 (5.4 eV in contrast to 5.2 eV).

The metal oxide film according to the present invention can be formed on any of various substances by using any of various inexpensive coating methods. When a high-permittivity metal oxide is used for the obtained metal oxide film, the metal oxide film has a high permittivity and is dense and excellent in film strength, and therefore this metal oxide film can be expected to be used as a gate insulating film of a thin-film transistor.

Also, when the metal oxide film to be obtained is used as a transparent conductive film, the metal oxide film has excellent transparency and high conductivity and is also excellent in film strength. Therefore, the substrate with the metal oxide film having this metal oxide film formed on the substrate can be expected to be used for light-emitting devices such as an LED element, an electroluminescent lamp (an electroluminescent element), and a field emission lamp; electric power generating devices such as a solar cell; display devices such as a liquid-crystal display, an electroluminescent display (an electroluminescent element), a plasma display, an electronic paper element, and an electrochromic element; and input devices such as a touch panel.

Furthermore, when a metal oxide with a high work function is used for the metal oxide film to be obtained, the metal oxide film according to the present invention has a high work function, is dense, excellent in film strength, and has high film flatness. Therefore, this metal oxide film can be expected to be used for a transparent conductive film or a hole (positive-hole) injection layer, which is an anode electrode layer of an organic EL element.

Other than those described above, titanium oxide and cerium oxide can be used as ultraviolet ray cut coating; aluminum oxide, silicon oxide, titanium oxide, zirconium oxide, cerium oxide, hafnium oxide, niobium oxide, and others can be used as various optical coating and others, such as an antireflective film and a highly reflective film with the application of their refractive index and transparency; aluminum oxide, silicon oxide, titanium oxide, zirconium oxide, and cerium oxide can be used as insulating overcoating and others to be formed on a (transparent) conductive film with the application of their transparency and insulating property; and tungsten oxide can be used for an electrochromic display material or a near-infrared-ray absorbing material (a heat-ray shielding material) as a cesium-doped tungsten oxide doped with cesium or the like.

What is claimed is:

1. A method of manufacturing a metal oxide film to be formed through the following processes:
    a coating process of coating a substrate with a coating liquid for forming metal oxide film containing an organometallic compound as a main component to form a coating film;
    a drying process of drying the coating film to form a dried coating film; and
    a heating process of mineralizing the dried coating film to form an inorganic film having an inorganic component, which is a metal oxide, as a main component,
    wherein
    the heating process is a process of performing a heating treatment to elevate a temperature of the dried coating film, which has the organometallic compound as a main component and has been formed in the drying process, up to a temperature or higher at which at least mineralization of the organometallic compound components occurs, under an oxygen-containing atmosphere having a dew-point temperature equal to or lower than −10° C., and then removing an organic component contained in the dried coating film by thermal decomposition, burning, or thermal decomposition and burning, thereby forming a metal oxide fine-particle layer densely packed with metal oxide fine particles having a metal oxide as a main component, and
    the organometallic compound is formed of any one or more types of an organic aluminum compound, an organic silicon compound, an organic scandium compound, an organic titanium compound, an organic vanadium compound, an organic chromium compound, an organic manganese compound, an organic iron compound, an organic cobalt compound, an organic nickel compound, an organic copper compound, an organic gallium compound, an organic germanium compound, an organic yttrium compound, an organic zirconium compound, an organic niobium compound, an organic molybdenum compound, an organic ruthenium compound, an organic antimony compound, an organic lanthanum compound, an organic hafnium compound, an organic tantalum compound, an organic tungsten compound, an organic bismuth compound, an organic cerium compound, an organic neodymium compound, an organic samarium compound, an organic gadolinium compound, an organic magnesium compound, an organic calcium compound, an organic strontium compound, and an organic barium compound; and the metal oxide is any one or more types of aluminum oxide, silicon oxide, scandium oxide, titanium oxide, vanadium oxide, chromium oxide, manganese oxide, iron oxide, cobalt oxide, nickel oxide, copper oxide, gallium oxide, germanium oxide, yttrium oxide, zirconium oxide, niobium oxide, molybdenum oxide, ruthenium oxide, antimony oxide, lanthanum oxide, hafnium oxide, tantalum oxide, tungsten oxide, bismuth oxide, cerium oxide, neodymium oxide, samarium oxide, gadolinium oxide, magnesium oxide, calcium oxide, strontium oxide, and barium oxide.

2. The method of manufacturing the metal oxide film according to claim 1, wherein
    subsequently to the heating treatment to elevate the temperature up to the heating temperature or higher at which at least mineralization of the organometallic compound occurs, under the oxygen-containing atmosphere having the dew-point temperature equal to or lower than −10° C., a further heating treatment is performed under an oxygen-containing atmosphere having a dew-point temperature equal to or higher than 0° C.

3. The method of manufacturing the metal oxide film according to claim 1, wherein
    subsequently to the heating treatment to elevate the temperature up to the heating temperature or higher at which at least mineralization of the organometallic compound occurs, under the oxygen-containing atmosphere having the dew-point temperature equal to or lower than −10° C., a further heating treatment is performed under a neutral atmosphere or a reducing atmosphere.

4. The method of manufacturing the metal oxide film according to claim 2, wherein
    subsequently to the heating treatment under the oxygen-containing atmosphere having the dew-point temperature equal to or higher than 0° C., a further heating treatment is performed under a neutral atmosphere or a reducing atmosphere.

5. The method of manufacturing the metal oxide film according to claim 3, wherein
    the neutral atmosphere is an atmosphere containing any one or more types of a nitrogen gas and an inert gas, or the reducing atmosphere is a hydrogen gas atmosphere or an atmosphere containing at least one or more types of hydrogen gas or organic solvent vapor in the neutral atmosphere.

6. The method of manufacturing the metal oxide film according to claim 1, wherein
    the dew-point temperature of the oxygen-containing atmosphere in the heating treatment under the oxygen-containing atmosphere is equal to or lower than −20° C.

7. The method of manufacturing the metal oxide film according to claim 1, wherein
    when the heating treatment under the oxygen-containing atmosphere having the dew-point temperature equal to or lower than −10° C. is performed, energy ray irradiation is performed.

8. The method of manufacturing the metal oxide film according to claim 7, wherein
    the energy ray irradiation is irradiation of ultraviolet rays including at least a component having a wavelength equal to or smaller than 200 nm as a main component.

9. The method of manufacturing the metal oxide film according to claim 8, wherein the irradiation of the ultraviolet rays including at least the component having the wavelength equal to or smaller than 200 nm as the main component is irradiation of ultraviolet rays emitted from any of a low-pressure mercury lamp, an amalgam lamp, or an excimer lamp.

10. The method of manufacturing the metal oxide film according to claim 1, wherein
the organometallic compound is an acetylacetonate metal complex compound, a metal alkoxide compound, or the acetylacetonate metal complex compound and the metal alkoxide compound.

11. The method of manufacturing the metal oxide film according to claim 1, wherein
the coating of the substrate with the coating liquid for forming metal oxide film in the coating process is performed by a method which is any of an inkjet printing method, a screen printing method, a gravure printing method, an offset printing method, a flexor printing method, a dispenser printing method, a slit coating method, a die coating method, a doctor blade coating method, a wire bar coating method, a spin coating method, a dip coating method, and a spray coating method.

12. A metal oxide film obtained by the method of manufacturing the metal oxide film according to claim 1.

13. An element including a metal oxide fine-particle layer, wherein the metal oxide fine-particle layer is the metal oxide film according to claim 12.

14. The element according to claim 13, wherein
the element is a thin-film transistor using the metal oxide fine-particle layer as a gate insulating film of the thin-film transistor.

15. A substrate with a metal oxide film including the metal oxide film on a substrate, wherein
the metal oxide film is the metal oxide film according to claim 12.

16. A device including a transparent electrode, wherein
the transparent electrode is the substrate with the metal oxide film according to claim 15.

17. The device according to claim 16, wherein the device is of one type selected from among a light emitting device, an electric power generating device, a display device, and an input device.

* * * * *